(12) United States Patent
Doerr et al.

(10) Patent No.: US 8,151,305 B2
(45) Date of Patent: Apr. 3, 2012

(54) MOBILE TELEVISION BROADCAST SYSTEM

(75) Inventors: Michael B. Doerr, Dripping Springs, TX (US); Peter J. Nysen, Sunnyvale, CA (US); Colleen J. McGinn, Austin, TX (US); Kevin A. Shelby, Austin, TX (US)

(73) Assignee: Coherent Logix, Incorporated, Austin, TX (US)

( * ) Notice: Subject to any disclaimer, the term of this patent is extended or adjusted under 35 U.S.C. 154(b) by 700 days.

(21) Appl. No.: 12/167,708

(22) Filed: Jul. 3, 2008

(65) Prior Publication Data

US 2009/0013356 A1    Jan. 8, 2009

Related U.S. Application Data

(60) Provisional application No. 60/948,185, filed on Jul. 5, 2007, provisional application No. 60/958,585, filed on Jul. 5, 2007, provisional application No. 60/999,039, filed on Oct. 14, 2007.

(51) Int. Cl.
*H04N 5/455* (2006.01)
*H04N 7/18* (2006.01)
*H04N 7/16* (2006.01)

(52) U.S. Cl. ............ 725/62; 725/80; 725/81; 725/133; 725/140

(58) Field of Classification Search ............ 725/62, 725/80–81, 133, 140–141; 455/439, 446, 455/566

See application file for complete search history.

(56) References Cited

U.S. PATENT DOCUMENTS

| | | | |
|---|---|---|---|
| 6,192,399 B1 * | 2/2001 | Goodman | 725/78 |
| 7,251,218 B2 * | 7/2007 | Jorgensen | 370/235 |
| 7,526,289 B2 * | 4/2009 | Schwarz et al. | 455/439 |
| 2003/0207696 A1 | 11/2003 | Willenegger et al. | |
| 2004/0101046 A1 | 5/2004 | Yang et al. | |
| 2005/0081254 A1 * | 4/2005 | Carlson et al. | 725/140 |
| 2006/0111110 A1 * | 5/2006 | Schwarz et al. | 455/439 |
| 2006/0209745 A1 | 9/2006 | MacMullan et al. | |
| 2006/0262651 A1 | 11/2006 | Cooper et al. | |
| 2007/0064707 A1 | 3/2007 | Pandel et al. | |
| 2007/0091168 A1 | 4/2007 | Lee | |
| 2007/0147440 A1 | 6/2007 | Song et al. | |
| 2007/0180467 A1 | 8/2007 | Lee et al. | |

(Continued)

FOREIGN PATENT DOCUMENTS

WO    0203678    1/2002

(Continued)

OTHER PUBLICATIONS

International search report and written opinion for application No. PCT/US2009/045650, mailed Dec. 8, 2009; 16 pages.

(Continued)

*Primary Examiner* — Kieu Oanth T Bui
(74) *Attorney, Agent, or Firm* — Meyertons, Hood, Kivlin, Kowert & Goetzel, P.C.; Jeffrey C. Hood

(57) ABSTRACT

A digital television broadcast system with transmission and/or reception of digital television signals for improved mobile reception. The communication layers in the transmit and receive portions of the transmission system can be dynamically modified, e.g., based on usage patterns or current channel characteristics. The transmission system also provides for cross layer control, whereby parameters in various of the communication layers are analyzed to determine appropriate updates to the system configuration.

83 Claims, 24 Drawing Sheets

U.S. PATENT DOCUMENTS

2007/0239886 A1* 10/2007 Montemayor et al. ........ 709/232
2008/0320526 A1* 12/2008 Franceschini et al. .......... 725/62
2009/0013356 A1* 1/2009 Doerr et al. ..................... 725/62
2009/0193487 A1 7/2009 Simon

FOREIGN PATENT DOCUMENTS

WO 2007046677 4/2007

OTHER PUBLICATIONS

"Annex D: RF/Transmission Systems Characteristics"; Digital Television Standard; XP-002187665; Sep. 16, 1995; 16 pages.

A. Touzni, H. Fu, M. Fimoff, and W. Bretl; "Enhanced 8-VSB Transmission for North-American HDTV Terrestrial Broadcast"; ICASSP 2003; Apr. 6, 2003; 4 pages.

"ETSI TS 102 471 V1.2.1—Digital Video Broadcasting (DVB); IP Datacast Over DVB-H: Electronic Service Guide (ESG)"; European Broadcasting Union; Nov. 1, 2006; 82 pages.

ETSI TS 102 006 V1.3.1—Digital Video Broadcasting (DVB); Specification for System Software Update in DVB Systems; European Broadcasting Union; May 1, 2005; 40 pages.

"A Peek Ahead at 802.11n: MIMO-OFDM"; XP-002414302; Jan. 11, 2007; 32 pages.

Partial International Search Report for Application No. PCT/US2009/046466; Mailed Nov. 11, 2009; 9 pages.

"ATSC Digital Television Standard Part 2—RF/Transmission System Characteristics (A/53, Part 2:2007)"; Advanced Television Systems Committee; Jan. 3, 2007; 44 pages.

"Modulation and Coding Requirements for Digital TV (DTV) Applications Over Satellite—ATSC Standard"; Advanced Television Systems Committee; Jul. 17, 1999; 33 pages.

International Search Report and Written Opinion; Oct. 29, 2009; 17 pages.

Jill M. Boyce; "Packet loss resilient transmission of MPEG video over the Internet"; Signal Processing: Image Communication 15 (1999), pp. 7-24.

Mugen Peng and Wenbo Wang; "A Unified Architecture and Key Techniques for Interworking between WiMAX and Beyond 3G14G Systems"; Oct. 2, 2007; pp. 67-90.

International Search Report and Written Opinion for Application No. PCT/US2008/069200, mailed Feb. 18, 2010; 15 pages.

\* cited by examiner

*Stream Encoding Methods*

| Transport Method | FEC | Modulation/Coding | Sync |
|---|---|---|---|
| Robust Stream | LDPC + 8-VSB | — | Implicit |
| VSIW Over MPEG-2 TS | 8-VSB | OGold-16 | Explicit |
| VSIW Over Robust Stream | LDPC + 8-VSB | OGold-16 | Implicit |
| VSIW Over Field Sync | None | 2-Level [5] | Implicit |

*Stream parameter encoding*

| Field | TS-Field | Description | Size | Contents |
|---|---|---|---|---|
| SYNC | | Stream synchronization | 12-bits | $7712_8$ |
| VSIWTS | LEN | Number of octets contained in the DATA field (after code-spread demodulation) | 8-bits w/ext. | [0:254]→ [1:255 Octets] [255]→ extends LEN field an additional 8-bits |
| | VSIW | VSIW Packet data (zero padded to nearest octet boundary) | N-bits | VSIW Packet |
| | CRC | Cyclic Redundancy Check calculated over the LEN\|DATA fields | 16-bits | CRC-16 CCITT $x^{16}+x^{12}+x^5+1$ |

FIG. 8

MOBILE TELEVISION BROADCAST SYSTEM

PRIORITY CLAIM

This application claims benefit of provisional application Ser. No. 60/948,185 titled "Robust Mobile TV Broadcast System" filed on Jul. 5, 2007, which is hereby incorporated by reference in its entirety as though fully and completely set forth herein.

This application claims benefit of provisional application Ser. No. 60/958,585 titled "Robust Mobile TV Broadcast System" filed on Jul. 5, 2007, which is hereby incorporated by reference in its entirety as though fully and completely set forth herein.

This application claims benefit of provisional application Ser. No. 60/999,039 titled "Flexible, Extensible, and Robust Mobile TV Broadcast System" filed on Oct. 14, 2007, which is hereby incorporated by reference in its entirety as though fully and completely set forth herein.

FIELD OF THE INVENTION

The present invention relates to the design of a robust mobile television broadcast system, and more specifically in one embodiment relates to the enhancement of the current 8-VSB-based ATSC Digital TV (DTV) broadcast system for mobile services to mobile and handheld devices.

DESCRIPTION OF THE RELATED ART

The ATSC (Advanced Television Systems Committee) standard relates to a digital television format which will replace the analog NTSC television system. The ATSC standard is a high definition television standard that produces standard 4:3 or wide screen 16:9 images up to 1920×1080 pixels in size—more than six times the display resolution of the earlier NTSC standard. The ATSC standard makes provisions to transport multiple standard-definition "virtual channels" broadcast on a single 6 MHz TV channel. The ATSC standard also includes "theater quality" audio using the Dolby Digital AC-3 format to provide 5.1-channel surround sound. The ATSC standard also provides numerous auxiliary datacasting services.

The ATSC standard uses the MPEG-2 systems specification for encapsulation (transport) of data. More specifically, ATSC uses the 188-byte MPEG transport stream packets to carry data. MPEG-2 is also referred to as "transport stream", "MPEG-TS", or simply "TS". At the receiver side, before decoding of audio and video occurs, the receiver demodulates and applies error correction to the signal. Then, the transport stream may be demultiplexed into its constituent streams. A video codec, e.g. MPEG-2, H.264, VC-1, is used for encoding and decoding video, subject to certain constraints.

Previously, mobile reception of digital television stations transmitted using the ATSC standard has been difficult to impossible. For example, mobile reception of digital television stations is very difficult when moving at vehicular speeds. Therefore, there is a need for an improved system and method for transmission and/or reception of digital television signals for improved mobile reception.

SUMMARY OF THE INVENTION

Embodiments of the invention relate to an improved system and method for transmission and/or reception of audiovisual information, e.g., digital television signals, for improved reception, and in particular to improved mobile reception. Certain embodiments relate to a digital television broadcast system which comprises a transmission system and one or more devices, e.g., mobile devices. Each of the mobile devices may include a display for presenting video information and one or more speakers for presenting audio information. Thus each of the mobile devices may include television-like capabilities for presenting received television channels as described herein. The digital television broadcast system may also of course include stationary devices.

The transmission system is configured to transmit audiovisual information (e.g., television signals/channels) to the mobile devices in a wireless manner. The mobile devices 112 may receive and present the audiovisual information, e.g., receive and present the digital television signals/channels. The transmission system may also be configured to transmit audiovisual information (e.g., television signals/channels) to stationary devices (stationary televisions) in a wireless manner.

The transmission system comprises a transmitter as well as transmit logic. The transmit logic is adapted for receiving and/or storing audiovisual information (e.g., television data) and for generating packets containing the audiovisual information. The transmit logic may generate packets according to the ATSC (Advanced Television Standards Committee) standard, e.g., using 8-VSB modulation. In one embodiment, one or more of the digital television channels are intended for stationary receivers, such as televisions. One or more of the digital television channels are also intended for mobile and/or handheld (M/H) (referred to collectively herein as "mobile") devices.

In one embodiment, the transmission system receives (or generates) instructions to modify the system (transmission/receive) configuration. Alternatively, or in addition, the transmission system determines channel characteristics of the wireless communication medium and then determines a modification to the system (transmission/receive) configuration based on the current channel characteristics. The transmission system may be configured to modify its own configuration, e.g., by modifying parameter values in one or more communication layers in the transmission system. The transmission system may correspondingly also generate control information to dynamically configure corresponding communication layers in the receivers of various mobile devices. The modification to the configuration of the transmission/receive system may comprise modifications to various operational characteristics of the transmission system/receiver, such as video codec used, audio codec used, image resolution, the amount and/or type of forward error correction, receive parameters, multiplexing arrangement, etc. The transmission/receive system may thus be modified to dynamically configure the system based on the channel characteristics of the wireless communication medium and/or based on received instructions.

The transmission system may examine current parameters of a plurality of the communication layers and determine the system modifications (modifications to the transmit and receive logic) based on these parameters. As noted above, the system modifications may comprise modifying a first communication layer in the transmit/receive system, or a plurality of the communication layers. In one embodiment, when the transmission system receives an instruction or otherwise makes a determination to modify parameters in a first communication layer, the transmission system may examine parameters of various of the communication layers and determine modifications to other parameters in the first communication layer and/or modifications to parameters in other communication layers.

Thus, the transmission system is configured to adjust one or more of a plurality of the "communication layers" in the transmission system/receiver, including the Physical layer as well as the higher layers, such as the Management layer and Presentation layer. In one embodiment, the modifications may include modifying a plurality of the communication layers, e.g., two or more of the communication layers. The communication layer modifications may be generated based on parameter values of a plurality of the communication layers, or may be generated to improve or optimize operation across the plurality of communication layers. The methods thus provide for "cross layer control" as described herein.

The transmission system generates and transmits packets to the receiver over the communication medium, the packets containing audiovisual information as well as control information. The packets containing audiovisual information may comprise one or more digital television channels intended for devices, including mobile devices. As noted above, the transmission system generates packets according to the ATSC (Advanced Television Standards Committee) DTV (digital television) standard containing one or more digital television channels intended for stationary receivers (e.g., televisions), and generates packets containing one or more digital television channels intended for mobile/handheld (M/H) receivers. Generation of the packets containing audiovisual information may comprise various steps, such as encoding the audio and video data (e.g., using MPEG-2 encoding), applying forward error correction, generating appropriate packet headers and control information, etc.

The control information may be comprised in packets that use an otherwise unassigned packet ID (uPID). The control information may be useable to dynamically reconfigure operation of the mobile devices, e.g., dynamically configure communication layers operating in the mobile devices. As noted above, the control information may be configured to dynamically configure operation of the mobile devices based on changes made in the transmission system.

The control information may utilize a command structure that is known both on the transmit side and the receive side. The command structure may be organized as a hierarchical tree. Thus the commands comprised in the control information may be configured to modify parameters stored according to a hierarchical tree structure in the receiver, wherein the hierarchical tree structure represents the receiver (and transmission system) configuration. This hierarchical tree structure is discussed in greater detail below.

The hierarchical tree structure may also allow for new nodes to be added to the tree after deployment of transmission and receiver systems, where the new nodes add new functionality in the system. Thus the transmit method may generate the control information configured to modify the hierarchical tree structure in the receiver to provide extended (new or modified) functionality in the receiver. The transmission method may also operate to transmit version information or some other characteristic of the services, where the version information or other characteristic can be used to group control information into subgroups of services supported by various generations of radios. The transmission method may further include descriptors or modifiers that can be applied across sets of nodes to more efficiently specify parameter values in the tree. The transmission method may also include a table describing the services offered by version or by some other parameter(s), coupled with an offset into the control information or some other method of vectoring to the location in the control information where the control stream that supports the listed service is located.

In one embodiment, the transmission system provides information to the receiver to configure the receiver regarding how to receive the packets, e.g., the ordering of the packets in the transmitted data stream. Once the packet ordering is established, the method may subsequently only send delta information to the receiver regarding changes in the ordering of transmitted packets.

More specifically, transmission of the packets may comprise transmitting a first plurality of packets comprising audiovisual information intended for mobile devices (first stream), a second plurality of packets comprising control information (second stream), and a third plurality of packets comprising standard digital television signals intended for stationary televisions (third stream). The standard digital television signals may not be useable by the mobile device. In another embodiment, the standard digital television signals may be received, processed and presented by the mobile device(s). Transmission of these plurality of packets may comprise multiplexing the first, second, and third plurality of packets (multiplexing the first, second and third streams). Multiplexing of these different packets or streams may be performed in a systematic way based on a ratio of the relative bandwidth allocations of the respective pluralities of packets (or streams). In one embodiment, multiplexing these different packet streams comprises ordering the packets to distribute them evenly according to their relative bandwidth. This method will be referred to as continuous mode. In another embodiment, known as burst mode, the packet content associated with each stream (first, second and third) is sent in aggregated bursts where the start of each burst is indicated as part of the control information. The multiplexing may operate to reduce transmission overhead.

In one embodiment, the transmission method transmits size information regarding the bandwidth allocations of the various packet streams, wherein the size information is useable at the receiver to derive the systematic multiplexing arrangement employed by the receiver and in accordance with the multiplexing arrangement demultiplex the received packet streams. In other words, the receiver may use the knowledge of the size information to "know" how to properly demultiplex the received packets. This concept of systematic multiplexing can be applied to both the continuous and burst mode cases.

Mobile devices are configured to receive the packets transmitted by the transmission system, including the packets containing audiovisual information and the packets containing control information. The receiver then operates to demultiplex the received packets in a systematic manner complementary to that employed by the transmitter in multiplexing the packet streams, e.g., based on received size information as mentioned above. The receiver in the mobile device (e.g., each mobile device) is then configured based on the received commands contained in the control information. In other words, the mobile device extracts commands from the received packets and configures its operation according to these commands. The commands contained in the control information may be executed to modify operation of one or more communication layers in the receiver (e.g., to match the communication layer changes made in the transmission system). Thus a respective mobile device is configured to use the control information to configure its operation during reception and/or presentation of the received audiovisual information.

For example, if the control information specifies use of a specific video codec and/or audio codec, the receiver in the mobile device is configured according to the indicated video codec and/or audio codec. As another example, if the control information specifies use of a certain amount of forward error correction, the receiver in the mobile device is configured to decode received data based on the amount of indicated forward error correction. As another example, if the control information specifies use of a certain display resolution, the receiver is modified to produce the indicated display resolution.

The receiver in the mobile device processes packets containing audiovisual information based on its configuration. Thus the receiver processes subsequently received packets according to the changes made to the one or more communication layers. In other words, the various communication layers in the receiver (as previously modified) operate to process audiovisual data in subsequently received packets.

The mobile device then presents audiovisual information on its display based upon the received and processed packets. Thus the mobile device may operate according to its configuration (per the received control information) to process the received information and present the received audiovisual information on its display.

In one embodiment, the receiver in the mobile device transmits feedback information back to the transmission system. The receiver in the mobile device may transmit the feedback information back to the transmission system over any of various mediums, e.g., a return path, such as a cellular network or WAN/WAP, etc. The feedback information may comprise various types of information, such as packet error rates, packet loss information, receiver capabilities, user settings, etc. The transmission system may then use this feedback information in determining how to adjust the broadcast system, e.g., which parameters to adjust in one or more of the communication layers in the transmission/receive systems.

In another embodiment, the receiver in the mobile device may also transmit control information to the transmission system to configure the transmission system. For example, the receiver obtain various information, such as packet error rates, user input, etc., and may reconfigure itself (by changing one or more parameters in one or more communication layers in the receiver). The receiver may then generate control information (in a similar manner in which the transmission system generates control information) and provide this control information to the transmission system. The transmission system may then receive this control information and modify its capabilities accordingly, e.g., modify one or more parameters in one or more communication layers in the transmission system.

Thus in one embodiment of the broadcast system, the transmission system is capable of modifying its configuration and transmitting information to the receiver in at least one mobile device to modify its configuration, and the receiver in at least one mobile device is capable of modifying its configuration and transmitting information to the transmission system to modify its configuration.

BRIEF DESCRIPTION OF THE DRAWINGS

In the following detailed description, presently preferred embodiments of the invention are further described with reference to the following figures:

FIG. 8 illustrates stream parameter encoding according to one embodiment of the invention;

Figure 1:
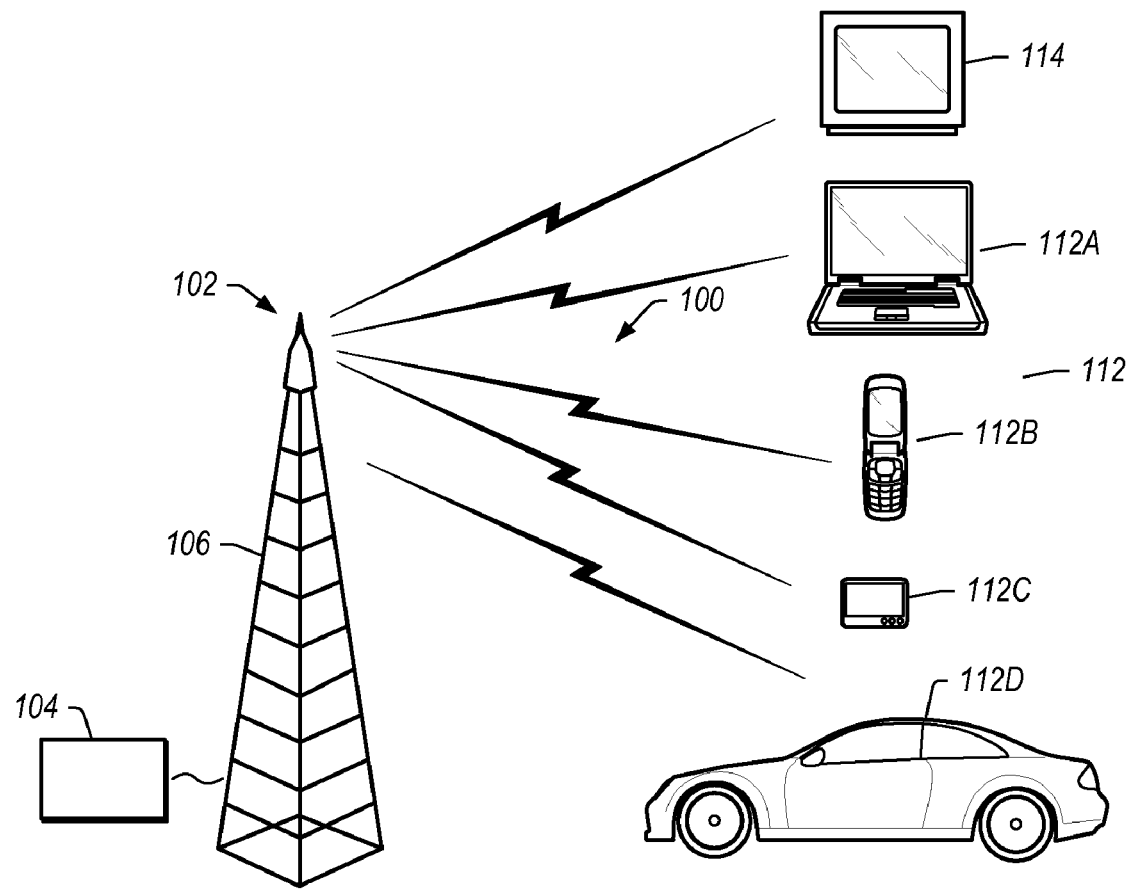
FIG. 1 illustrates a digital television broadcast system according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1—Digital Television Broadcast System

FIG. 1 illustrates an exemplary broadcast system 100 according to one embodiment of the invention. In one embodiment, the broadcast system may be a digital television broadcast system. The broadcast system 100 described herein, including the various methods described herein, may be used for broadcasting any of various types of data, including audiovisual information as well as other data.

As used herein, the term "audiovisual information" includes any of various types of information or data that comprises video data and/or audio data. The term "video data" includes motion video (such as television, movies, streaming video, etc., as well as image data, such as JPEGs. The term "audiovisual information" further includes any of various types of information or program instructions that, when executed, cause a device to present video data (on a display) and/or audio data (on speakers). For example, the term "audiovisual information" includes any of various types of gaming content (including program instructions and/or data) that can be used and/or executed to present gaming content (e.g., images, video, and/or audio) on a presentation device.

The broadcast system 100 and the various methods described herein are described in the present application in the context of transmitting audiovisual information for presentation by a receiving device, in particular digital television. However, it is noted that the broadcast system 100 and the various methods described herein may be used for transmission/reception of any of various types of data (e.g., audiovisual information, email, files, text documents, seismic data, measurement data, weather data, etc.), with audiovisual information being merely one representative example.

As shown, the system 100 comprises a transmission system (or transmit system) 102, one or more mobile devices 112 (e.g., mobile devices 112A-112D), and at least one stationary device 114. As noted above FIG. 1 is exemplary only, e.g., an exemplary system may comprise one or more transmission systems 102, a plurality of mobile devices 112, and a plurality of stationary devices 114.

The transmission system 102 is configured to transmit audiovisual information to the one or more mobile devices 112 in a wireless manner. More particularly, the transmission system 102 may be configured to transmit digital television signals/channels to the mobile devices 112. The mobile devices 112 may receive and present the audiovisual information, e.g., receive and present the digital television signals/channels. The transmission system 102 may also be configured to transmit audiovisual information to the stationary device 114 (e.g., stationary television) in a wireless manner. The transmission system 102 is also configured to transmit audiovisual information to the one or more stationary devices 114, e.g., televisions.

For the sake of convenience, embodiments of the invention are described herein with respect to reception by mobile devices 112. However, the various embodiments of the invention described herein may also of course be used for reception by stationary devices. For example, one embodiment of the invention provides for reception of mobile TV channels by stationary devices 114 for the purpose of enhancing the robustness of the terrestrial broadcast. Thus any of the various methods described herein, including but not limited to: dynamic modification of communication layers in a transmit/receive system; cross layer control; the use of a hierarchical tree structure in providing control/command information to modify communication layers in a receiver; extension of the wireless communication protocol by transmitting commands indicating a change in the tree hierarchy, e.g., by adding nodes to the tree hierarchy; and methods for multiplexing packets with reduced transmission overhead, e.g., using packet size information, may be utilized with either mobile devices 112 or stationary devices 114, or both, as desired.

The transmission system 102 comprises a transmitter 106 as well as transmit logic 104 coupled to the transmitter 106. The transmit logic 104 may comprise any of various types of logic, such as one or more computer systems (with accompanying software), digital logic, analog logic, programmable gate arrays, etc., or combinations thereof. The transmit logic 104 is adapted for receiving and/or storing audiovisual information (e.g., television data) and for generating packets containing the audiovisual information. The transmit logic 104 may generate packets according to any of various standards, such as the ATSC (Advanced Television Standards Committee) standard, e.g., using 8-VSB modulation. The transmission system 102 may use other modulation schemes, such as DVB-T/H, ISDB-T, DMB-T/H, etc. The transmit logic 104 is also configured to generate packets containing control information as described herein. In one embodiment, one or more of the digital television channels are intended for stationary receivers, such as televisions. One or more of the digital television channels are also intended for mobile and/or handheld (M/H) (referred to collectively herein as "mobile") devices 112.

As described herein, for digital television channels intended for mobile devices 112 (and possibly for all channels, e.g., channels intended for stationary devices 114 and/or mobile devices 112), the configuration of the transmit/receive system (the transmission logic 102 and the receivers in each of the mobile devices 112) may be dynamically modified based on various factors, such as received instructions, current channel characteristics, usage patterns, etc. The transmit logic 104 may thus be configured to modify its configuration (by modifying parameters in one or more of its communication layers) and also provide control information to the various mobile devices to instruct them to modify their configurations in a similar manner.

The transmit logic 104 may thus be configured to generate packets containing audiovisual information as well as packets containing control information. The control information may be comprised in packets that use an otherwise unassigned PID. The control information may be useable to dynamically reconfigure operation of the mobile devices, e.g., dynamically configure communication layers operating in the mobile devices. The operation of the mobile devices 112 (and the transmission system 102) may be dynamically configured depending on current channel conditions of the wireless communication medium. The control information may provide for "cross layer control" of the communication layers in the mobile devices 112, as described herein.

The mobile devices 112 may be any of various types of devices, such as portable computer systems (laptops) 112A, wireless telephones 112B (e.g., Blackberrys, iphones, etc.), personal digital assistants 112C, television equipment 112D configured in vehicles, and other types of portable devices capable of displaying received audiovisual information.

The mobile devices 112 are configured to receive the packets transmitted by the transmitter 106, including the packets containing audiovisual information and the packets containing control information. A respective mobile device 112 may be configured to use the control information to configure its operation during reception and/or presentation of the received audiovisual information. Each of the mobile devices 112 may include a display for presenting video information and one or more speakers for presenting audio information. Thus each of the mobile devices 112 may include television-like capabilities for presenting received television channels as described herein.

The stationary devices 114 may be any of various types of devices that are intended to be placed at a fixed location (referred to as stationary or "non-mobile"), such as conventional televisions, e.g., liquid crystal displays (LCD displays), plasma displays, etc.

Transmit Flowchart

Figure 2:
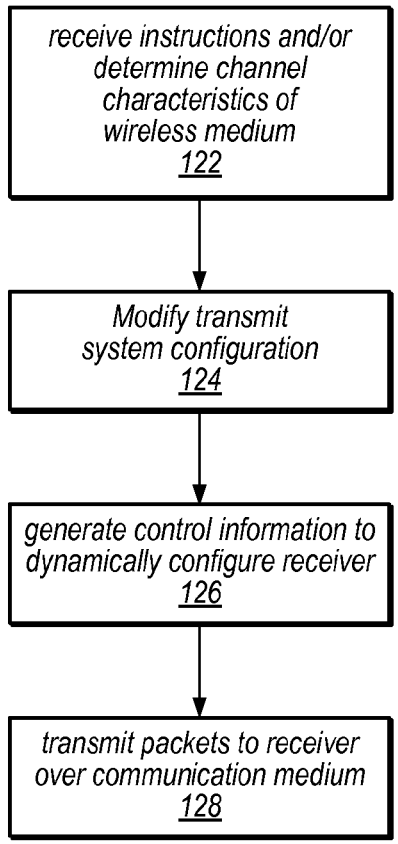
FIG. 2 is a flowchart diagram illustrating generation and transmission of audiovisual data and control information according to one embodiment of the invention.

FIG. 2 is a high level flowchart diagram illustration operation of a method performed by the transmit system according to one embodiment.

In 122 the transmit system 102 may determine modifications to one or more communication layers in the transmit and/or receive systems. For example, in 122 the transmit system 102 may receive instructions to modify one or more communication layers in the transmit and/or receive systems. These instructions may be received by a broadcaster, a carrier (such as AT&T, Verizon, Sprint, etc.), or other entity, or software executing on the transmit system 102. This is discussed in more detail with respect to FIG. 4.

Alternatively, or in addition, in 122 the transmission system 102 may determine channel characteristics of the wireless communication medium, and these determined channel characteristics may then be useable to determine modifications to the transmit/receive systems. This is discussed in more detail with respect to FIG. 4.

In 124 the transmission system configuration is modified based on the received instructions and/or the determined channel characteristics of the wireless communication medium. Modification of the transmission system 102 may involve modifying one or more parameters of one or more communication layers in the transmission system 102. As discussed further below, each of the transmission system 102 and the mobile device(s) 112 (receiver) may maintain parameter values of communication layers stored according to a tree structure. Thus, modification of the transmission system 102 (and the receiver) may involve generating commands to modify selected parameter values in this tree structure. In 124 the method may modify various operational characteristics of the transmission system 102, such as video codec used, audio codec used, image resolution, the amount and/or type of forward error correction, receive parameters, the methods of signaling and announcement, the streaming and file delivery protocols, multiplexing arrangement, etc. The description in the present specification regarding generation of commands (control information) to modify parameter values generally applies to both the receiver(s) in the mobile devices 112 as well as the transmission system 102, but is described mostly in the context of the receiver system for convenience.

In 126 the method generates control information to dynamically configure the receiver (e.g., the receiver logic in mobile device(s) 112). The control information generated in 126 is designed to modify the receiver in a manner compatible with the modifications made to the transmission system 102 in 124 above. As described above, this may comprise generating commands to modify various corresponding operational characteristics of the receiver, such as video codec used, audio codec used, image resolution, the amount and/or type of forward error correction, receive parameters, the methods of signaling and announcement, the streaming and file delivery protocols, multiplexing arrangement, etc. The control information may be based on the received instructions in 122 and/or the channel characteristics of the wireless communication medium determined in 122.

The modification to the receiver in 126 (and the corresponding modifications to the transmit system 102 in 124) may be based on received instructions, the determined channel characteristics of the wireless communication medium, or both, and/or possibly other factors. As one example, the control information to modify the transmit system and receiver may be based solely on the determined channel characteristics of the wireless communication medium. As another example, the control information may be based solely on received instructions. As another example, a first portion of the control information may be based on the determined channel characteristics of the wireless communication medium, and a second portion of the control information may be based on received instructions (e.g., is not be based on the determined channel characteristics of the wireless communication medium).

In generating control information to configure the transmission system in 124 and the receiver in 126, the method is configured to generate commands operable to adjust one or more of a plurality of the "communication layers" in each of the transmit logic 104 and the receiver, including the Physical layer as well as the higher layers, such as the Management layer and Presentation layer. In one embodiment, the control information comprises commands for modifying a plurality of the communication layers, e.g., two or more of the communication layers. The control information may be generated based on factors affecting a plurality of the communication layers, or may be generated to improve operation across the plurality of communication layers. The method thus provides "cross layer control".

In other words, the method may examine current parameters of a plurality of the communication layers and then generate the control information to modify or configure one or more of the communication layers based on the current parameters of the plurality of the communication layers. Thus the method takes a plurality of the communication layers into account in modifying one or more of the communication layers. For example, generation of the control information may comprise examining current parameters of a plurality of the communication layers and then generating the control information, wherein the control information is configured to modify operation of a first communication layer, and wherein the control information is generated based on current parameters of the first communication layer and/or other ones of the communication layers. Thus the control information configured to modify operation of a first communication layer may be generated based on current parameters of other ones of the communication layers, current parameters of the first communication layer, or both.

For example, the control information may comprise at least one command for modifying a presentation layer in the system (transmit and receive), such as a command for changing a codec type used by the system, e.g., a command for changing a video codec type and/or audio codec type used by the mobile device. As another example, the control information may comprise at least one command for modifying a management layer in the mobile device, such as changing a transport configuration of transmitted packets, changing signaling used in transmitted packets, and/or changing an announcement used in transmitted packets. As another example, the control information may comprise at least one command for modifying a physical layer in each of the transmit/receive logic, such as modifying an amount of forward error correction applied to packets, modifying an encoding scheme used in the system, modifying a modulation scheme and/or altering the amount/placement of known training sequence data inserted to aide mobile reception.

The method may also receive an instruction or determine to adjust a first communication layer, and upon examination of parameters of other communication layers may also independently decide to adjust one or more other communication layers as well. For example, the transmission system 102 may decide to change the coding rate, and in response to the decision to change the coding rate may also decide to the change the codec type (e.g., use MPEG-4 instead of MPEG-2). As another example, the transmission system 102 may decide to change the coding rate, and in response to the decision to change the coding rate may also decide to change the resolution associated with the source coding (which is performed at a different communication layer).

In 128 the method generates and transmits packets to the receiver over the wireless communication medium. In 128 the method generates packets containing audiovisual information as well as packets containing the control information generated in 126. The packets containing audiovisual information may comprise one or more content streams intended for devices, including mobile devices 112 and possibly stationary device(s) 114. In one embodiment, the method generates packets according to the ATSC (Advanced Television Standards Committee) DTV (digital television) standard containing one or more digital television channels intended for stationary receivers (e.g., televisions), and the method also generates packets containing one or more digital television channels intended for mobile/handheld (M/H) receivers.

Generation of the packets containing audiovisual information may comprise various steps, such as encoding the audio and video data (e.g., using MPEG-2 encoding), applying forward error correction, generating appropriate packet headers and control information, etc.

The packets containing control information may be provided in place of unassigned packets in the 8-VSB data stream that would normally be transmitted. A Variable Stream Instruction Word (VSIW) may be used to contain the control information. In one embodiment, the method may utilize three different transport methods for conveying the control information, these being: VSIW Over MPEG-2 TS (Variable Stream Instruction Word Over MPEG-2 Transport Stream); VSIW Over Robust Stream; and VSIW Over Field Sync. For at least a subset of the transport methods (VSIW Over MPEG-2 TS and VSIW Over Robust Stream), the transmitted packet has the form: uPID/VSIW Packet, where uPID designates an unassigned PID header and "VSIW Packet" is the payload. The uPID header is utilized to ensure compatibility with legacy systems. Also, the VSIW Packet in the payload has additional robustness for reliable detection. These different transport methods are discussed further below.

In one embodiment, the transmission system 102 provides information to the receiver in the mobile device 112 to configure the receiver regarding how to receive the packets, i.e., the ordering of the packets in the transmitted data stream. Once the packet ordering is established, the method may subsequently only send delta information to the receiver regarding changes in the ordering.

As noted above, the commands contained in the packet transmission (the commands in the control information) may utilize a command structure that is known both on the transmit side and the receive side. The command structure may be organized as a hierarchical tree. Thus the commands comprised in the control information may be configured to modify parameters stored according to a hierarchical tree structure maintained in both the transmission system 102 and the receiver, wherein the hierarchical tree structure represents the transmit/receive configuration. This hierarchical tree structure is discussed in greater detail below. In another embodiment, the command structure may be a flat structure, or other type/configuration of command structure. Thus, any of various types of command structures may be used, as desired.

The hierarchical tree structure may allow for new nodes to be added to the tree after deployment of transmission and receiver systems, where the new nodes add new functionality in the system. Thus the transmit method may generate the control information configured to modify the hierarchical tree structure in the receiver to provide extended functionality in the receiver. For instance, a new coding method may be introduced in a later revision of the M/H protocol. In order for the receivers in the mobile devices to be made aware of this new coding method, the transmission system 102 may transmit control information containing a command to add one or more nodes to the current tree structure to add the corresponding parameters for this new coding method to the tree structure. After the receiver receives and executes these command(s), this new coding method is represented by a new branch in the tree thereby extending the node associated with FEC. Likewise, a new codec type might be added under the Audio or Video Codec nodes or a new method of file delivery and associated parameter set may be added to extend functionality associated with the management layer.

The transmission method may also operate to transmit version information, where the version information provides a more efficient mechanism to specify ranges of the tree.

Transmission of the packets in 128 may comprise transmitting a first plurality of packets comprising audiovisual information intended for mobile devices (first stream), a second plurality of packets comprising control information (second stream), and a third plurality of packets comprising standard digital television signals intended for stationary televisions (third stream). The standard digital television signals may not be useable by the mobile device. Transmission of these plurality of packets may comprise multiplexing the first, second, and third plurality of packets (multiplexing the first, second and third streams). Multiplexing of these different packets or streams may be performed based on a ratio of the relative bandwidth allocations of the respective pluralities of packets (or streams). In one embodiment corresponding to continuous mode, multiplexing these different packet streams comprises ordering the packets to distribute them evenly according to their relative bandwidth. In another embodiment corresponding the burst mode, the different packet streams are aggregated in separate bursts preceded by control information (aggregated in its own burst) to indicate the start position of the remaining bursts. The multiplexing may operate to reduce transmission overhead. In one embodiment, the transmission method transmits size information regarding the bandwidth allocations of the various packet streams, wherein the size information is useable at the receiver to demultiplex the received packet streams.

Receive Flowchart

Figure 3:
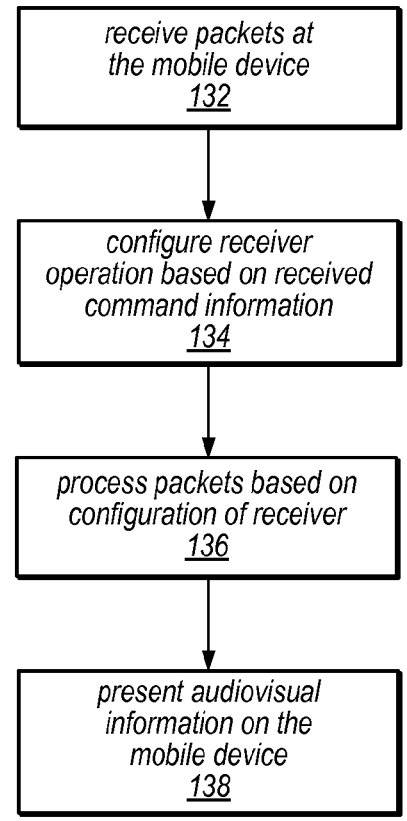
FIG. 3 is a flowchart diagram illustrating reception, processing and presentation of audiovisual data and control information according to one embodiment of the invention.

FIG. 3 is a flowchart diagram illustration operation of an exemplary mobile device 112 according to one embodiment.

As shown, in 132 the mobile device 112 receives packets transmitted by the transmitter in 126 (FIG. 2 above). As noted above, the received packets may comprise audiovisual information as well as control information.

In 134 receiver operation in the mobile device 112 is configured based on the received control information. In other words, the mobile device 112 extracts commands from the control information contained in the received packets and configures its operation according to the commands. The commands contained in the control information may be executed to modify operation of one or more communication layers in the receiver. For example, if the control information specifies use of a specific video codec and/or audio codec, the receiver in the mobile device is configured according to the indicated video codec and/or audio codec. As another example, if the control information specifies use of a certain amount of forward error correction, the receiver in the mobile device is configured to decode received data based on the amount of indicated forward error correction. Likewise, if the control information indicates intentions to revise the amount and/or placement of training data, the receiver in the mobile device is configured to receive training sequence data in the revised locations. As another example, if the control information specifies use of a certain display resolution, the receiver is modified to produce the indicated display resolution.

In one embodiment, the receiver in the mobile device 112 is implemented as a processor and memory, preferably a multiprocessor system. In this embodiment, the receiver may be reconfigured in software. Thus in response to received control information various program instructions may be selected and/or various software parameter values may be modified to configure the receiver according to the control information.

In another embodiment, the receiver in the mobile device 112 is implemented in hardware, with various hardware blocks that are selected for use based on the received control information, or possibly with parameter values that are updated in respective registers. In another embodiment, the receiver in the mobile device 112 is implemented as a combination of hardware and software. In one specific example, the receiver in the mobile device 112 may be implemented as one or more field programmable gate arrays (FPGAs) with various IP cores that may be configured as desired. For example, various FPGA IP cores may have memory elements that store parameter values that can be modified.

In 136, the mobile device 112 (e.g., the receiver in the mobile device) processes packets, e.g., processes the first plurality of packets containing audiovisual information, based on the configuration in 134. Thus in 136 the receiver processes received packets according to any change(s) made to one or more communication layers in 134. In other words, the various communication layers in the receiver (as modified in 134) operate to process audiovisual data in received packets, e.g. subsequently received packets.

In 138 the mobile device 112 presents audiovisual information on its display based upon the received packets. Thus the mobile device 112 may operate according to its configuration in 134 to process the received information and present the received audiovisual information on its display.

Generation of Control Information

Figure 4:
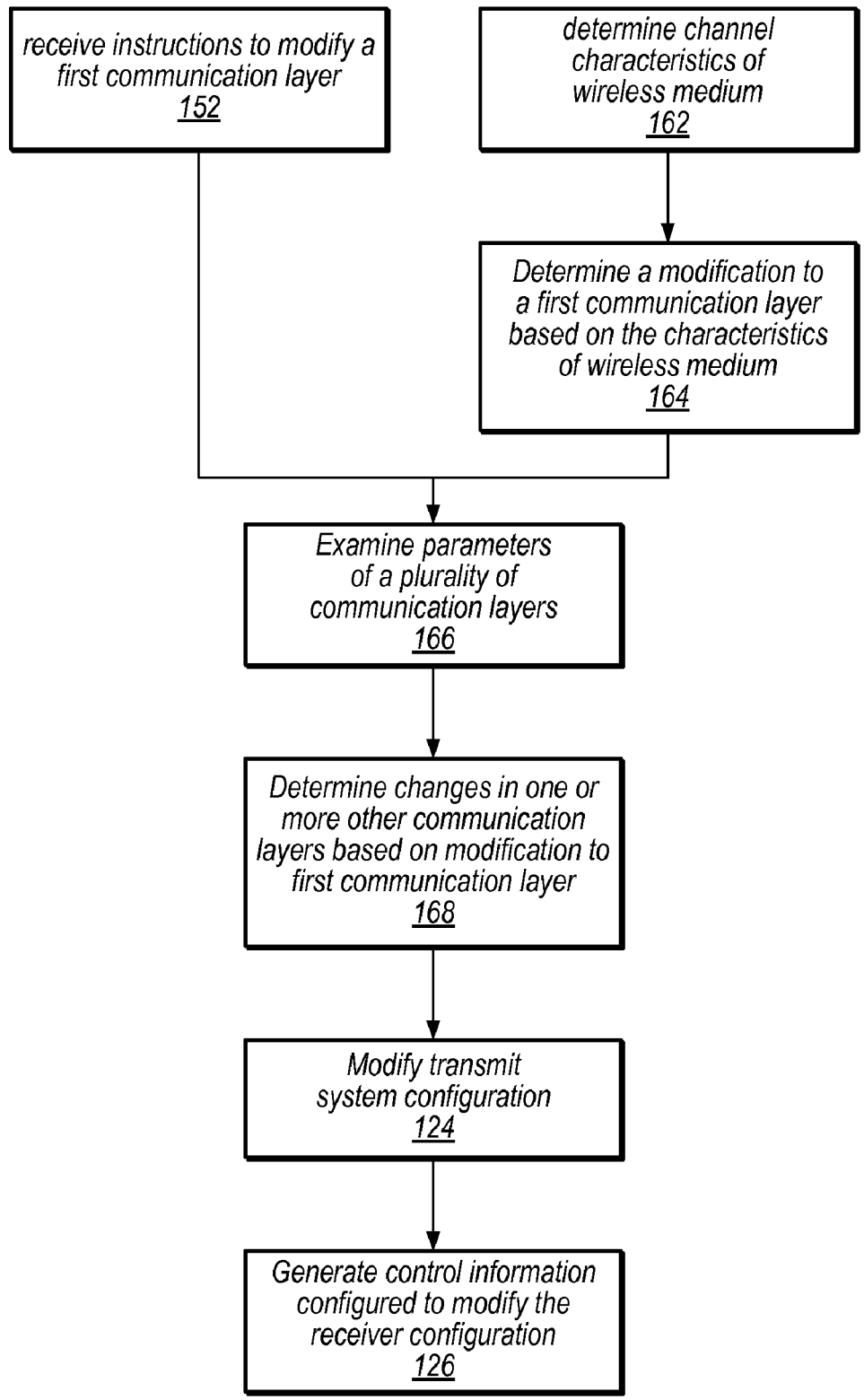
FIG. 4 is a flowchart diagram illustrating generation of control information based on received instructions and/or determined channel characteristics of the wireless medium.

FIG. 4 is a flowchart diagram illustrating generation of control information based on received instructions and/or determined characteristics of the wireless medium.

As shown, at 152 the transmit system 102 may receive instructions to modify at least one communication layer (e.g., a first communication layer). These instructions may be provided by a broadcaster, a carrier, or another entity. The instructions may be provided to modify transmit/receive operation to compensate for certain "conditions", such as changing viewer usage/viewing habits, e.g., increased viewing (and hence increase bandwidth requirements), equipment failure, broadcaster requirements, etc. In one embodiment, these instructions may be generated by software executing inside the transmission system 102 itself.

For example, during periods of increased viewership (e.g., during the World Cup), the method may provide increased service relative to other periods, e.g., may allocate more of the available bandwidth to M/H services. Similarly, bandwidth may be expanded or reallocated during the evening commute (e.g., 4 PM to 7 PM) to broadcast daily stock market summaries past market close to supplement a low bandwidth stock ticker present throughout the day. Likewise, daily news/sports updates could be tailored during commute hours (e.g., 7 AM to 9 AM and/or 4 PM to 7 PM) for the screen resolution appropriate for handheld devices, and then scaled back during primetime hours to permit higher resolution programming.

In one embodiment, the generated control information may be based on anticipated usage scenarios. As one example, as noted above, instructions may be provided to modify transmit/receive operation during commute times vs. prime time. For example, drive-time (commute) bandwidth may be dominated by multiple low resolution streams that are frequently updated. Also, audiovisual traffic during commute hours is generally more burst-like in order to accommodate user directed file downloads to browse and/or store content on mobile devices 112 for later viewing. In contrast, prime time hours may involve a much greater amount of static programming that is consumed end-to-end. Thus, instructions may be provided to one or more transmission systems 102 to configure the transmit/receive systems differently during these different time periods having different usage patterns.

The transmission system 102 can be modified based on typical user statistics and the nature of the content appropriate for different usage scenarios. For instance, usage scenarios can be characterized in terms of the following:

Burst vs. Continuous traffic: commute time usage may predominantly comprise burst downloads (even for audiovisual content) where users browse data repositories similar to those found on YOUTUBE™. As a result, the broadcaster may change the transport protocol to include IP encapsulation on top of MPEG-TS encapsulation to permit additional error concealment/packet control. In other words, a file store/playback system may recover more favorably to a packet error encountered in IP versus similar disruption encountered at the MPEG-TS layer. This is because higher layers have mechanisms to detect and recover from transport errors, whereas TS encapsulation might suffice for continuous stream content.

Mobile/Pedestrian/Static: the anticipated traffic type might be derived from the shift in the predominance of mobile/pedstrian/static use over the course of a day. The amount of error correction, the screen resolution and perhaps the transport protocol might change over the course of the day to accommodate shifts in bandwidth utilization.

Broadcast Quality vs. User Derived Content: the broadcaster might choose to treat streams differently based on the origin of the stream content. For instance, user derived content (e.g., YOUTUBE) might warrant lower screen resolution, different codec types (MPEG-2/4, H.264, VC-1), etc. than that used for broadcast quality content. User derived content might also warrant different levels of authentication/encryption than that used for broadcast quality streams. User derived content might impose different announcement/service discovery requirements given the variety of content in terms of the number of streams, the bandwidth allocated per stream and the nature of stream delivery, i.e. burst vs. continuous, compared with a limited set of broadcast quality streams.

Local/Regional/National: content might be further segregated in terms of the intended coverage range. Local traffic/weather updates for instance might require different error correction coding given the limited coverage range. Access methods might also vary based on control of the source content. For example, national content might require a higher level of protection than regional content. Regional content in turn might require higher protection than local content along the same lines drawn for network/affiliate/public access broadcast TV where the level of content ownership and advertising revenue potential warrant different levels of protection.

Alternatively, or in addition, in 162 the transmission system 102 may determine channel characteristics of the wireless communication medium and then use these determined channel characteristics to generate the control information. In 162 the method may determine channel characteristics based on information from an equalizer comprised in the receiver of one or more mobile device(s). The method may use known training sequences to determine channel characteristics. In other words, the transmission system 102 may transmit known training sequences over the wireless communication medium, and then receive information from the receiver regarding the reception of these known training sequences. For example, the method may deconvolve the channel based on the known training sequence(s) to determine the accuracy of the channel estimate. It is noted that channel characteristics may not be known by the transmission system 102 unless specially equipped receivers are deployed in the broadcast area to provide feedback on a return channel reporting packet error statistics, receive SNR, etc. The receivers might additionally, based on the aforementioned receive characteristics, determine how to configure the communication layers and feed the necessary control information back to the transmission system 102 thereby comprising a closed system of control.

At 164 the transmit logic 104 may determine a modification to a first communication layer based on the characteristics of the wireless medium. For example, if the received signal is weak, noisy or otherwise unreliable, resulting in lost packets, the method may increase the amount of forward error correction to compensate for the noisy channel and decrease the image resolution. If the wireless communication medium is determined to be relatively strong and robust, the method may decrease the amount of forward error correction, thus allowing for more transmission bandwidth, e.g., for higher image resolution or more channels.

Figure 16:
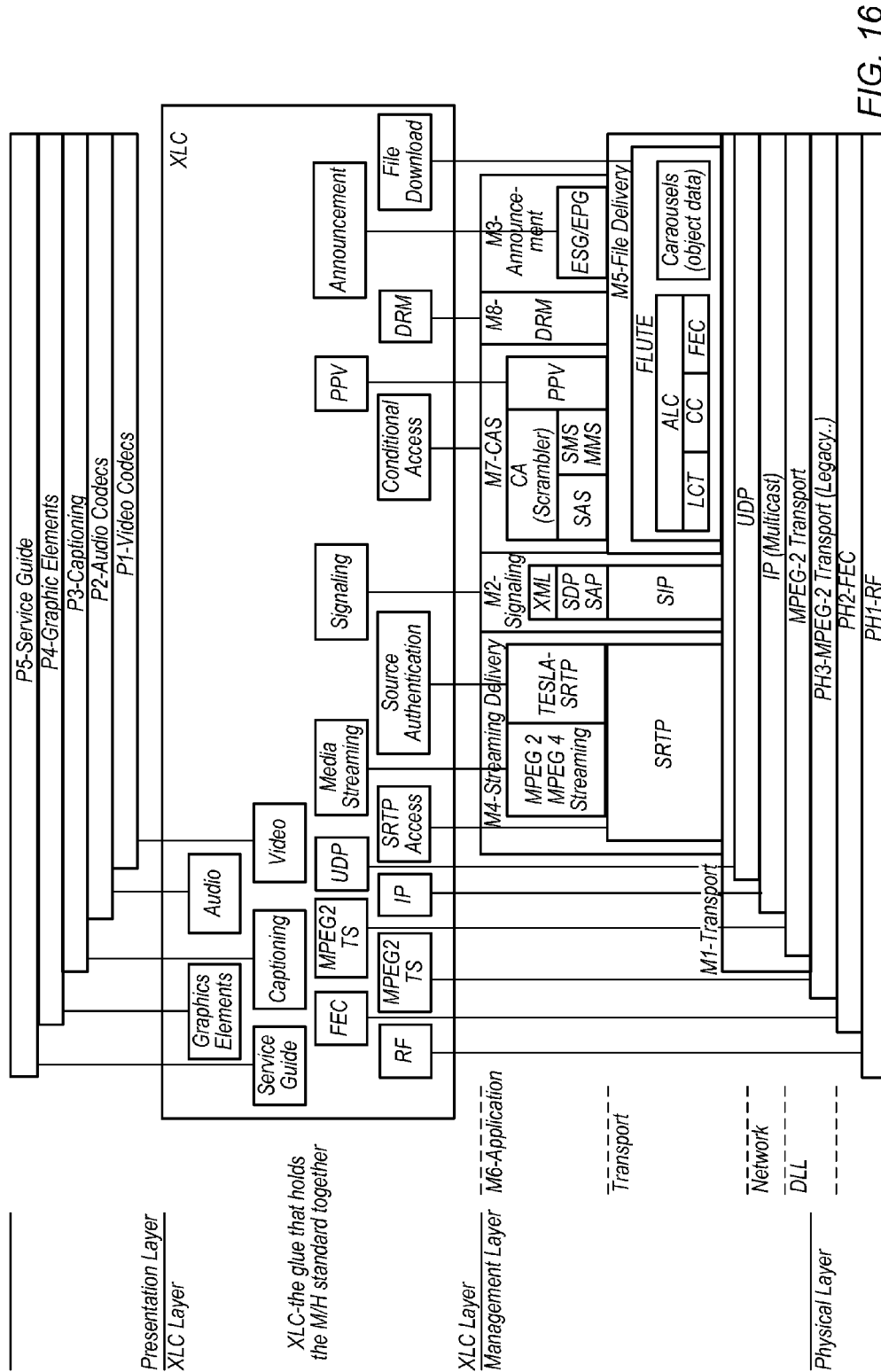
FIG. 16 illustrates ATSC mobile/handheld (M/H) system layers with cross layer control (XLC) according to one embodiment.

After a modification to at least one communication layer is determined in either 152 or 164, at 166 the transmit logic 104 examines parameters of a plurality of communication layers. This may comprise examining parameters in various of the communication layers, e.g., as shown in FIG. 16. For example, in 154 the transmit logic 104 may examine parameters in each of the presentation layer, the management layer, and the physical layer. Thus, for example, if the transmit system 102 receives an instruction to modify a portion of a first communication layer (e.g., the management layer), the transmit logic 104 may also examine parameters of the other communication layers (the presentation layer and the physical layer) to determine if any changes are required to portions of these other communication layers, based on the requested change (e.g., to the management layer).

At 168 the transmit logic 104 determines determine changes in one or more other communication layers based on the requested modification to the first communication layer. It is noted that the transmit logic 104 may in some instances determine changes in one or more other communication layers based on the requested modification to the first communication layer, and in other instances the transmit logic 104 may determine that no changes are required in one or more other communication layers based on the requested modification to the first communication layer.

In one embodiment, the transmit logic 104 may examine parameters of a plurality of communication layers in 166 and determine based on the parameters of the various communication layers that the instructed or determined modification to the first communication layer should itself be modified, e.g., to provide improved or optimized performance based on the current state of the plurality of communication layers. For example, if a modification to one or more parameter values in a first communication layer is determined in either 152 or 164, at 166 the transmit logic 104 may examine parameters of a plurality of the communication layers and determine that a different modification to the first communication layer should be made, possibly in conjunction with changes to other parameters in the first communication layer or changes to parameter values in other communication layers.

At 124 the configuration of the transmission system 102 is modified. Step 124 was described above with reference to FIG. 2.

At 126 the transmit logic 104 generates control information configured to modify the first communication layer and possibly one or more other communication layers. Step 126 was described above with reference to FIG. 2. As discussed above with respect to 128 of FIG. 2, this control information may then be inserted into packets for transmission, e.g., to the various mobile devices 112.

Receiver Feedback/Control

In one embodiment, the receiver in the mobile device 112 transmits feedback information back to the transmission system 102. The receiver in the mobile device 112 may transmit the feedback information back to the transmission system 102 over any of various mediums, e.g., a return path, such as a cellular network or WAN/WAP, etc. The feedback information may comprise various types of information, such as packet error rates, packet loss information, receiver capabilities, user settings, etc. The transmission system 102 may then use this feedback information in determining how to adjust the broadcast system, e.g., which parameters to adjust in one or more of the communication layers in the transmission/receive systems.

In another embodiment, the receiver in the mobile device 112 may also transmit control information to the transmission system 102 to configure the transmission system. For example, the receiver obtain various information, such as packet error rates, user input, etc., and may reconfigure itself (by changing one or more parameters in one or more communication layers in the receiver). The receiver may then generate control information (in a similar manner in which the transmission system 102 generates control information) and provide this control information to the transmission system 102. The transmission system 102 may then receive this control information and modify its capabilities accordingly, e.g., modify one or more parameters in one or more communication layers in the transmission system 102.

Thus in one embodiment of the broadcast system 102, the transmission system 102 is capable of modifying its configuration and transmitting information to the receiver in at least one mobile device 112 to modify its configuration, and the receiver in at least one mobile device 112 is capable of modifying its configuration and transmitting information to the transmission system 102 to modify its configuration.

Transmit Architecture

Figure 5:
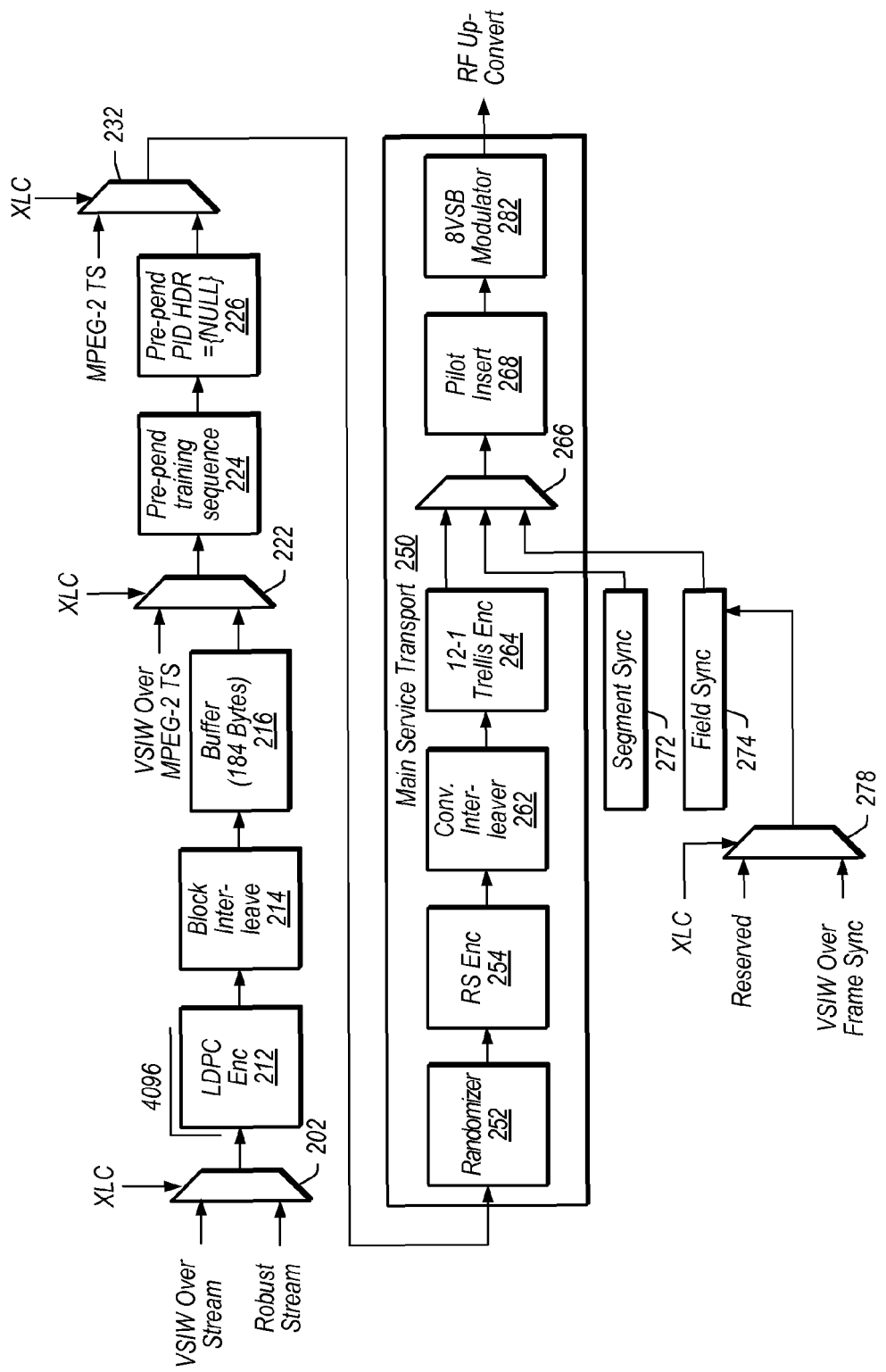
FIG. 5 illustrates a system architecture of a transmitter in the system of FIG. 1.

FIG. 5 is a block diagram of an exemplary transmit architecture which may be comprised in the transmit logic 104. As shown, the transmit architecture may comprise a multiplexer 202 having a first input for receiving a media stream (robust stream) and a second input for receiving first control information (referred to as a VSIW (Variable Stream Instruction Word) Over Stream). The multiplexer 202 includes a control input that receives an XLC signal. The XLC signal determines whether the media stream 204 or the first control information 206 is provided as an output of the multiplexer 202. The output of the multiplexer 202 is provided to a robust encoder 212, e.g. LDPC (Low Density Parity Check).

The robust encoder 212 computes parity check bits based on the transmit data. The robust encoder 212 provides an output to a Block Interleave block 214.

The Block Interleaver block 214 permutes the data block to minimize the impact of burst errors in the transport stream. The Block Interleave block 214 provides its output to Buffer 216. The Buffer 216 is coupled to provide its output to a first input of a multiplexer 222. The second input of the multiplexer 222 receives second control information, referred to as VSIW Over MPEG-2 TS. The multiplexer 222 includes a control input that receives an XLC signal. The XLC signal determines whether the output of the buffer 216 or the second control information 218 is provided as an output of the multiplexer 222. The output of the multiplexer 222 is provided to a Pre-pend training sequence block 224.

The Pre-pend training sequence block 224 attaches the prescribed training sequences ahead of the packet data. The Pre-pend training sequence block 224 provides its output to a Pre-pend PID HDR block 226. The Pre-pend PID HDR block 226 replaces the MPEG-2 TS Header with an unassigned PID header affording backward compatibility to legacy receivers. The Pre-pend PID HDR block 226 provides its output to a first input of a multiplexer 232. The multiplexer 232 includes a second input 234 that receives an MPEG-2 TS (Transport Stream). The multiplexer 232 includes a control input that receives an XLC signal. The XLC signal determines whether the output of the Pre-pend PID HDR block 226 or the MPEG-2 TS 234 is provided as an output of the multiplexer 232. The output of the multiplexer 232 is provided to a Main Service Transport block 250.

The Main Service Transport block 250 comprises a randomizer 252, an encoder 254, e.g., RS (Reed Solomon) encoder, Convolutional Interleaver 262, a Trellis encoder 264, e.g., 12-1 Trellis Encoder, a multiplexer 266, a Pilot insert block 268, and an 8VSB modulator 282.

The randomizer 252 generates a random signal that is provided to the RS encoder 254. The RS encoder performs Reed Solomon coding and provides its output to the Convolutional Interleaver 262. The Convolutional Interleaver 262 permutes the transmitted data bits and provides its output to the Trellis encoder 264.

The Trellis encoder 264 provides its output to a first input of 3 input multiplexer 266. The multiplexer 266 also receives inputs from the Segment Sync block 272 and Field Sync block 274. The Field Sync block 274 receives an input from two input multiplexer 278. The multiplexer 278 receives as a first input a signal VSIW Over Frame Sync. The second input of the multiplexer 278 is currently Reserved and not connected. The multiplexer 278 includes a control input that receives an XLC signal. The XLC signal determines whether the VSIW Over Frame Sync is provided as an output of the multiplexer 278.

The output of the multiplexer 266 is provided to the Pilot insert block 268. The Pilot insert block 268 inserts a pilot tone in accordance with the ATSC 8VSB DTV Specification. The Pilot insert block 268 provides its output to the 8VSB modulator 282. The 8VSB modulator 282 performs 8VSB modu-lation on the received data and provides an 8VSB modulated output signal to an RF upconverter. The RF upconverter generates an RF (radio frequency) signal which includes the 8VSB modulated signal. The generated RF signal may then be transmitted by transmitter 106.

The Transport Stream Encoding method according to one embodiment of the invention can be described relative to the Main Service Transport as depicted in FIG. 5. The system shown in FIG. 5 provides 3 different mechanisms for inserting control information into the transmitted stream. These 3 different mechanisms are represented by the three multiplexers and 202, 222, and 278. A fourth multiplexer 232 inserts unassigned packets comprising robustly encoded audio visual packet information and the associated control information in the standard transport stream, In the current embodiment, the following mechanisms supplement the main service transport:

1. Robust Stream—robustly encoded stream multiplexed under XLC control over MPEG-2 TS.
2. VSIW Over MPEG-2 TS—standard encoded VSIW multiplexed under XLC control over MPEG-2 TS.
3. VSIW Over Robust Stream—robustly encoded VSIW multiplexed under XLC control over MPEG-2 TS.
4. VSIW Over Frame Sync—uncoded VSIW inserted under XLC control in the Reserved-byte portion of Field Sync.

The "VSIW Over Frame Sync" signal provides the most robust means for transmitting the control information, but affords the least bandwidth for transporting control information. The "VSIW Over MPEG-2 TS" affords greater bandwidth for transporting control information spread in a manner to provide increased reliability.

Figures 6, 7:
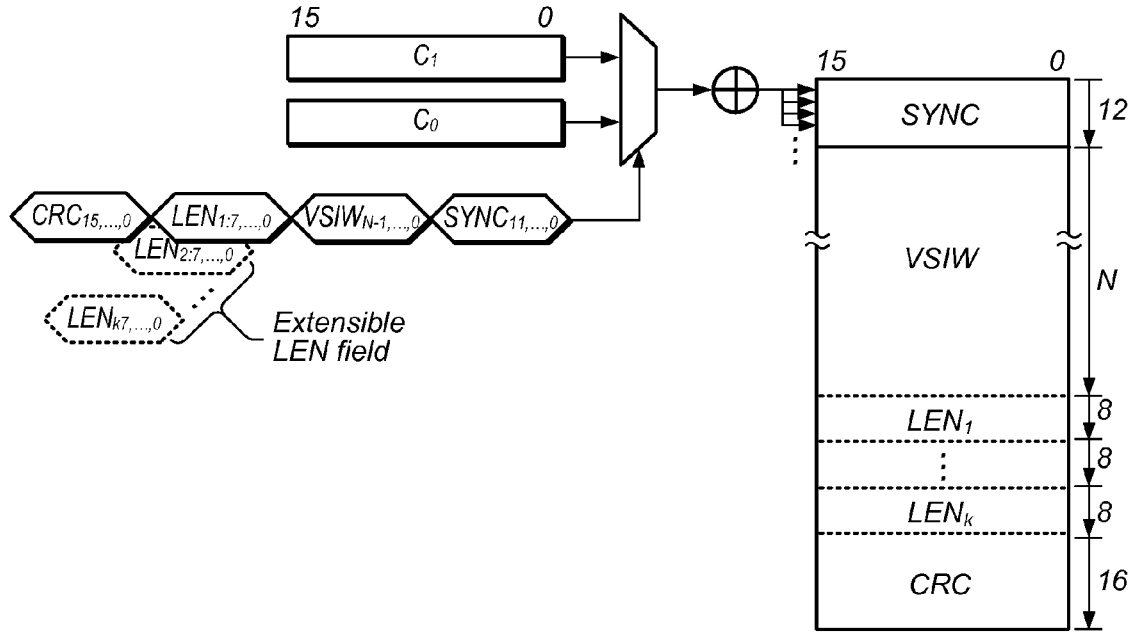
FIG. 6 illustrates a summary of stream encoding methods according to one embodiment of the invention.
FIG. 7 illustrates encoding of command packets in a mobile digital television stream according to one embodiment of the invention, e.g., illustrates VSIW over MPEG-2 transport stream encoding.

From the perspective of stream encoding, each transport method can be characterized in terms of the error protection, modulation/coding and stream synchronization employed, as summarized in the table of FIG. 6. In the table of FIG. 6, 8-VSB under the heading FEC refers to RS+TCM coding employed by the main service transport.

1. Robust Stream

FEC—Referring again to FIG. 5, the Robust Stream encoding supplements the concatenated RS+TCM method of FEC employed in the main stream with a LDPC (Low-Density Parity-Check) block code, the characteristics of which can be summarized as follows: Regular: column weight=3, Systematic: information follows parity (i.e. $[P_{n-k}, \ldots, o \, \| I_{k-1}, \ldots, o]$), ½-rate coding: [n,k]=[4096, 2048],
¼-rate coding: [n,k]=[4096, 1024],
⅛-rate coding: [n,k]=[4096, 512].

The block encoder is followed by an N×M block encoder (M=4096, N=M*rate). Interleaved symbols are buffered in an 184-byte block to match the nominal MPEG-2 TS data field length before RS-Encoding.

Modulation and Coding—After encoding, a training sequence is pre-pended to the data field for use by certain receiver configurations. This field may be left empty ([ ]) if not needed. A PID is then pre-pended with the header field set to the prescribed value (zero-padded to the full 3-bytes) before being sent the main service transport. No additional modulation or coding is employed as part of the Robust Stream Encoding.

Stream Synchronization—Synchronization is implicit given that the stream location is known by the receiver.

2. VSIW Over MPEG-2 Transport Stream

FIG. 7 illustrates encoding of command packets in a mobile digital television stream according to one embodiment of the invention. For example, FIG. 7 illustrates VSIW over MPEG-2 transport stream encoding. VSIW Over MPEG-2 TS requires that the VSIW is encoded and placed over Stream 0, known as the Main stream, as shown. The VSIW Over MPEG-2 will share the stream with stream 0 but does not have to be located in any particular place in the stream.

VSIW Over MPEG-2 TS FEC—Multiplexed alongside the MPEG-2 TS, VSIW Over MPEG-2 does not employ additional FEC.

VSIW Over MPEG-2 TS Modulation and Coding is shown in FIG. 7. As shown, VSIW Over MPEG-2 is inserted at the information bit-level (i.e. ahead of the RS+TCM) and is encoded using a pair of length-16 Gold codes ($\{C_0, C_1\}=[2271_{16}, 7B28_{16}]$). Derived from an orthogonal codebook, $\{C_0, C_1\}$ provide additional protection in the form of signal processing gain over an individually coded bit.

Transported in 16-bit groupings, each codeword is modulated (i.e. selected) according to the intended information content, the result of which represents a single un-coded bit in the VSIW stream. The $C_0$ codeword is inserted whenever a '0' occurs in the VSIW stream; $C_1$ is sent whenever a '1' occurs thus occupying 2-bytes in the transport stream for each inserted information bit.

The SYNC sequence ($SYNC=7712_8$) provides a mechanism to reliably detect the VSIW stream start. The modulated code sequences [$C \in \{C_0, C_1\}$], selected according to bit content, provide inherent signal processing/spreading gain improving the reliability of stream communication relative to any bit transmitted individually.

FIG. 8 summarizes the stream framing parameters. Each bit in the stream is modulated using the length-16 codes as described above with spreading applied across SYNC|LEN|VSIW|CRC, indiscriminately.

VSIW Over MPEG-2 TS Stream Synchronization—SYNC is inserted at the start of each stream to assist the receiver in locating VSIW Over MPEG-2, potentially inserted anywhere within an 8-VSB frame. Once detected, the sync field establishes the start of the intended information field. The remaining message stream is processed thereafter until the stream end is reached as indicated by the LEN field.

3. VSIW Over Robust Stream

VSIW Over Robust Stream is an extension of the robust transport method permitting VSIW to be communicated over MPEG-2 TS with extra error protection as described above for the Robust Stream Encoding.

The VSIW only carries information relative to the stream that it is being transported under. The VSIW also must be placed at the start of a stream frame where a stream frame is the recycle point in the stream.

VSIW Over Robust Stream FEC—VSIW Over Robust Stream employs the same additional FEC, i.e. LDPC, as that used for the Robust Stream Encoding.

VSIW Over Robust Stream Modulation and Coding—VSIW Over Robust Stream uses the same code-spread modulation employed in VSIW Over MPEG-2 with the exception the SYNC field is omitted to conserve bandwidth.

The process for coding VSIW Over Robust Stream can be outlined as follows:

Concatenate LEN|DATA|CRC (at the information bit level),

Modulate by a pair of length-16 orthogonal code sequences as described above,

LDPC encode according to the robust stream method,

Buffer and pre-pend unassigned PID header+training sequence (if needed),

Insert in the MPEG-2 transport stream MUX.

VSIW Over Robust Stream Synchronization—Synchronization is implicit in that the stream location is known by the receiver. For this reason the VSIW Over Robust Stream must be placed at the start of a stream frame where a stream frame is the recycle point in the stream.

4. VSIW Over Field Segment Sync

As described by the ATSC A/53 standard, 82 of the 92 reserved symbols in the field segment sync are available to support extension of the standard. This is where the VSIW packet transmission occurs.

VSIW Over Field Sync FEC—VSIW Over Field Sync bypasses both the standard RS+TCM and robust encoding methods.

VSIW Over Field Sync Modulation and Coding—Inserted at the modulated signal level, VSIW Over Field Sync uses the 2-level (i.e. ±5) modulation employed in the surrounding sync symbols. Unlike the other VSIW methods, code-spread modulation is abandoned (along with the [SYNC]|LEN|DATA|CRC frame structure) given the limited bandwidth afforded a Field Sync and the succinct nature of the communication.

VSIW Over Field Sync Stream Synchronization—Synchronization is implicit in that the stream location and length are known by the receiver.

Receive Architecture

Figure 9:
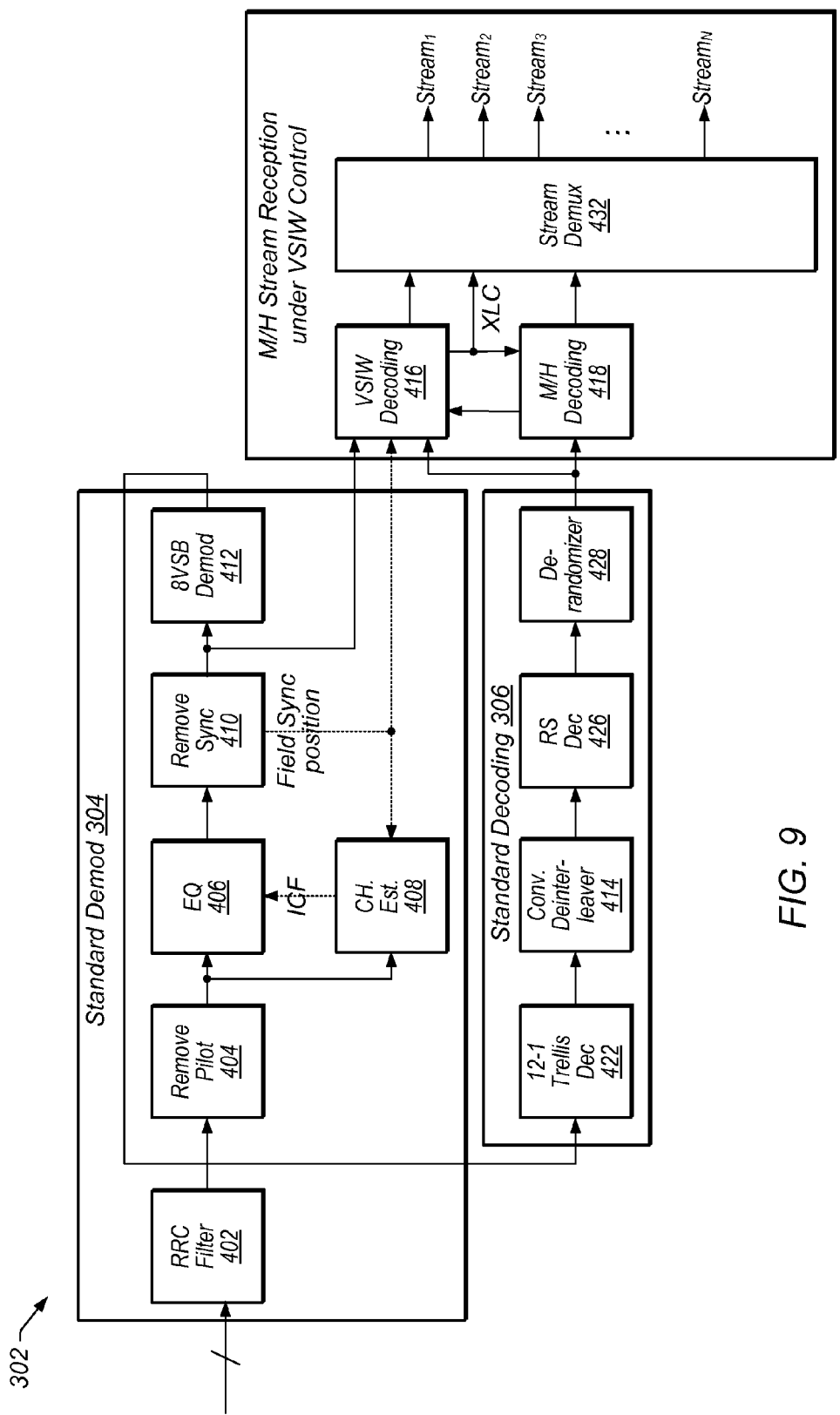
FIG. 9 illustrates a system architecture of a receiver in an exemplary mobile device according to one embodiment of the invention.

FIG. 9 illustrates a receive architecture in a mobile device 112 according to one embodiment of the invention. More particularly, FIG. 9 illustrates an overview of digital RX processing that may be performed in the receiver of a M/H device 112. As shown, receiver 302 comprises Standard Demodulation 304, Standard Decoding 306 and M/H Stream Reception under VSIW Control block 308. The receiver 302 decodes an input signal yielding a stream of receive symbols at the output of the Standard 8VSB Demodulator 304. The output of the Standard Demodulator 304 is passed to the Standard Decoder 306 producing a standard 8VSB transport stream. The VSIW Decoder 416 is configured to search the receive signal for control packet information at the output of the Standard Decoder 306, the output of the M/H Decoder 418 and the output of Sync removal 410 corresponding to VSIW over MPEG-2 TS, VSIW over Robust Stream and VSIW of Field Segment Sync, respectively. M/H decoding 418 is applied in accordance with XLC commands recovered from VSIW decoding 416. The received transport stream is de-multiplexed 432 to produce a plurality of audiovisual streams corresponding to mobile and/or fixed services. The receiver 302 may be implemented in any of various ways, as discussed below with respect to FIG. 13.

The signal processing stage operates to provide channel selection and filtering such that symbol data (3 bits) may be processed in subsequent stages. The signal processing may be performed by both analog (hardware) and digital (software). Analog signal processing may be performed by an RF Tuner, IF Filter and analog-to-digital conversion (not shown). Digital signal processing (DSP) comprises the rejection filters, equalizer 406 and phase tracker.

The receiver 302 operates to remove (e.g., deconvolve) any unwanted channel effects from the received symbol stream. These effects include co-channel interference (e.g. NTSC), multi-path dispersion and Doppler shifting. The deconvolved data is then analyzed to determine what adjustments are needed to the RF Tuner to improve symbol recovery.

As shown in FIG. 9, the received signal is provided to a Root Raised Cosine (RRC) filter block 402 which operates to filter the signal to match the RRC response applied at the transmitter. The RRC filter block 402 provides its output to a Remove Pilot block 404.

The Remove Pilot block 404 removes the DC-offset introduced by the pilot tone. The Remove Pilot block 404 provides its output to an EQ block 406 and to a Chanel Estimation block 408.

The EQ block 406 reverses the channel effects estimated from the received signal. The EQ block 406 provides its output to a Remove Sync block 410.

The Remove Sync block 410 provides Field Sync position information to the Channel Estimation block 408 and to VSIW Decoding block 416. The Remove Sync block 410 provides an output to an 8VSB Demodulation block 412

The Chanel Estimation block 408 operates to determine the appropriate inverse channel response.

The 8VSB Demodulation block 412 performs 8VSB demodulation on the signal and provides an output to Mobile/Handheld (M/H) Decoding block 414. The 8VSB Demodulation block 412 also provides an output to 12-1 Trellis Decoder 422. The Trellis Decoder 422 performs Trellis decoding on the received signal and provides an output to Convolutional Deinterleaver 414. The Convolutional Deinterleaver 414 reverses the bit permutation introduced by the Convolutional Interleaver. The Convolutional Deinterleaver 414 provides an output to Reed Solomon (RS) Decoder 426. The RS Decoder 426 performs block decoding. The RS Decoder 426 provides an output to De-randomizer 428. The De-randomizer 428 provides an output to VSIW Decoding block 416 and Stream Demultiplexer block 432.

The M/H Decoding block 418 applies the additional FEC associated with the M/H transport as directed by the VSIW Decoding block 416.

The VSIW Decoding block 416 operates to decode command information (VSIW commands) from received packets. The VSIW Decoding block 416 accepts input from three separate locations in the transport corresponding to VSIW over MPEG-2 Transport Stream taken at the output of the De-randomizer, VSIW Over Robust Stream taken at the output of the M/H Decoding block and VSIW Over Field Segment Sync taken at the output of the Remove Sync block, respectively. The VSIW Decoding block 416 provides cross layer control (XLC) information to the M/H Decoding block 414 and to Stream Demultiplexer 422. The XLC information comprises parameter settings destined for endpoints in the tree structure along with commands to traverse nodes in the tree as well as relative bandwidth and per stream coding rates needed to determine the multiplexing arrangement. The XLC information is discussed in greater detail below.

The M/H Decoding block 418 and the VSIW Decoding block 416 are coupled to a Stream Demultiplexer 432. The Stream Demultiplexer 432 demultiplexes the various streams from the received signal to generate various individual audio-visual streams (e.g., digital television channels).

The signal processing stage operates to provide channel selection and filtering such that symbol data (3 bits) may be processed in subsequent stages. The signal processing may be performed by both analog (hardware) and digital (software). Analog signal processing may be performed by an RF Tuner, IF Filter and analog-to-digital conversion. Digital signal processing (DSP) comprises the rejection filters, equalizer 406 and phase tracker.

The receiver is configured to remove (i.e. deconvolve) any unwanted channel effects from the received symbol stream. These effects include co-channel interference (e.g. NTSC), multi-path dispersion and Doppler shifting. The deconvolved data is then analyzed to determine what adjustments are needed to the RF Tuner to improve symbol recovery.

Figures 10, 11:
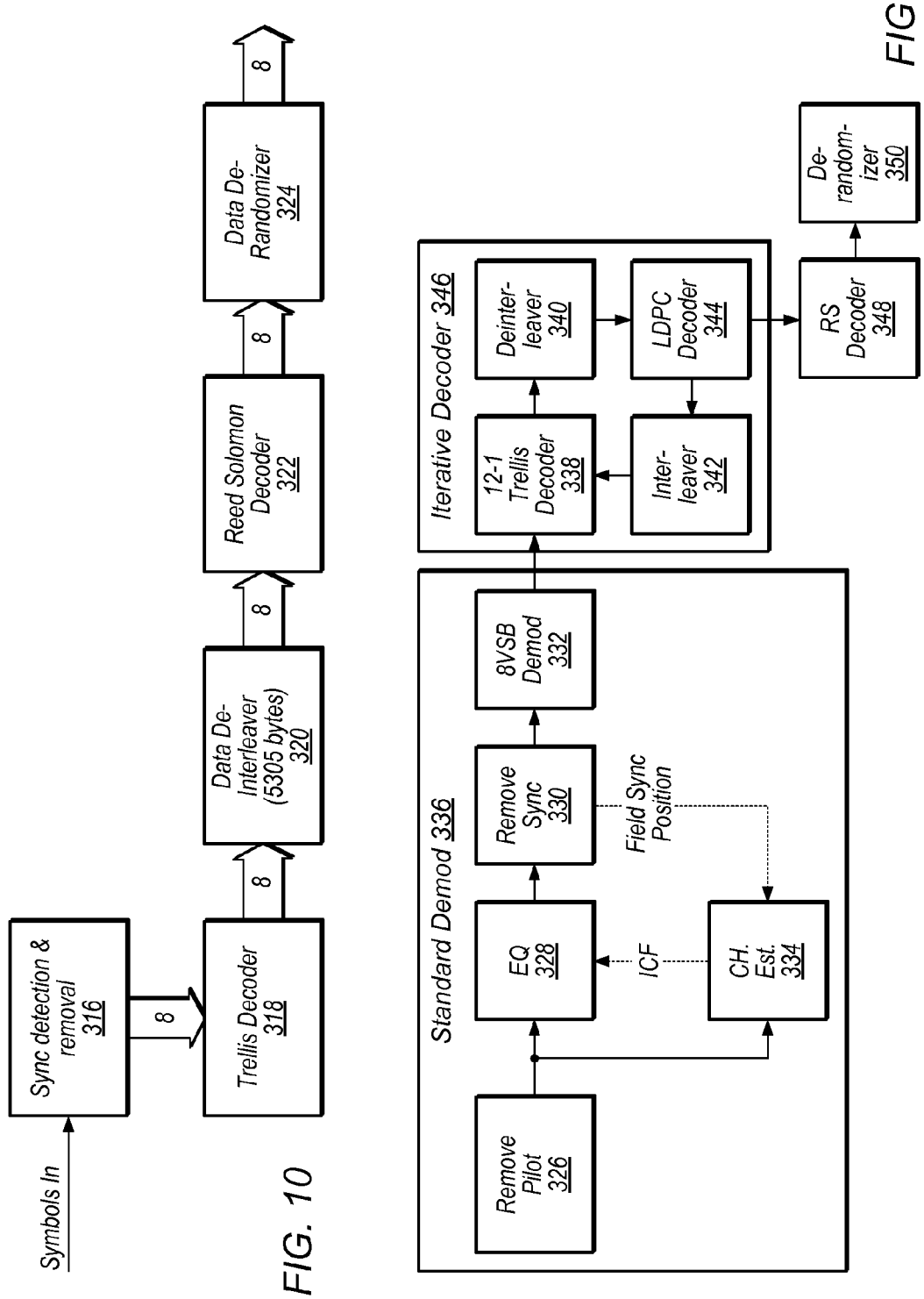
FIG. 10 illustrates a symbol decoder according to one embodiment of the invention.
FIG. 11 illustrates robust mobile/handheld iterative stream decoding according to one embodiment of the invention.

The receiver 302 (receive data processor) is configured to extract the encoded transport stream from the symbol stream recovered by the signal processor. Decoding is accomplished in 5 parts as shown in FIG. 10, these being: Sync Detection and Removal 316; Trellis Decoder 318; Data Deinterleaver 320; Reed Solomon Decoder 322; and Data De-Randomizer 324.

Transport Stream Decoding is carried out consistently with the stream encoding methods employed by the transmitter. Transport Stream Decoding is responsible for recovering stream data whether associated with MPEG-2 transport, Robust transport providing additional error protection for M/H, or VSIW each of which is multiplexed under XLC control at various transport levels. The robust stream is encoded using a regular-systematic LDPC code (column weight=3). The codeword size, k=4096 bits (512 bytes). Optimum decoding is carried out iteratively between the LDPC and 12-1 Trellis decoder interspersed appropriately by block interleave/de-interleave sections (N×M is determined by the coding rate as discussed previously). Acceptable performance can be achieved with I=5 iterations. Iterative decoding can be followed by an RS decoder if so desired. (See 10).

VSIW Over MPEG-2 TS Decoding

Decoding is based on the same pair of orthogonal Gold codes ($[C_0, C_1]$) used by the transmitter. Receiving the codeword $C_0$ indicates that a 0 was inserted at the transmitter; $C_1$ indicates that a 1 was inserted. Viewed from the receiver's perspective, the purpose of the code-spread modulation is twofold: (i) it provides additional error protection in the form of signal processing gain inherent to the length-16 codes; (ii) provides a means to distinguish VSIW from other stream data assisting with stream synchronization. Once the SYNC has been detected in the received data stream, decoding proceeds until the stream end as indicated by the length field with each codeword representing a single VSIW bit. The CRC is computed over the combined LEN|DATA to verify the integrity of the recovered data. VSIW Over Robust Stream Decoding proceeds similarly to that for VSIW Over MPEG-2 TS with the exception that LDPC decoding associated with the Robust Stream method is applied prior to assessing the code-spread stream content. Additionally, the synchronization step is omitted given that the stream location is known beforehand. The result of the robust decoding is demodulated using the length-16 codes. Finally, the CRC is calculated over the resulting LEN|DATA field to ensure the integrity of the recovered data.

Given limited resources, VSIW Over Field Sync omits the code-spread modulation and [SYNC]| LEN|DATA|CRC frame structure in its entirety. Instead, stream data is recovered directly from the 8-VSB receiver in the same manner as that used for the surrounding field sync symbols. Once the field sync position is established, the receiver can simply index to the reserved bit field to recover the stream data.

Figure 12:
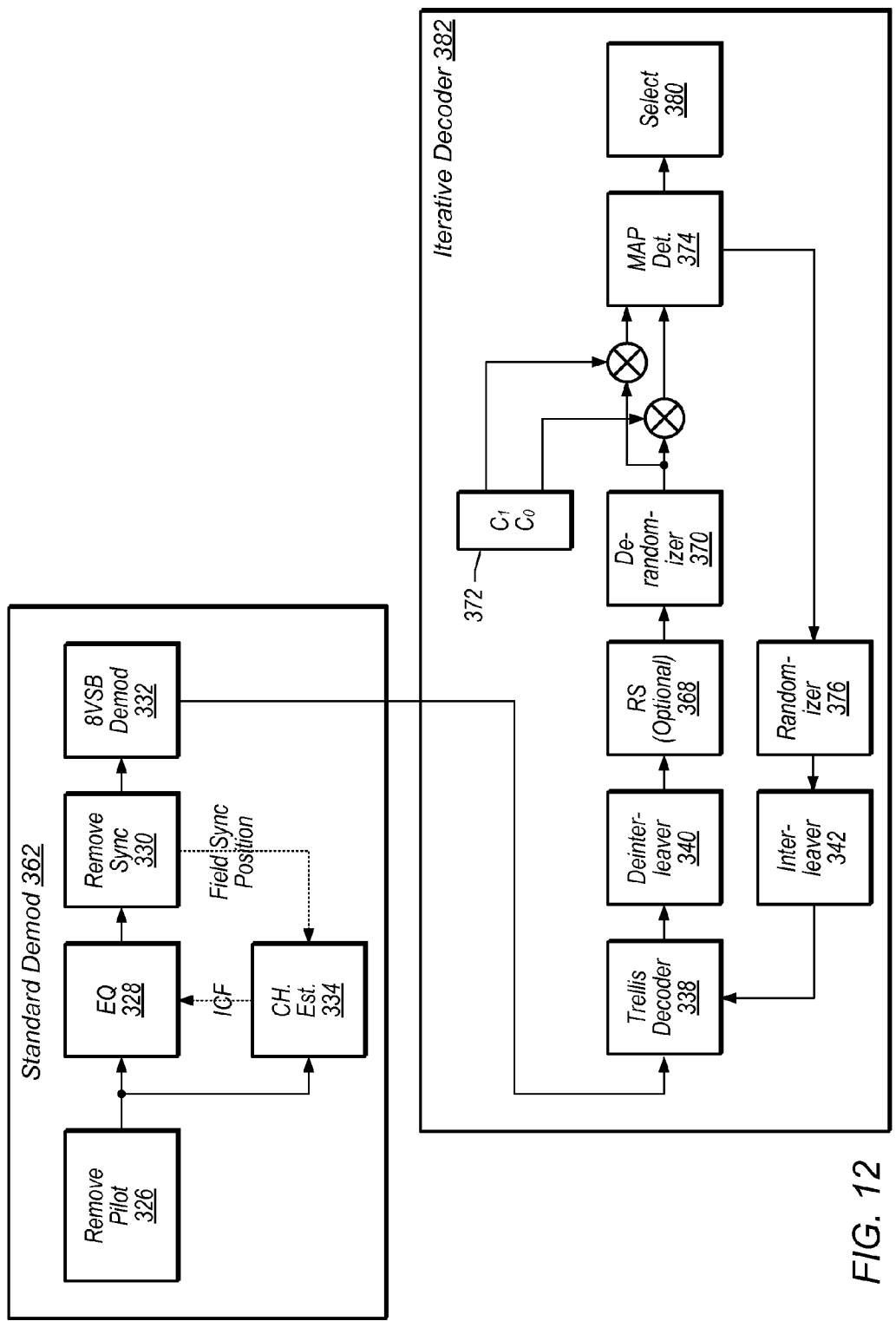
FIG. 12 illustrates VSIW iterative stream decoding according to one embodiment of the invention.

Given the manner in which VSIW instruction words are repeated by the transmitter, a soft feedback mechanism can be added to improve the reliability of detection as depicted in FIG. 12.

The final stage of ATSC 8-VSB decoding is to convert the MPEG-2 transport stream into audio and video data streams. More information on MPEG-2 can be obtained from the relevant ISO/IEC Standards for Video and Audio coding, respectively.

LDPC codes are linear block codes with sparse parity check matrices $H_{(N-K) \Box N}$, where each block of K information bits is encoded to a codeword of size N. As an example, an LDPC code of codeword size N=8 and rate 1/2 can be specified by a parity check matrix, and the same code can be equivalently represented by a bipartite graph which connects each check equation (check node) to its participating bits (bit nodes).

The purpose of the decoder is to determine the transmitted values of the bits. Bit nodes and check nodes communicate with each other to accomplish that. The decoding starts by assigning the received channel value of every bit to all the outgoing edges from the corresponding bit node to its adjacent check nodes. Upon receiving that, the check nodes make use of the parity check equations to update the bit node information and send it back. Each bit node then performs a soft majority vote among the information reaching from its adjacent check nodes. At this point, if the hard decisions on the bits satisfy all of the parity check equations, it means a valid codeword has been found and the process stops. Otherwise bit nodes go on sending the result of their soft majority votes to the check nodes.

FIG. 11

FIG. 11 shows an iterative (i.e. turbo) structure for decoding the additional LDPC FEC. The structure in FIG. 11 comprises a Standard Demodulator block 336 and an Iterative Decoder 346 block, as shown.

The Standard Demodulator block 336 comprises a Remove Pilot block 326, an EQ block 328 coupled to the output of the Remove Pilot block 326, a Remove Sync block 330 coupled to the output of the EQ block 328, and an 8VSB Demodulator block 332 coupled to an output of the Remove Sync block 330. The Remove Sync block 330 also provides a Field Sync Position output to a Channel Estimator block 334. The Remove Pilot block 326 also provides an output to the Channel Estimator block 334. The Channel Estimator block 334 provides an ICF output to the EQ block 328.

The Iterative decoder block 346 comprises a trellis decoder 338 which receives an output from 8VSB demodulator 332. Trellis decoder 338 provides an output to deinterleaver 340. Deinterleaver 340 provides an output to LDPC decoder 344. LDPC Decoder 344 provides an output to Interleaver 342. Interleaver 342 provides an output to the Trellis Decoder 338. LDPC Decoder 344 also provides an output to RS Decoder 348, which provides an output to De-randomizer 350.

Thus the Iterative Decoder block 346 is applied to the output of the standard 8VSB demodulation block 336. The iterative decoding 346 aims to improve receiver performance by maximizing the probability of a correct bit decision as observed by two concatenated decoders, these being the trellis decoder 338 and LDPC decoder 344, respectively, as depicted in FIG. 11. Each constituent decoder produces a set of soft-bit outputs comprising tentative bit decisions accompanied by the probabilities of the corresponding bits having been correctly decoded. The output of the trellis decoder 338 is de-interleaved 340 prior to passing soft-bit decisions to the LDPC decoder 344 which in turn produces soft-bit decisions and their bit probabilities. The set of revised bit decisions is then re-interleaved 342 and fed back to the trellis decoder 338 where the process begins again. The process is repeated for some number of iterations until satisfactory bit probabilities are reached across the set of decoded bits.

FIG. 12

FIG. 12 extends the turbo decoding principal to VSIW codeword detection. The constituent decoders in the case of VSIW detection comprise the soft-output trellis decoder 338 concatenated with the MAP detector 374 matched to the VSIW codewords $C_0$ and $C_1$, respectively 372. Soft-bits pass from the trellis decoder 338 to the MAP detector 374 through the de-interleaver 340, optional Reed-Solomon decoder 368 and de-randomizer 370. Soft-bit decisions from the MAP detector 374 are fed back through the randomizer 376 and interleaver 342 to the trellis decoder 338. The process is repeated for some number of iterations until satisfactory bit probabilities are reached across the set of decoded bits. Iterative decoding administered in the manner depicted in FIG. 12 is intended to improve the reliability of VSIW detection.

Receiver Multi-Processor Architecture

Figure 13:
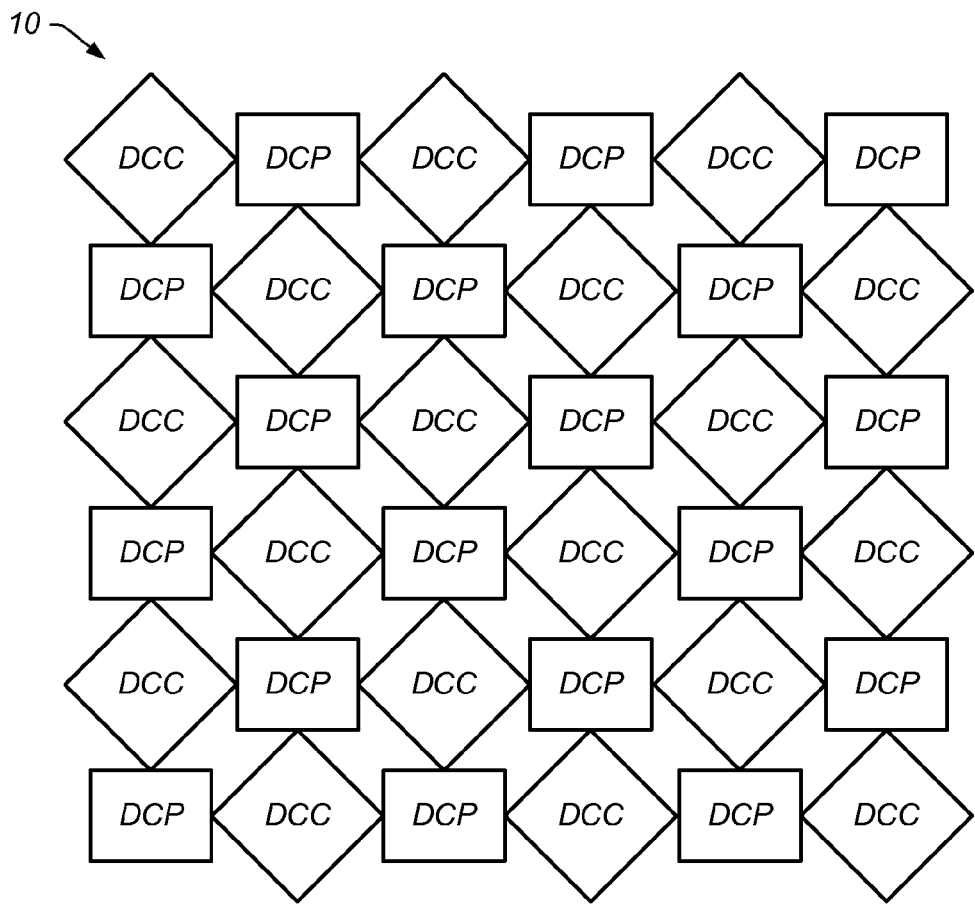
FIG. 13 illustrates an exemplary multi-processor architecture which implements at least a portion of the receiver of the mobile device according to one embodiment of the invention.
Figure 14:
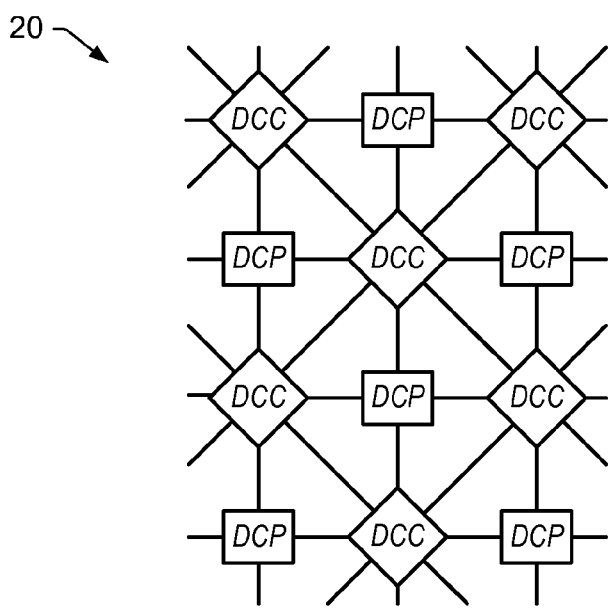
FIG. 14 is a more detailed illustration of a portion of the multi-processor architecture of FIG. 13.

FIG. 13 illustrates one embodiment of a multiprocessor system architecture that may be used to implement the receiver in a mobile device 112. FIG. 14 is a more detailed illustration of a portion of the multiprocessor system of FIG. 13.

The receiver may be implemented in any of various ways, such as one or more of: a single processor system, a multi-processor system, a programmable hardware element (also called an FPGA (field programmable gate array)), or an application specific integrated circuit (ASIC), or various combinations thereof.

In the exemplary embodiment of FIG. 13, the multi-processor system may comprise a parallel computational platform comprising multiple processors, memories (unified and/or distributed), and communication (or communication network) resources. An exemplary multi-processor system comprises a plurality of processors, wherein each of the processors is coupled to at least one other processor, and wherein there are multiple communication mechanisms between the respective processors. The multi-processor system may comprise a plurality of memories coupled to the processors. For example, the memories may be interspersed among the processors. More specifically, the multi-processor system may comprise a plurality of communication units interspersed among the processors, wherein each of the communication units comprises a memory and routing logic. As used herein, the term "coupled" means directly or indirectly connected.

An exemplary multi-processor system is the multicore HyperX architecture disclosed in U.S. Pat. No. 7,415,594 titled "Processing System With Interspersed Processors And Communication Elements" filed on Jun. 24, 2003, Patent Publication No. US 20040030859 (patent application Ser. No. 10/602,292), whose inventors are Michael B. Doerr, William H. Hallidy, David A. Gibson and Craig M. Chase, and which is hereby incorporated by reference in its entirety as though fully and completely set forth herein.

In summary, the central core building block of the HyperX architecture is a scalable unit-cell-based hardware fabric, a HyperSlice. The entire hardware architecture is formed by replicating this core unit-cell to create a multi-core parallel processing system. Each HyperSlice contains a DMR (Data Memory and Router) and Processing Element (PE).

The DMR provides data memory, control logic, registers, and routers for fast routing services to the processing resources. The hardware fabric is created by joining Hyper-Slices together, forming the on-chip network. This on-chip network operates independently and transparently to the processing resources. It provides on-demand bandwidth through a real-time programmable and adaptable communication fabric between HyperSlices supporting arbitrary network topologies of functions or system implementations. Coordinated groups of HyperSlices may be formed and reformed "on-the-fly" under software control. This ability to dynamically alter the amount of hardware used to evaluate a function allows for the optimal application of hardware resources to relieve processing bottlenecks.

The DMR provides nearest neighbor, regional, and global communication across the chip and from chip to chip. The DMR does this through four different transfer modes; memory to memory, memory to register, register to memory, and register to register. Each of the transfer modes may physically use the DMR resources to send data/messages differently depending on locality of data and software algorithm requirements. A "Quick Port" facility is provided to transfer a word of data from a processor to anywhere rapidly. For block transfers, Direct Memory Access (DMA) engines within the DMR are available to manage the movement of data across the memory and routing fabric. For nearest neighbor communication, the use of shared memory and registers is the most efficient method of data movement. For regional and global data movement, using the routing fabric is the most efficient method. Communication channels can either be dynamic or static. Dynamic routes are set up for data transfer and torn down upon the completion of the transfer to free up routing resources for other data transfers. Static routes remain in place throughout the program execution and are primarily used for high priority and critical communications. All data transfers and the choice of communication channel are under software program control. Multiple communication channels exist to support simultaneous data transfer between any senders and receivers.

The architecture of the DMR allows different interchangeable PEs to be used in a multi-processor fabric to optimize the system for specific applications. A HyperX multi-processor system may comprise either a heterogeneous or homogeneous array of PEs. A PE may be a conventional processor, or alternatively a PE may not conform to the conventional definition of a processor. A PE may simply be a collection of logic gates serving as a hard-wired processor for certain logic functions where programmability is traded off for higher performance, smaller area, and/or lower power.

XLC System/Packet Protocols

The cross-layer control (XLC) system is intended to provide a manageable, flexible, and extensible framework that expands the current ATSC system layers to enable M/H services. The following describes one embodiment of an XLC system and related packet protocols. It is noted that any of various implementations may be used.

The current ATSC system layers are currently defined (in A/53 Part 1) as:

Presentation Layer—Video and Audio encodings—A/53 Part 4, 5, and 6

Transport (and Services) Layer—A/53 Part 3

Physical layer—A/53 Part 2

Figure 15:
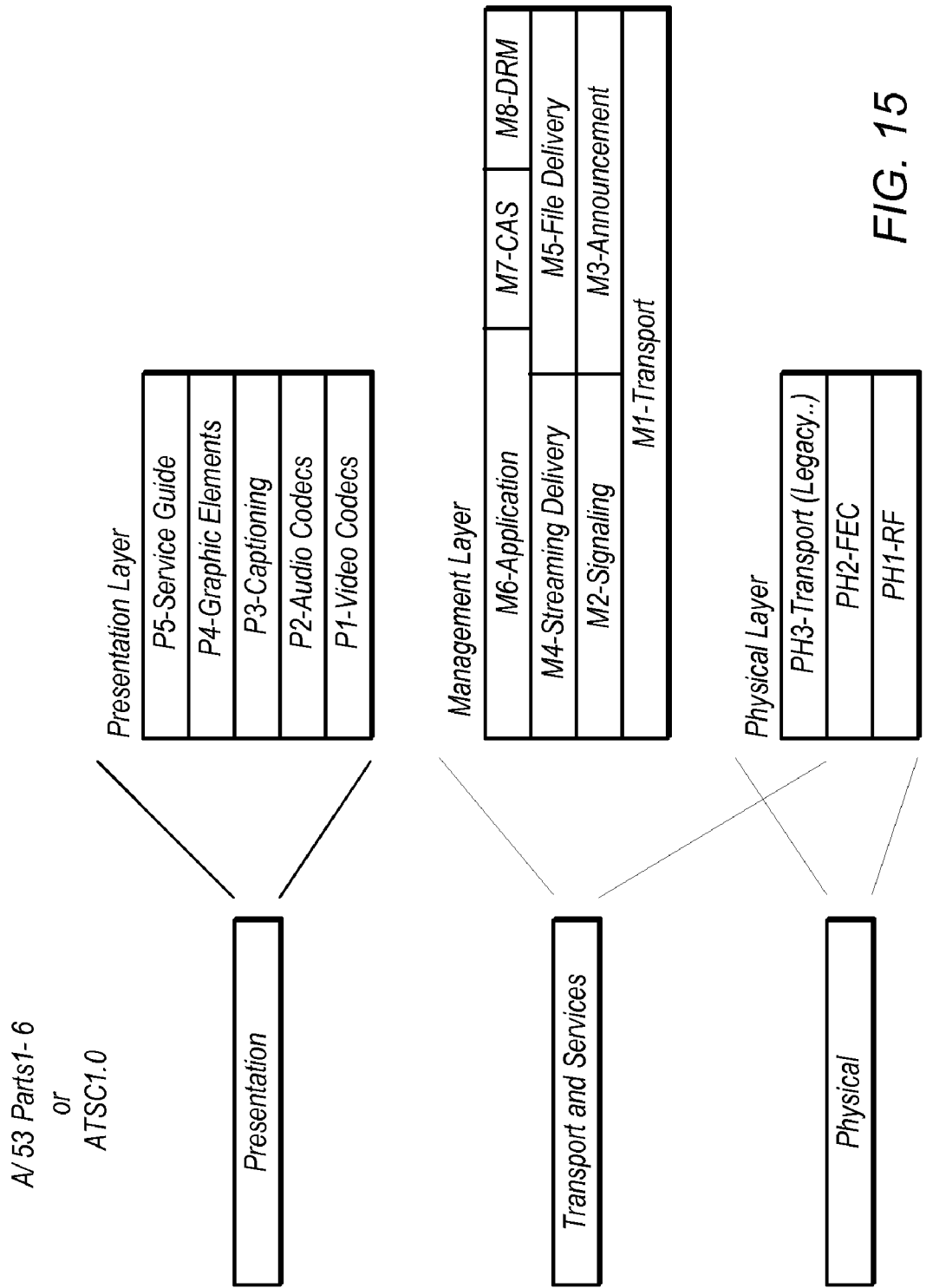
FIG. 15 describes a layered protocol structure according to one embodiment.

To support M/H services one approach is to linearly expand this system layer model as shown in FIG. 15. Thus, in one embodiment a linear structure (as opposed to a tree structure) is used to facilitate transmission of the control information as illustrated below:

| Syntax | # of bits |
|---|---|
| List Header ( ){ | |
| Parameter 1 | $k_1$ |
| Parameter 2 | $k_2$ |
| Parameter 3 | $k_3$ |

| Syntax | # of bits |
|---|---|
| . | |
| . | |
| . | |
| Parameter N | $k_N$ |
| } | |

The parameter list comprises a mixture of real numbers and enumerated types knowledge of which is accessible to the transmitter and receiver to support the enumerations.

In a currently preferred embodiment, a tree structure is used, as described herein. Due to the recent proliferation of wireless technologies and services, any single encoding technique, comprising forward error correction and digital video or audio encoding, does not work best in all situations, no matter the layer applied. Therefore, to plan a transmission system dependent on any one technique is problematic from the outset. Various embodiments of the present invention provide a cross layer and extendable network interconnection methodology.

As the Program and System Information Protocol (PSIP) is touted as "the glue that holds the digital television signal together . . . [and is] . . . a requirement in terms of actual real-world operation," the XLC system enables the seamless extension of the current ATSC DTV service to support mobile and handheld services and improve performance of the current DTV service all while preserving complete backward compatibility of the current ATSC standard.

The XLC system provides for management of an adaptable and extensible [for future proofing] protocol that enables dynamic flexibility in services required to meet Broadcasters' technical and business needs. FIG. 16 illustrates an example of the XLC functional elements and the manner in which they may control the various communication layers. As shown in FIG. 16, the XLC methodology allows visibility into and control of the plurality of different communication layers. The functional elements within the XLC block provide for control according to the tree structure described herein. The blocks outside of the XLC correspond to branches of the tree structure, and the functional elements comprised within the XLC block provide for control of these blocks.

As shown in FIG. 16, the transmit/receive systems each include a plurality of communication layers. Each of these communication layers has associated parameters whose values can be changed to affect the operation of the respective communication layers. These parameters are arranged in a tree structure. The XLC block includes various functional elements that are responsible for modifying the parameter values in or according to this tree structure.

Table 1 below illustrates a hierarchical view of the XLC protocol fields and associated parameters.

TABLE 1

XLC Protocol - A Hierarchical View
Table 2: XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| Physical | | | | | | | Enable/Disable |
| | PH1 | | | | | | Dep. on PHY |
| | RF | Training Sequence | | | | | Type |
| | | | | | | | TBD |
| | | Continuous or Burst Mode | | | | | Flag |
| | | Other | | | | | TBD |
| | PH2 | Type | | | | | Dep. on PHY |

TABLE 1-continued

XLC Protocol - A Hierarchical View
Table 2: XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| | | FEC | | | | | Type |
| | | | | | | | TBD |
| | | | Rate | | | | Dep. on PHY Type |
| | | | | | | | TBD |
| | | | Interleaver Length | | | | Dep. on PHY Type |
| | | | | | | | TBD |
| | | | Other | | | | TBD |
| | | PH3 MPEG2-TS | Multiplexer Base | | | | Length |
| | | | Stream Multiplex Rate | | | | Stream ID rate |
| | | | Stream Multiplex Rate Incremental Update | | | | Stream ID value |
| | | | Other | | | | TBD |
| | | Number of Streams | | | | | At least 1 |
| | | PHY Type | ATSC 1.0 | | | | Default |
| | | | A-VSB | | | | Default |
| | | | MPH | | | | Default |
| | | | Micro/Thom | | | | Default |
| | | | Other | | | | TBD |
| | | PHY States | Current Multiplexer State | | | | State |
| | | | Current Stream Interleaver State | | | | Stream ID State |
| | | | Current Location in Streams transport packet (Bytes) | | | | Stream ID State |
| | | | XLC Packet Offset | | | | Stream ID Offset |
| | | | Other | | | | TBD |
| | Other | | | | | | TBD |
| Management | | | | | | | Enable/Disable |
| | M1 Transport | | | | | | Enable/Disable |
| | | MPEG-2 TS | | | | | Enable/Disable |
| | | IP | | | | | Enable/Disable |
| | | UDP | | | | | Enable/Disable |
| | | Other | | | | | Enable/Disable |
| | M2 Signaling | | | | | | Enable/Disable |
| | | XML | | | | | Enable/Disable |
| | | SIP | | | | | Enable/Disable |
| | | SAP | | | | | Enable/Disable |
| | | SDP | | | | | Enable/Disable |
| | M3 Announcement | | | | | | Enable/Disable |
| | | ESG | | | | | Enable/Disable |
| | | EPG | | | | | Enable/Disable |
| | | Other | | | | | TBD |
| | M4 Streaming Delivery | | | | | | Enable/Disable |
| | | MPEG-2 | | | | | Enable/Disable |
| | | MPEG-4 Streaming | | | | | |
| | | TESLA-SRTP | | | | | Enable/Disable |
| | | SRTP | | | | | Enable/Disable |
| | | | Authenticate | | | | Enable/Disable |
| | | | | HMAC-SHAI | | | Enable/Disable |
| | | | | Other | | | TBD |
| | | | Encryption | | | | Enable/Disable |
| | | | | Cipher | | | Enable/Disable |
| | | | | | AES | | Enable/Disable |
| | | | | | | Counter Mode | Enable/Disable |
| | | | | | | Output Feedback | Enable/Disable |
| | | | | | | F8 Mode | Enable/Disable |
| | | | | | | Other | TBD |
| | | | | Other | | | TBD |
| | | | Key Derivation | | | | Enable/Disable |
| | | | | Encry | | | Enable/Disable |
| | | | | Keys | ZRTP | | Enable/Disable |
| | | | | | Mikey | | Enable/Disable |
| | | | | | Other | | TBD |
| | | | | Auth | | | Enable/Disable |

TABLE 1-continued

XLC Protocol - A Hierarchical View
Table 2: XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---|---|---|---|---|---|---|---|
| | | | | | Keys | ZRTP | Enable/Disable |
| | | | | | | Mikey | Enable/Disable |
| | | | | | | Other | TBD |
| | | | | | Other | | TBD |
| | | | | Key Exchange | | | Enable/Disable |
| | | | | | SDES | | Enable/Disable |
| | | | | | Other | | TBD |
| | | | | Other | | | TBD |
| | | | Other | | | | TBD |
| | | Other | | | | | TBD |
| | M5 File Delivery | | | | | | Enable/Disable |
| | | FLUTE | | | | | Enable/Disable |
| | | | ALC | | | | Enable/Disable |
| | | | LCT | | | | Enable/Disable |
| | | | CC | | | | Enable/Disable |
| | | | FEC | | | | Enable/Disable |
| | | | Carousels | | | | Enable/Disable |
| | | | Other | | | | TBD |
| | | Other | | | | | TBD |
| | M6 Application | specifics defined under parts of M2, M3, M4, M7, & M8 as shown in the system layer diagram | | | | | Enable/Disable |
| | M7 | | | | | | Enable/Disable |
| | CAS | CA Scrambler | | | | | Enable/Disable |
| | | SAS | | | | | Enable/Disable |
| | | SMS, MMS | | | | | Enable/Disable |
| | | PPV | | | | | Enable/Disable |
| | | Other | | | | | TBD |
| | M8 | | | | | | Enable/Disable |
| | DRM | Scrambling | | | | | Enable/Disable |
| | | | CSS | | | | Enable/Disable |
| | | | Other | | | | TBD |
| | | Encryption | | | | | Enable/Disable |
| | | | Cipher | | | | Enable/Disable |
| | | | Key Derivation | | | | Enable/Disable |
| | | | Key Exchange | | | | Enable/Disable |
| | | | Other | | | | TBD |
| | | Content Protection | | | | | Enable/Disable |
| | | | PVP | | | | Enable/Disable |
| | | | AACS | | | | Enable/Disable |
| | | | Other | | | | TBD |
| | | Copy Control Method | | | | | Enable/Disable |
| | | | Copy Control | | | | Enable/Disable |
| | | | CDS | | | | Enable/Disable |
| | | | Watermarks | | | | Enable/Disable |
| | | | | Method 1 | | | Enable/Disable |
| | | | | Method 2 | | | Enable/Disable |
| | | | | Other | | | TBD |
| | | | Forward Lock | | | | Enable/Disable |
| | | | Separate Delivery | | | | Enable/Disable |
| | | | Other | | | | TBD |
| | | File Format | | | | | Enable/Disable |
| | | | Base64 | | | | Enable/Disable |
| | | | Binary | | | | Enable/Disable |
| | | | Other | | | | TBD |
| | | Other | | | | | TBD |
| | Other | | | | | | TBD |
| Presentation | | | | | | | Enable/Disable |
| | P1 Video Codecs | | | | | | Enable/Disable |
| | | MPEG-2 | | | | | Enable/Disable |
| | | MPEG-4 | | | | | Enable/Disable |
| | | Other | | | | | TBD |
| | P2 Audio Codecs | | | | | | Enable/Disable |
| | | AC-3 | | | | | Enable/Disable |
| | | Other | | | | | TBD |
| | P3 Captioning | | | | | | Enable/Disable |
| | P4 Graphic Elements | | | | | | Enable/Disable |
| | P5 Service Guide | | | | | | Enable/Disable |
| | Other | | | | | | TBD |
| Packet Control | | | | | | | Enable/Disable |
| | Checksum | | | | | | Enable/Disable |
| | | CRC-8 | | | | | $x^8 + x^2 + x^1 + 1$ |
| | | CRC-16 CCITT | | | | | $x^{16} + x^{12} + x^5 + 1$ |
| | | Check Type | | | | | TBD |

TABLE 1-continued

XLC Protocol - A Hierarchical View
Table 2: XLC Protocol - A Hierarchical View

Hierarchical View of Cross Layer Control (XLC) Field Dependencies

| Level-1 | Level-2 | Level-3 | Level-4 | Level-5 | Level-6 | Level-7 | Parameters |
|---------|---------|---------|---------|---------|---------|---------|------------|
|         |         | Other   |         |         |         |         | TBD        |
|         | Other   |         |         |         |         |         | TBD        |
| Other   |         |         |         |         |         |         | TBD        |

Table 2 below illustrates XLC protocol fields and associated parameters.

i. The XLC Protocol Field Definitions

TABLE 2

XLC System Sub-Packet Definition

| ID  | Field Name     | Description                |
|-----|----------------|----------------------------|
| 0.0 | Disable        | Disables System            |
| 0.1 | Physical       | Controls Physical layer    |
| 0.2 | Management     | Controls Management layer  |
| 0.3 | Presentation   | Controls Presentation layer|
| 0.4 | Packet Control | Controls the Packet Control|
| 0.5 | Other          | TBD                        |

Table 3 below illustrates physical definitions of XLC sub-packet IDs.

XLC Physical Sub-Packet ID

TABLE 3

XLC Sub-Packet - Physical Definition

| ID    | Field Name        | Description                                   |
|-------|-------------------|-----------------------------------------------|
| 0.1.0 | Disable           | Disables Physical                             |
| 0.1.1 | RF                | Controls the RF layer                         |
| 0.1.2 | FEC               | Controls the FEC parameters for a stream      |
| 0.1.3 | MPEG-2 TS (legacy)| Controls the transport streams                |
| 0.1.4 | Number of Streams | The number of streams being transmitted by the PHY |
| 0.1.5 | PHY Type          | The default setting for the type of PHY       |
| 0.1.6 | PHY State         | Returns the current state of the PHY          |
| 0.1.7 | Other             | TBD                                           |

The RF sub-packet tells the receiver how the RF layer is
1. modified where $p_c$ denotes an integer bit count used in defining a field range,
2. e.g. [0 to $2^{p_c}-1$]. Fields defined here effect the operation of all streams.

Table 4 below illustrates a view of the physical PH1-RF XLC Sub-Packet IDs.

TABLE 4

XLC Sub-Packet ID - Physical - PH1-RF

| # | Field Name | # of bits | Description        |
|---|------------|-----------|--------------------|
| 1 | RFSSPID    | 2         | RF Sub-Sub-packet ID |
| 2 | RFP        | $p_c$ 2   | RF Payload         |

Table 5 below illustrates field definitions of RFSSPID XLC Sub-Packet IDs and RFSSPID field definitions.

TABLE 5

XLC Sub-Packet ID - Physical - PH1-RF - RFSSPID Field Definition

| ID      | RFSSPID | Field Name              | # of bits | Description                |
|---------|---------|-------------------------|-----------|----------------------------|
| 0.1.1.0 | 00      | Training Sequence       | $p_c$ - 2 | Defines Training Sequence  |
| 0.1.1.1 | 01      | Continuous or Burst Mode| $p_c$ - 2 | Defines Mode of Operation  |
| 0.1.1.2 | 10      | Other                   | $p_c$ - 2 | TBD                        |

Table 6 below illustrates definitions of training sequence payloads.

TABLE 6

XLC Sub-Packet ID - Physical - PH1-RF - Training Sequence Payload Definition

| ID      | RFSSPID | Field Name        | # of Bits            | Description |
|---------|---------|-------------------|----------------------|-------------|
| 0.1.1.0 | 00      | StreamID Length   | $p_{NS}$ $p_c$ - 2 - $p_{NS}$ | Stream ID Number Length of the training Sequence in bytes per segment. It is assumed that the training sequence is placed after the PID header. For stream ID greater than 0 it is assumed that only those segments mapped to that stream will contain training bytes For stream ID of 0 all packets are assumed to have a training sequence. This also must assume that 2 byte adaptation field header field is turned on to encapsulate the data. |

Table 7 below illustrates Continuous or Burst Mode XLC Sub-Packet IDs.

TABLE 7

XLC Sub-Packet ID - Physical - PH1-RF - Continuous or Burst Mode

| Value | Encoding Rate | Description                                 |
|-------|---------------|---------------------------------------------|
| 0     | Continuous    | Continuous Output Multiplexing Mode of Operation |
| 1     | Burst         | Burst Output Multiplexing Mode of Operation |

XLC Sub-Packet ID Physical—PH2-FEC

The Robust Stream sub-packet describes the encoding method of a stream. This sub-packet has a Stream ID field and a Stream [System] Encoding Type field. If an encoding method is unknown to a receiver the stream will not be decoded.

Table 8 below illustrates XLC Sub-Packet IDs in PH2-FEC 1. Format.

TABLE 8

XLC Sub-Packet ID - Physical - PH2-FEC Format

| # | Field Name | # of bits | Description |
|---|---|---|---|
| 1 | FECSSPID | 2 | FEC Format Sub-Sub-packet ID |
| 2 | FECSEP | Dependent on parameters defined in Table 9 below illustrates FECSPID field definitions and XLC Sub-Packet IDs. | FEC Payload |

Table 9 below illustrates FECSPID field definitions and XLC Sub-Packet IDs.

TABLE 9

XLC Sub-Packet ID - Physical - PH2-FEC - FECSPID Field Definition

| ID | Sub-Sub Packet ID | Field Name | Sub-Field Name | # of bits | Description |
|---|---|---|---|---|---|
| 0.1.2.0 | 00 | Type | StreamID Value | $p_{NS}$<br>$p_c - 2 - p_{NS}$ | Stream ID Number Streams FEC Encoding Type. This also defines the default values for Rate and interleaver length. |
| 0.1.2.1 | 01 | Rate | StreamID<br>StreamID Value | $p_{NS}$<br>$p_{NS}$<br>$p_c - 2 - p_{NS}$ | Stream ID Number<br>Stream ID Number<br>Streams FEC Encoding Rate |
| 0.1.2.2 | 10 | Interleaver Length | StreamID Value | $p_{NS}$<br>$p_c - 2 - p_{NS}$ | Stream ID Number<br>Streams FEC Encoding Interleaver Length |
| 0.1.2.3 | 11 | Augmented Stream | Value | $p_c - 2$ | Main Stream Augmented with Additional Error Correction |

Table 10 below illustrates the types of PH2-FEC XLC Sub-Packet IDs.

TABLE 10

XLC Sub-Packet ID - Physical - PH2-FEC - Type

| Value | Encoding Type | Description |
|---|---|---|
| 0 | None | The Data is not encoded with robust FEC |
| 1 | LDPC | Packet based Low Density Parity Codes Coding method. Defaults: Rate = ½, Interleaver Length 0.5 sec |
| No-limit | Other | TBD |

Table 11 below illustrates the rates of PH2-FEC XLC Sub-Packet IDs.

TABLE 11

XLC Sub-Packet ID - Physical - PH2-FEC - Rate

| Value | Encoding Rate | Description |
|---|---|---|
| 0 | Full | The Data is not encoded with robust FEC |
| 1 | ½ | Half rate encoding method for selected method |
| 2 | ¼ | Quarter rate encoding method for selected method |
| 3 | ⅛ | Eighth rate encoding method for selected method |
| No-limit | Other | TBD |

Table 12 below illustrates the interleaver lengths of PH2-FEC XLC Sub-Packet IDs.

TABLE 12

XLC Sub-Packet ID - Physical - PH2-FEC - Interleaver Length

| Value | Duration | Description |
|---|---|---|
| 0 | None | No Extra Interleaving is done |
| 1 | 0.5 sec | Interleaving is increased to 0.5 seconds |
| 2 | 1.0 sec | Interleaving is increased to 1.0 seconds |
| No-limit | Other | TBD |

XLC Sub-Packet ID—Physical—PH2-FEC—Augmented Stream

The Augmented Stream sub-packet describes the encoding method of the augmented stream. An augmented stream contains the block forward error correction for a non-robust stream (e.g. the main stream). The sub-packet has a Stream ID field and a Stream [System] Encoding Type field. If an encoding method is unknown to a receiver the stream will not be decoded.

Table 13 below illustrates the formats of augmented stream XLC Sub-Packet IDs.

TABLE 13

XLC Sub-Packet ID - Physical - PH2-FEC - Augmented Stream - Format

| # | Field Name | # of bits | Description |
|---|---|---|---|
| 1 | AUGSSPID | 2 | Augmented Format Sub-Sub-packet ID |
| 2 | AUGSEP | Dependent on parameters defined in Table 9 below illustrates FECSPID field definitions and XLC Sub-Packet IDs. | Augmented Stream Payload |

Table 14 below illustrates the AUGSSPID field definitions of augmented stream XLC Sub-Packet IDs.

TABLE 14

XLC Sub-Packet ID - Physical - PH2-FEC - Augmented Stream -
AUGSSPID Field Definition

| ID | Sub-Sub Packet ID | Field Name | Sub-Field Name | # of bits | Description |
|---|---|---|---|---|---|
| 0.1.2.3.0 | 00 | Type | StreamID | $p_{NS}$ | Stream ID Number |
| | | | StreamID | $p_{NS}$ | Stream ID Number |
| | | | Value | $p_c - 2 - p_{NS}$ | Streams FEC Augmented Encoding Type. This also defines the default values for Rate and interleaver length. |
| 0.1.2.3.1 | 01 | Rate | StreamID | $p_{NS}$ | Stream ID Number |
| | | | Value | $p_c - 2 - p_{NS}$ | Streams Augmented FEC Encoding Rate |
| 0.1.2.3.2 | 10 | Interleaver Length | StreamID | $p_{NS}$ | Stream ID Number |
| | | | Value | $p_c - 2 - p_{NS}$ | Streams Augmented FEC Encoding Interleaver Length |
| 0.1.2.3.2 | 11 | Other | TBD | TBD | TBD |

Table 15 below illustrates the types of augmented stream XLC Sub-Packet IDs.

TABLE 15

XLC Sub-Packet ID - Physical - PH2-FEC -
Augmented Stream - Type

| Value | Encoding Type | Description |
|---|---|---|
| 0 | LDPC | Packet based Low Density Parity Codes Coding method. Defaults: Rate = ½, Interleaver Length 0 sec |
| No-limit | Other | TBD |

Table 16 below illustrates the rates of augmented stream XLC Sub-Packet IDs.

TABLE 16

XLC Sub-Packet ID - Physical - PH2-FEC - Augmented
Stream - Rate

| Value | Encoding Rate | Description |
|---|---|---|
| 0 | ¾ | Three quarter rate encoding method for selected method |
| 1 | ⅔ | Two thirds rate encoding method for selected method |
| 2 | ½ | Half rate encoding method for selected method |
| 3 | ⅓ | One third rate encoding method for selected method |
| 4 | ¼ | Quarter rate encoding method for selected method |
| No-limit | Other | TBD |

Table 17 below illustrates the interleaver lengths of augmented stream XLC Sub-Packet IDs.

TABLE 17

XLC Sub-Packet ID - Physical - PH2-FEC - Augmented
Stream - Interleaver Length

| Value | Duration | Description |
|---|---|---|
| 0 | None | No Extra Interleaving is done |
| No-limit | Other | TBD |

The Main stream data is encoded in blocks the size of which is determined according to the encoding method. The stream does not need to encode main transport stream data on any particular boundary. However, an augmented encoding method block size must not exceed the multiplexer base and the check block size must be able to be sent over the stream in the streams data bandwidth. Thus, The following equation:

$$S_{bit} = nb + r,$$

where $S_{bits}$ is the augmented stream size in bits, n is the number of full check blocks in a stream, b is the number of bits in a check block, and r is the number of remainder bits.

An Augmented stream is preferably zero padded with r bits that will be ignored by the receiver in order to maintain the correct stream rate. It should be noted that a number of LDPC methods will be required for various rates. An encoder should select the highest encoder rate that can be sustained in the available bandwidth otherwise the augmented stream cannot keep up with the main stream.

Figure 17:
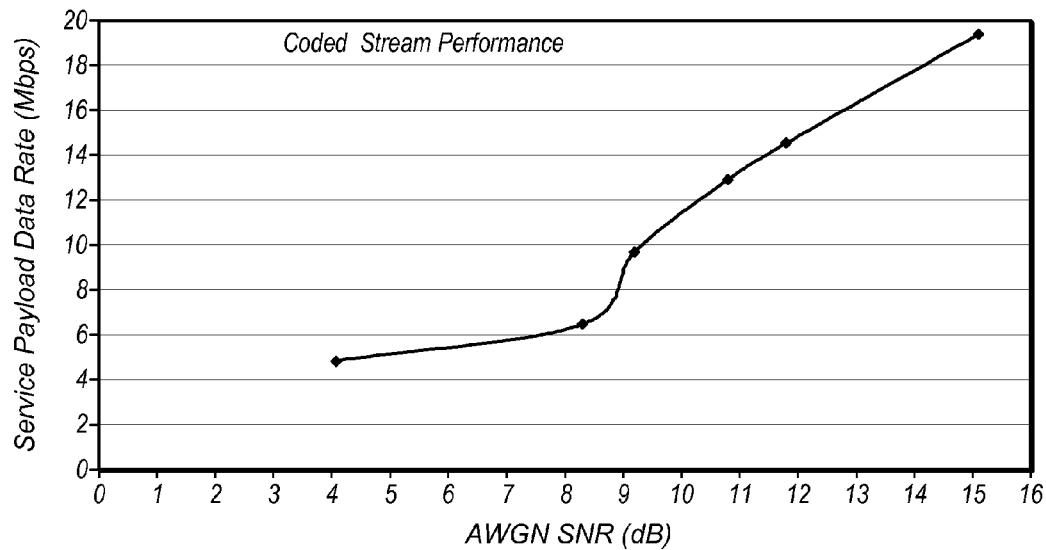
FIG. 17 illustrates coded stream performance using robust encoding, e.g. LDPC.

FIG. 17 shows an LDPC with a small 1152 bit block encoding size simulated over an AWGN channel. A pronounced benefit to the main stream can be seen by using an augmented stream over just small block size. Adjusting block size to longer lengths will increase performance.

Table 18 below illustrates a view of AWGN augmented stream performance results using LDPC block encoding.

TABLE 18

AWGN Augmented Stream Performance Results using LDPC
Block encoding

| Payload Data % | Payload Data Rate (MBPS) | SNR (dB) |
|---|---|---|
| 25% | 4.85 | 4.1 |
| 33% | 6.46 | 8.3 |
| 50% | 9.69 | 9.2 |
| 67% | 12.92 | 10.8 |
| 75% | 14.54 | 11.8 |
| 100% | 19.38 | 15.1 |

XLC Sub-Packet ID—PH3-MPEG2 TS (Legacy)

The legacy transport field describes how robust streams should be multiplexed in the 8-VSB MPEG-2 TS stream. This field contains all the values necessary for setting up a burst rate or the internal statistical multiplexer.

Table 19 below illustrates descriptions of PH3-MPEG2 TS XLC Sub-Packet IDs.

TABLE 19

XLC Sub-Packet ID - Physical - PH3-MPEG2 TS

| # | Field Name | # of bits | Description |
|---|---|---|---|
| 1 | LTSSPID | 2 | MPEG2 TS Legacy Transport Sub-Sub-packet ID |
| 2 | LTP | Dependent on the fields defined by LTSSPID in Table 20 illustrates the LTP field definitions of PH3-MPEG2 TS XLC Sub-Packet IDs. | MPEG2 TS Legacy Transport Payload |

Table 20 illustrates the LTP field definitions of PH3-MPEG2 TS XLC Sub-Packet IDs.

TABLE 20

XLC Sub-Packet ID - Physical - PH3-MPEG2 TS - LTP Field Definition

| ID | LTSSPID | Field Name | Sub-Field Name | # of bits | Description |
|---|---|---|---|---|---|
| 0.1.3.0 | 00 | MB | Value | $p_c$ - 2 | Output Multiplexer Base defined by user (in packets), $p_{NS}$ |
| 0.1.3.1 | 01 | SR | StreamID Value | $p_{NS}$<br>$p_c$ - 2 - $p_{NS}$ | Stream ID Number<br>Stream Rate over the Multiplexer base (in packets) |
| 0.1.3.2 | 10 | Inc/Dec | StreamID Value | $p_{NS}$<br>$p_c$ - 2 - $p_{NS}$ | Stream ID Number<br>Incremental value of stream Mux rate, 2's complement to accommodate negative values. |
| 0.1.3.3 | 11 | Other | TBD | TBD | TBD |

The combination of all the multiplexer rates of each stream enables the receiver to figure out where the particular packet stream should be. The methodology of how the Multiplexer determines data segment placement is discussed in the following sub-sections.

Figure 18:
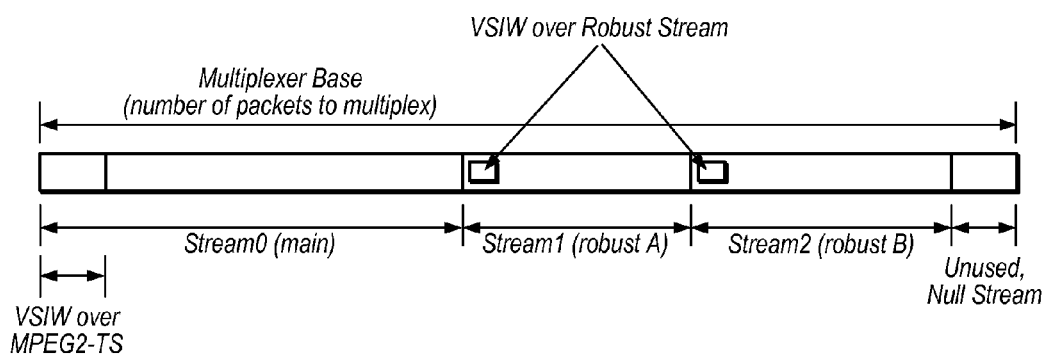
FIG. 18 illustrates the manner in which streams at various rates are multiplexed.

FIG. 18 illustrates the manner in which streams at various rates are multiplexed. Referencing a common multiplexer base derived from the greatest common divisor among the relative stream rates, streams are multiplexed in proportion to fill the available MPEG-2 TS bandwidth. Any unused bandwidth is filled by null packets as depicted in FIG. 18.

Continuous Multiplexing Output of Normal and Robust Data

The method for multiplexing normal and robust data at a rate that is adaptable in real-time is transmitted to the receiver through the VSIW. In order to easily multiplex robust and normal data, it is best to multiplex at the packet level. This would mean that a 187-byte 8-VSB data segment contains either robust or normal data but not a mixing of the two.

The MUX rate developed can be n/m where n is any integer between 0 and m. This allows the robust stream to be added at any packet rate within the transport stream. At the receive end, this allows the transport stream to tell the decoder whether or not a packet is robust. This multiplexer rate drives a sequence generator that will appropriately distribute the packets.

Internal Sequence Generator

Given a multiplexer ratio for each of the streams, a sequence generator can construct a multiplexing and de-multiplexing sequence between the [normal and robust] streams. As an example, we select the first stream A such that its length a, a multiple of 128, is less than the second stream B of length b, a multiple of 496. These multipliers may be taken to be some measure of data rate for each stream. A basic sequence generator for merging two streams by data segments is constructed as follows.

First, remove the greatest common divisor (GCD) of the two stream rates, giving the smallest repetition periods for each data stream that will fit as evenly as possible over the entire stream.

Given the equation:

$$GCD\left(\frac{a}{b}\right) = \frac{a'}{b'}$$

$$GCD\left(\frac{128}{496}\right) = \frac{8}{31}$$

We seek to distribute a' elements from stream A and b' elements from stream B over a total of a'+b' elements of the multiplexed stream in such a way that the elements from each stream are distributed as evenly as possible and retrievable in a systematic way. To this end, we then find the integers $L_n$ and r such that, $$a'+b'=L_n a'+r \text{ and } r<a'$$

Solving for $L_n$ gives, $$L_n = \left\lfloor \frac{a'+b'}{a'} \right\rfloor$$

$$L_n = \left\lfloor \frac{8+31}{8} \right\rfloor = 4$$

Using $L_n$ we solve for r, $$r=(a'+b')-L_n a' \quad r=(8+31)-4\times 8=7$$

Within the basic interval of a'+b' elements, we denote the destinations of the elements of A by ones, and the intervening destinations of elements of B by zeros. Obviously there are a' locations in the sequence for elements of A, and we also know that the spacing between these is going to be $L_n$ or $L_n+1$ in length. We know that r of the spacings are going to be $L_n+1$ in length. If we define two sub sequences of length $d_L$ and $d_U$ where all bits are 0 and the next is a 1 such that, $$a' = (r-1)(d_L+1) + (d_U+1), \quad d_L = \left\lfloor \frac{a'-r}{r} \right\rfloor$$

Then we can show that for any valid a' and r $$d_U = \left\lceil \frac{a'-r}{r} \right\rceil$$

Let $d_U = \left\lfloor \frac{a'-r}{r} \right\rfloor + \beta'$ where $\beta' = 0, 1$ and $a' - r = \alpha r + \beta$ where $\beta < r$ then, $d_L = \alpha, d_U = \alpha + \beta'$ $a' = (r-1)(d_L + 1) + (d_U + 1), d_L$
$= (r-1)(\alpha + 1) + (\alpha + \beta' + 1)$
$= \alpha r + r + \beta'$ $a' - r = \alpha r + \beta'$ $\beta = \beta'$ $d_U = \alpha + \beta$ $\therefore d_U = \left\lceil \frac{a'-r}{r} \right\rceil$ Thus, we can now define a sub-sequence where the 1's are evenly distributed as defined above. The union symbols denote concatenation. In the equations below, ones(n) is a sequence of n 1's, and zeros(n) is a sequence of n 0's.

$$\hat{S}(a', r) = \bigcup_0^{\left\lfloor \frac{a'-r}{r} \right\rfloor + 1} \left[ \text{zeros}\left(\left\lfloor \frac{a'-r}{r} \right\rfloor\right) \cup 1 \right] \bigcup_0^{\left\lceil \frac{a'-r}{r} \right\rceil > 0} \left[ \text{zeros}\left(\left\lfloor \frac{a'-r}{r} \right\rfloor\right) \cup \text{ones}\left(\left\lceil \frac{a'-r}{r} \right\rceil - \left\lfloor \frac{a'-r}{r} \right\rfloor\right) \right]$$

$$\hat{S}(8, 7) = \bigcup_0^{\left\lfloor \frac{8-7}{7} \right\rfloor + 1} \left[ \text{zeros}\left(\left\lfloor \frac{8-7}{7} \right\rfloor\right) \cup 1 \right]$$

$$\bigcup_0^{\left\lceil \frac{8-7}{7} \right\rceil > 0} \left[ \text{zeros}\left(\left\lfloor \frac{8-7}{7} \right\rfloor\right) \cup \text{ones}\left(\left\lceil \frac{8-7}{7} \right\rceil - \left\lfloor \frac{8-7}{7} \right\rfloor\right) \right]$$

$$= \bigcup_0^1 [\text{zeros}(0) \cup 1] \bigcup_0^0 [\text{zeros}(1) \cup \text{ones}(1-0)]$$

$$= \bigcup_0^1 [1]$$

$$= 1xxxxxxx$$

The process of multiplexing may be continued either by recursion, in which later sequences to be added are distributed more sparsely, or they may be introduced immediately for even distribution in a generalization of this process. The descriptor envisioned here for the multiplexing of streams is more suited to the former case, with the highest rate streams combined first.

We define a Shift Register (SR) that has a preload value that is aligned to the MSB of SR setting the remaining LSB with 0 and shifts the sequence up 1 bit once per call outputting the overflowed bit.

Figure 19:
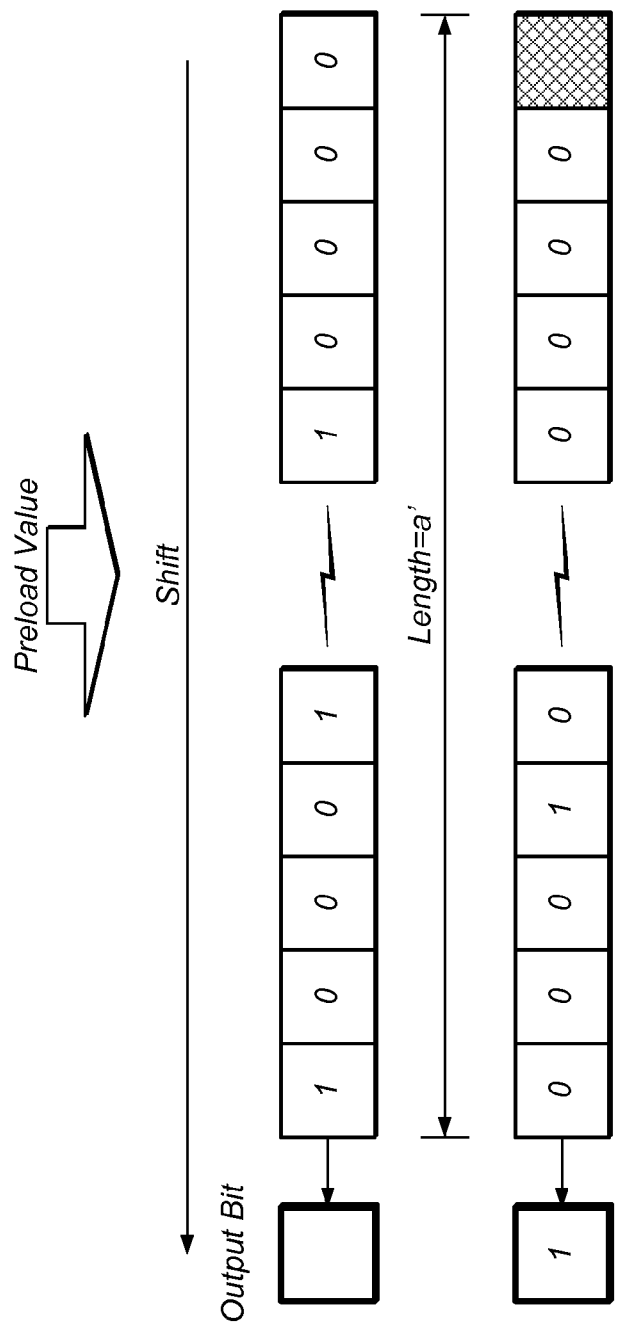
FIG. 19 illustrates shift register operation for constructing a sequence.

FIG. 19 illustrates exemplary Shift Register (SR) Operation.

We then use the SR to construct our entire sequence by, preload $SR = \hat{S}(a', r)$ $$S = \bigcup_0^{a'} [\text{zeroes}(L_n - SR + 1) \cup 1]$$

The sequence constructed needs to be padded with zeros on the end for the final output preload $SR = 10000000$ $$S = \bigcup_{i=0}^8 [\text{zeroes}(4 - SR + 1) \cup 1]$$

$= 00010000100001000010000100001000010000100001$

The generated Sequence=BBBA-BBBB-ABBB-BABB-BBAB-BBBA-BBBB-ABBB-BABB-BBA showing the 8:31 of stream A and stream B. This sequence is the repetition sequence for the 2 mux streams.

For muxing more than 2 streams:
Start with the stream with the largest throughput and combine the remaining streams into one.
Compute the muxing strategy for the two streams.
Select the mux locations of data in the combined stream for our next muxing positions.
Remove the highest mux rate from the remaining combined stream.
Compute the mux positions over the allowed positions.
Keep iterating until we have no more streams to combine and all the locations have been defined.

Burst Multiplexing Output of Normal and Robust Data

For burst mode method, multiplexing output of normal and robust data is performed on a block by block basis. The rates are specified in the LTP Field Definition. The bursts will be transmitted from lowest stream number to highest stream number, where stream 0 is the 1$^{st}$ stream.

XLC Sub-Packet ID—Number of Streams

The number of streams sub-packet describes the number of data streams that are being transmitted. This includes all streams, main and robust if present. The count range is from 1 to $2^{p_c}$, where $p_c$ is an integer, but is transmitted as 0 to $2^{p_c}-1$.

Table 21 below illustrates a format view of the number of data streams related to VSIW Sub-Packet IDs.

TABLE 21

VSIW Sub-Packet ID - Physical - Number of Data Streams format

| # | Field Name | # of bits | Description |
|---|---|---|---|
| 1 | Count | $p_c$ | Number of Data Streams (this includes the Main Stream) For future definition the minimum number of bits to represent the value in $p_c$ is represented as $p_{NS}$. |

XLC Sub-Packet ID—PHY Type

The PHY Type sets the value for all hierarchical sub-fields of the XLC Physical Layer parameters to a default mode. This offers a low bandwidth method for loading predefined defaults of a specific physical type. The number of PHY Types listed is four, however as in all field and associated parameter definitions of the XLC, there is not a theoretical limit by design. Thus, the number of PHY Types can be represented as $2^{p_c}$ where $p_c$ is an integer.

Table 22 below illustrates a view of PHY Type XLC Sub-Packet IDs.

TABLE 22

XLC Sub-Packet ID - Physical - PHY Type

| # | Field Name | # of bits | Description |
|---|---|---|---|
| 1 | PHY Type | $p_c$ | PHY defaults for ATSC 1.0 |

Table 23 below illustrates a view of definitions of PHY Type XLC Sub-Packet IDs.

Table 24 below illustrates the PHY States of XLC Sub-Packet IDs.

TABLE 24

XLC Sub-Packet ID - Physical - PHY States

| # | Field Name | # of bits | Description |
|---|---|---|---|
| 1 | PSSSPID | 2 | PHY states Sub-Sub-packet ID |
| 2 | PSP | Dependent on the fields defined by PSSSPID in Table 25 below illustrates the PSSSPID field definitions of XLC Sub-Packet IDs. | PHY States Payload |

Table 25 below illustrates the PSSSPID field definitions of XLC Sub-Packet IDs.

TABLE 25

XLC Sub-Packet ID - Physical - PHY States - PSSSPID Field Definition

| ID | PSSSPID | Field Name | Sub-Field Name | # of bits | Description |
|---|---|---|---|---|---|
| 0.1.6.0 | 00 | Multiplexer State | Value | $p_c$-2 | The current position of the stream multiplexer. This has a cycle rate of the output multiplexer base (MB) |
| 0.1.6.1 | 01 | Interleaver State | StreamID Value | $p_{NS}$ $p_c$-2-$p_{NS}$ | Stream ID Number Current location in the Streams interleaver state. Always 0 for main stream |
| 0.1.6.2 | 10 | Location in TS Packet | StreamID Value | $p_{NS}$ $p_c$-2-$p_{NS}$ | Stream ID Number Current location in the Streams transport packet in bytes. Always 0 for main stream |
| 0.1.6.3 | 11 | XLCPO | StreamID Value | $p_{NS}$ $p_c$-2-$p_{NS}$ | Stream ID Number Offset in bytes from the start of the packet burst or sequence to the specified XLC packet. For stream 0 (main stream) this is the offset in segments from the start of the current VSIW packet. |

TABLE 23

XLC Sub-Packet ID - Physical - RF - PHY Type Definition

| Value | Field Name | Description |
|---|---|---|
| 0 | ATSC 1.0 | XLC PHY defaults for ATSC 1.0 Mode |
| 1 | A-VSB | XLC PHY defaults for A-VSB Mode |
| 2 | MPH | XLC PHY defaults for MPH Mode |
| 3 | Micro/Thom | XLC PHY defaults for Micronas/Thompson Mode |
| No-Limit | Other | TBD |

XLC Sub-Packet ID—PHY States

The PHY States field describes the current states of the physical layer so that a receiver after acquiring lock knows where the data starts and can initialize the PHY to synchronize to the transmitter. It is assumed by the receiver that the default states are 0, if not specified.

XLC Management Sub-Packet ID

The following describes the Management functionality that resides in the layers above the Physical Layer (PHY). The functionality covered corresponds to the Data Link Layer (DLL), Network Layer, Transport Layer and Application Layer of the OSI Reference Model. The services supported include Streaming AV, File Transfer, Datacasting, Signaling, Announcement, Conditional Access (CA), Pay Per View (PPV) and Digital Rights Management (DRM). Also supported are service protection, content protection, service discovery, handoff, interactive support, QoS monitoring, and notification. The protocol stack for the architecture is shown in FIG. 16. The OSI Layers are shown on the left side with corresponding ATSC functionality is described on the right.

Table 26 below illustrates the different types of sub-packet IDs.

TABLE 26

Sub-Packet ID - Management Definition

| ID    | Field Name          | Description                      |
|-------|---------------------|----------------------------------|
| 0.2.0 | Disable             | Disable Management               |
| 0.2.1 | M1 Transport        | Data Encapsulation               |
| 0.2.2 | M2 Signaling        | Session control                  |
| 0.2.3 | M3 Announcement     | Channel and Program information  |
| 0.2.4 | M4 Streaming Delivery | Delivery of streaming data     |
| 0.2.5 | M5 File Delivery    | Delivery of non streaming data   |
| 0.2.6 | M6 Application      | Setup for Presentation Layer     |
| 0.2.7 | M7 CAS              | Conditional Access Service       |
| 0.2.8 | M8 DRM              | Digital Rights Management        |
| 0.2.9 | Other               | TBD                              |

XLC Sub-Packet ID—M1-Transport

There are various encapsulation/translation policies that can be used to transport data from one location to another. The selection of the appropriate stack is dependent on the nature of the data being transported (what needs to be known about the data to move it), and the nature of the network it will be transported over. Criteria that can be used to measure the effectiveness of a selected stack should be defined per the application.

For ATSC M/H the majority of the data to be transferred is multimedia and has the following characteristics:
- Sensitive to jitter (PCR jitter 500 ns max)
- Sensitive to latency (end to end delay)
- Moderately sensitive to packet loss
- Format is streaming, sensitive to synchronization and splicing
- Variable data rate
- Mixture of media types The carriage method selected must provide a method for minimizing the effects of latency and jitter, while supporting efficient bit stream splicing in optimal locations. The pertinent performance metrics for the M1-Transport layer are throughput and reliability.

Throughput Efficiency

There are several methods for the carriage of multimedia content, which include but are not limited to MPEG-2 TS over IP, MPEG-2 TS over RTP, native RTP (NRTP) and its secure counterpart (SRTP).

Table 27 below illustrates the protocol overhead for potential encapsulation protocols.

TABLE 27

Protocol Overhead for Encapsulation Protocols

| Protocol (encapsulation) | Header Overhead (bytes) | Trailer Overhead (bytes) |
|--------------------------|-------------------------|--------------------------|
| IP   | 20   |      |
| UDP  | 8    | 16   |
| RTP  | 12   |      |
| SRTP | 12   | 4, 8 |
| TS   | 4    |      |
| PES  | 8, 13|      |

IP is a data oriented protocol used to switch packets over a network. It is responsible for path determination and local addressing. IP is a connectionless protocol, no prior setup of the network path is required to communicate to a host it has never communicated with before. IP protects the header with a checksum, but provides no protection for the data. If a packet is received and the Header Checksum is bad, the packet will be dropped.

Figure 20:
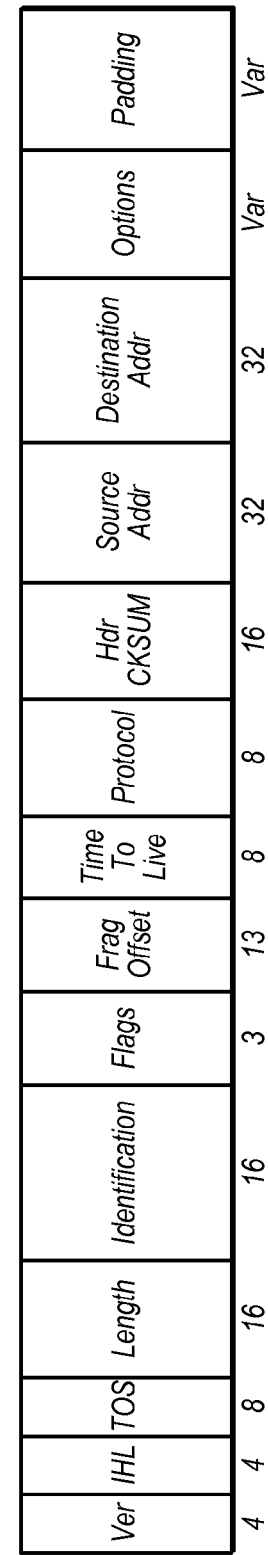
FIG. 20 illustrates a header format for packets.

FIG. 20 illustrates an IP Header Format.

User Data Protocol (UDP) is a unicast, best effort delivery protocol, responsible for end to end delivery. UDP is analogous to TCP without the acknowledgment and retransmission. UDP is used instead of IP when sensitivity to time of delivery takes precedence over robust packet delivery. UDP does port mapping and so can be used to map a stream to a port if a particular application is listening on (Application Layer multiplexing). The Source Port and Checksum field use is optional. If they are not used, they should be populated with non zero data (preferably a non repeating sequence) to prevent hackers from using knowledge of known values in known locations to break the security protection implemented.

Figure 21:
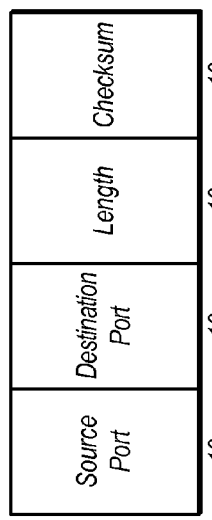
FIG. 21 illustrates a UDP header format.

FIG. 21 illustrates a UDP Header Format.

PES is a variable length header encapsulating an elementary stream in the MPEG data packaging.

For MPEG-2 TS over UDP, each UDP packet is capable of carrying 7 TS packets. The PES stream overhead is variable and dependent on the Elementary Stream (ES) length, and is therefore not considered in the calculations. The overhead for MPEG-2 TS over UDP and other composite streams are shown in Table 28 through Table 31.

For the throughput performance calculations, a maximum packet length of 1500 bytes is assumed. This is also known as the Maximum Transmission Unit (MTU) for transmission over an Ethernet network without triggering fragmentation. Fragmentation can result in increased latency and jitter, as well as increased packet loss.

Table 28 below illustrates the overhead for the encapsulation of MPEG-2 TS over UDP.

TABLE 28

Overhead for Encapsulation of MPEG-2 TS over UDP (MPEG2TS/UDP)

| Protocol (encapsulation) | Header Overhead (bytes) | Trailer Overhead (bytes) | Number of Packets | Total (bytes) |
|--------------------------|-------------------------|--------------------------|-------------------|---------------|
| UDP      | 8  |  | 1 | 8  |
| IP       | 20 |  | 1 | 20 |
| MPEG-2 TS| 4  |  | 7 | 28 |
| SUM      |    |  |   | 56 |

Table 29 below illustrates the overhead for the encapsulation of RTP over MPEG-2 TS.

TABLE 29

Overhead for Encapsulation of RTP over MPEG-2 TS (RTP/MPEG2TS)

| Protocol (encapsulation) | Header Overhead (bytes) | Trailer Overhead (bytes) | Number of Packets | Total (bytes) |
|--------------------------|-------------------------|--------------------------|-------------------|---------------|
| RTP      | 12 |  | 1 | 12 |
| UDP      | 8  |  | 1 | 8  |
| IP       | 20 |  | 1 | 20 |
| MPEG-2 TS| 4  |  | 7 | 28 |
| SUM      |    |  |   | 68 |

Table 30 below illustrates the overhead for Native RTP Encapsulation.

TABLE 30

Overhead for Native RTP Encapsulation

| Protocol (encapsulation) | Header Overhead (bytes) | Trailer Overhead (bytes) | Number of Packets | Total (bytes) |
|---|---|---|---|---|
| RTP | 12 | | 1 | 12 |
| UDP | 8 | | 1 | 8 |
| IP | 20 | | 1 | 20 |
| SUM | 40 | | 1 | 40 |

Table 31 below illustrates the overhead for Native SRTP Encapsulation.

TABLE 31

Overhead for Native SRTP Encapsulation

| Protocol (encapsulation) | Header Overhead (bytes) | Trailer Overhead (bytes) | Number of Packets | Total (bytes) |
|---|---|---|---|---|
| SRTP | 12 | 4, 8 | 1 | 16, 20 |
| UDP | 8 | | 1 | 8 |
| IP | 20 | | 1 | 20 |
| SUM | 40 | 4, 8 | 1 | 44, 48 |

Efficiency of encapsulation can be computed by: encapsulation efficiency=1−(length of encapsulation overhead/(length of (payload data+encapsulation overhead)

where, encapsulation overhead=sum of bytes added to transport the payload

For the TS/UDP/IP case, the payload data is calculated as 7 times the maximum MPEG-2 TS payload data, which is 7*184-bytes=1288-bytes. The encapsulation efficiency for this case is 1−(56/(1288+56))=0.9583.

For the TS/RTP/UDP/IP case, the payload data is calculated a 7 times the max MPEG-2 TS payload, which is 7*184=1288. The encapsulation efficiency for this case is 1−(68/(1288+68))=0.9499.

For the RTP/UDP/IP case, the payload data is calculated as max packet size or payload data (1500)−encapsulation overhead=1500−56=1444. The efficiency is then 1−(40/1500)=0.9733.

For the SRTP/UDP/IP case, the payload is calculated as 1500−64 (worst case)=1436. The efficiency is 1−(48/1500)=0.9680.

Table 32 below illustrates the encapsulation efficiencies for various layer organizations.

TABLE 32

Encapsulation Efficiency for M1-Transport Layers

| | TS/ UDP/IP | TS/RTP/ UDP/IP | RTP/ UDP/IP | SRTP/ UDP/IP |
|---|---|---|---|---|
| Encapsulation Overhead | 56 | 68 | 40 | 48 (max) |
| Payload Data | 1288 | 1288 | 1460 | 1452 |
| Efficiency/Overhead | 0.9583/ 4.17% | 0.9499/ 5.01% | 0.9733/ 2.67% | 0.9680/ 3.20% |

These methods only differ by a few percent, however a further savings on header overhead can be achieved by utilizing the Robust Header Compression (ROHC) standard to further differentiate performance. ROHC is a specific optimization for the combination of RTP/UDP/IP headers in a stack.

ROHC compresses the 40 byte Header to approximately 4 bytes. For the following calculations, it is assumed that the same 36 byte savings applies to SRTP since the header fields compressed are the same for RTP and SRTP. Using the same payload sizes, since the packets will travel over the net and have the header compressed only for the over the air transmission, the results are presented in Table 33.

The compression of the RTP/UDP/IP header reduces the composite header overhead by 36 bytes. For the TS/UDP/IP case, the compression does not apply.

For the TS/RTP/UDP/IP case, the payload is calculated a 7 times the max MPEG-2 TS payload, which is 7*184=1288. The efficiency for this case is 1−(32/(1288+32))=0.9758.

For the RTP/UDP/IP case, the payload is calculated as max packet size (1500)−overhead=1500−20=1480. The efficiency is then 1−(4/1500)=0.9973.

For the SRTP/UDP/IP case, the payload is calculated as 1500−28 (worst case)=1472. The efficiency is 1−(12/1500)=0.9920.

Table 33 below illustrates encapsulation efficiencies with ROHC.

TABLE 33

Encapsulation Efficiency with ROHC

| | TS/UDP/IP w/ROHC | TS/RTP/UDP/IP w/ROHC | RTP/UDP/IP w/ROHC | SRTP/UDP/IP w/ROHC |
|---|---|---|---|---|
| Encapsulation Overhead | 20 | 32 | 4 | 12 |
| Payload Data | 1288 | 1288 | 1496 | 1488 |
| Efficiency/Overhead | NA | 0.9758/2.42% | 0.9973/.20% | 0.9920/.80% |

Reliability

Native RTP (RTP/UDP/IP) packetization allows intelligent mapping of video packets to RTP/UDP/IP packets. MPEG-2 TS makes minimal allowance for intelligent mapping of video packets to transport packets. For Native RTP, one lost packet results in one lost NAL. For the TS case, the TS packets in the payload may belong to more than one PES packet and so more than one NAL unit. This means that when a packet is lost, two NALs may be lost.

Synchronization

The synchronization of streaming media is very important to maintain a high quality user experience. Both RTP/UDP/IP and MPEG-2 TS have time stamp fields that are used by the decoder to determine when to display the decoded payload. Both methods support the synchronization of individual and simultaneously synchronized streams. Elementary streams are synchronized by recreating the clock reference used at encoding, and having the streams play referenced to it. For MPEG-2 TS, the reference is the PCR (Program Clock Reference). It is carried in the TS. In the case of the RTP/UDP/IP, the RTCP report information is used to map the timestamps in the RTP/UDP/IP headers to the 'wall clock time'. TS sends the timing information in the stream, while RTP/UDP/IP has it sent by a sister stream. The two methods are comparable.

Networking and Media Types

RTP/UDP/IP are general purpose network compliant layers. They are each independent and each layer can be switched out if a more advantageous layer became available in the future. The processing of the streams should be unaffected by the switching of a network layer.

RTP/UDP/IP provides efficient network stack support that enables network transfer of data. RTP/UDP/IP packets can be sent across with QoS support, where there is no priority scheme in the network for MPEG-2 TS packets. The ATSC M/H transmission could be received by the end user's computer and then transferred through the network for viewing on the television or wireless laptop.

Other non MPEG media formats are also supported by RTP/UDP/IP such as AMR, H.263, G.723, etc. . . . . Selection of a generic encapsulation preserves flexibility for future multimedia encoding schemes. The MPEG-2 TS has historically been dedicated to the transport of MPEG streams.

Default M1-Transport Layer

Figure 22:
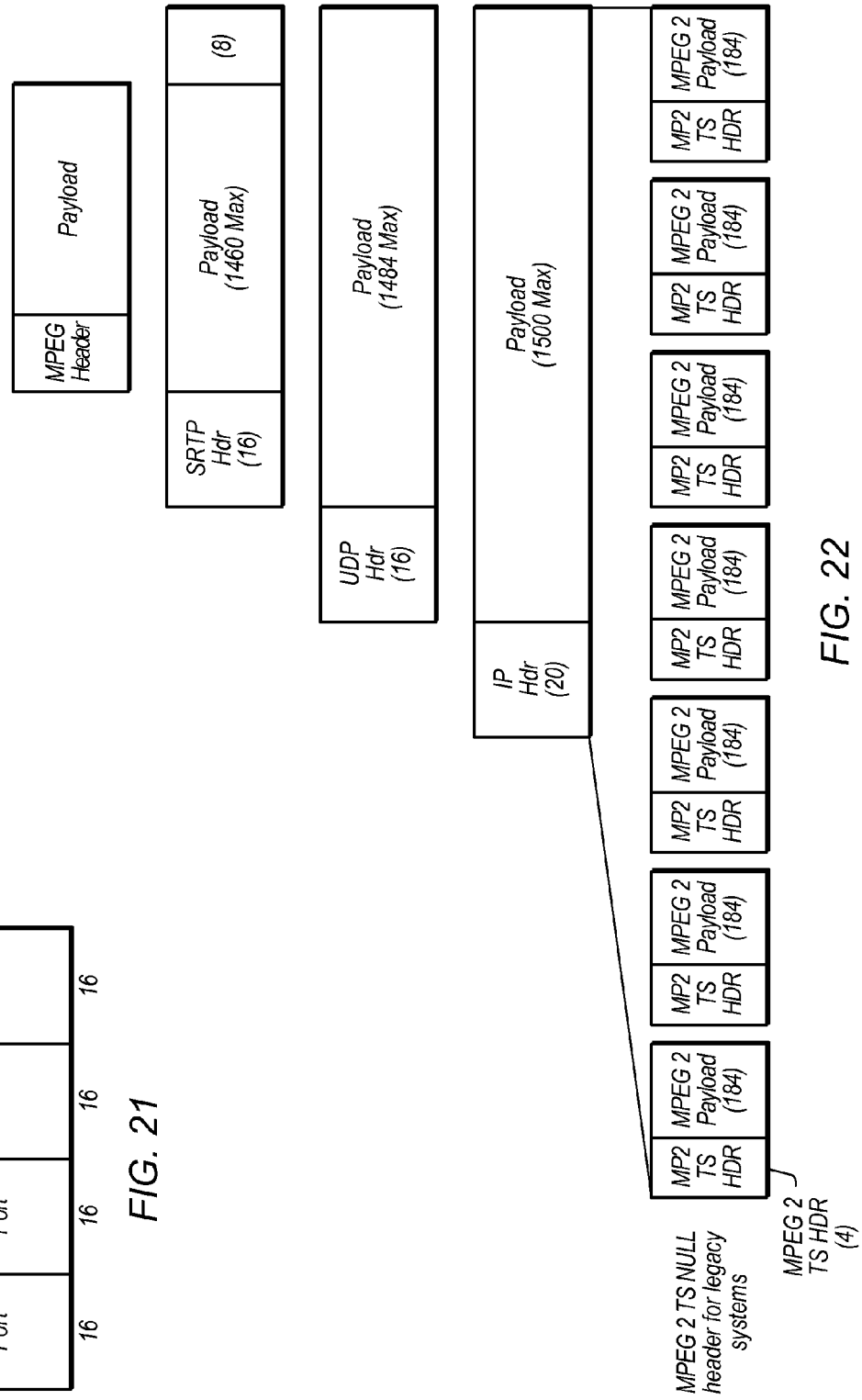
FIG. 22 illustrates an M-1 Transport Layer Default XLC protocol stack.

The XLC parameters for the M1-Transport layer are defined in Table 34 through Table 37 below. FIG. 22 illustrates an example of M1-Transport layer default XLC protocol stack.

Table 34 below illustrates definitions for the M1-Transport layer for Sub-Packet IDs.

TABLE 34

Sub-Packet ID - Management - M1 Transport - Definition

| ID | Field Name | Description |
|---|---|---|
| 0.2.1.0 | Disable | Disable M1-Transport |
| 0.2.1.1 | MPEG2 TS | MPEG2 Transport Stream |
| 0.2.1.2 | IP | Internet Protocol |
| 0.2.1.3 | UDP | UDP Protocol |
| 0.2.1.4 | Other | TBD |

Table 35 below illustrates values for MPEG2 TS M1-Transport Sub-Packet IDs.

TABLE 35

Sub-Packet ID - Management - M1 Transport - MPEG2 TS - Value

| Value | Field Name | Description |
|---|---|---|
| 0 | Enable | Enable MPEG2 TS |
| 1 | Disable | Disable MPEG2 TS (Default) |

Table 36 below illustrates values for IP M1-Transport Sub-Packet IDs.

TABLE 36

Sub-Packet ID - Management - M1 Transport - IP - Value

| Value | Field Name | Description |
|---|---|---|
| 0 | Enable | Enable IP (Default) |
| 1 | Disable | Disable IP |

Table 37 below illustrates values for UDP M1-Transport Sub-Packet IDs.

TABLE 37

Sub-Packet ID - Management - M1 Transport - UDP - Value

| Value | Field Name | Description |
|---|---|---|
| 0 | Enable | Enable UDP (Default) |
| 1 | Disable | Disable UDP |

Based on analysis of the previous section the default M1-Transport Layer is UDP/IP versus MPEG-2 TS for the following reasons:

[RTP]/UDP/IP has less protocol overhead

[RTP]/UDP/IP has better error resilience

[RTP]/UDP/IP is superior network compatible characteristics

[RTP]/UDP/IP can be synchronized in a similar way to MPEG-2 TS

[RTP]/UDP/IP supports the separation of services audio, video, CC to facilitate easier customization of services

XLC Sub-Packet ID—M2-Signaling

Signaling is the process of communicating control information for the elementary streams to configure the receiver to demultiplex and decode the various program streams. for the components of the desired program, and to reassemble them. A program is defined as a set of elements with a common time base and the same start and stop times.

The following outlines signaling options. More particularly, Table 38 below illustrates definitions for M2 Signaling Sub-Packet IDs.

TABLE 38

Sub-Packet ID - Management - M2 Signaling - Definition

| ID | Field Name | Description |
|---|---|---|
| 0.2.2.0 | Disable | Disable M2-Signaling |
| 0.2.2.1 | XML | XML Protocol |
| 0.2.2.2 | SIP | Session Initiation Protocol |
| 0.2.2.3 | SAP | Session Announcement Protocol2 |
| 0.2.2.4 | SDP | Session Description Protocol |
| 0.2.2.5 | Other | TBD |

Extensible Markup Language (XML) is used for sharing structured data across different information systems. There are numerous RFCs based on XML for data sharing.

Table 39 below illustrates values for XML M2 Signaling Sub-Packet IDs.

TABLE 39

Sub-Packet ID - Management - M2 Signaling - XML - Value

| Value | Field Name | Description |
|---|---|---|
| 0 | Enable | Enable XML |
| 1 | Disable | Disable XML |

Session Initiation Protocol (SIP) is an application layer control (signaling) protocol. It is used for creating, modifying and terminating sessions with one or more participants. It can be used to initiate multicast sessions for the distribution of multimedia content with adjustments for the broadcast environment. SIP is used for RTP/SRTP.

Table 40 below illustrates values for SIP M2 Signaling Sub-Packet IDs.

TABLE 40

Sub-Packet ID - Management - M2 Signaling - SIP - Value

| Value | Field Name | Description |
|---|---|---|
| 0 | Enable | Enable SIP |
| 1 | Disable | Disable SIP |

Session Announcement Protocol (SAP) is used to broadcast multicast session information.

Table 41 below illustrates values for SAP M2 Signaling Sub-Packet IDs.

TABLE 41

Sub-Packet ID - Management - M2 Signaling - SAP - Value

| Value | Field Name | Description |
|---|---|---|
| 0 | Enable | Enable SAP |
| 1 | Disable | Disable SAP |

Session Description Protocol (SDP) is used to describe streaming media initialization parameters.

Table 42 below illustrates values for SDP M2 Signaling Sub-Packet IDs.

TABLE 42

Sub-Packet ID - Management - M2 Signaling - SDP - Value

| Value | Field Name | Description |
|---|---|---|
| 0 | Enable | Enable SDP |
| 1 | Disable | Disable SDP |

XLC Sub-Packet ID—M3-Announcement

Announcement builds upon the signaling protocol to announce the services.

The following outlines announcement options.

Table 43 below illustrates definitions for M3-Announcement Sub-Packet IDs.

TABLE 43

Sub-Packet ID - Management - M3-Announcement - Definition

| ID | Field Name | Description |
|---|---|---|
| 0.2.3.0 | Disable | Disable Announcement |
| 0.2.3.1 | ESG | Electronic Service Guide |
| 0.2.3.2 | EPG | Electronic Program Guide |
| 0.2.3.3 | Other | TBD |

Table 44 below illustrates values for ESG M-3 Announcement Sub-Packet IDs.

TABLE 44

Sub-Packet ID - Management - M3-Announcement - ESG - Value

| Value | Field Name | Description |
|---|---|---|
| 0 | Enable | Enable ESG |
| 1 | Disable | Disable ESG |

Table 45 below illustrates values for EPG M-3 Announcement Sub-Packet IDs.

TABLE 45

Sub-Packet ID - Management - M3-Announcement - EPG - Value

| Value | Field Name | Description |
|---|---|---|
| 0 | Enable | Enable EPG |
| 1 | Disable | Disable EPG |

XLC Sub-Packet ID—M4-Streaming Delivery

Table 46 below illustrates definitions for M4-Streaming Delivery Sub-Packet IDs.

TABLE 46

Sub-Packet ID - Management - M4-Streaming Delivery - Definition

| ID | Field Name | Description |
|---|---|---|
| 0.2.4.0 | Disable | Disable Streaming Delivery |
| 0.2.4.1 | Media Streaming | Media Streaming |
| 0.2.4.2 | TESLA-SRTP | Time efficient loss-tolerant authentication |
| 0.2.4.3 | SRTP | Secure real-time transport protocol |
| 0.2.4.4 | Other | TBD |

Table 47 below illustrates values for MPEG2/4 Streaming Sub-Packet IDs.

TABLE 47

Sub-Packet ID - Management - M4-Streaming Delivery - MPEG2/4 Streaming - Value

| Value | Field Name | Description |
|---|---|---|
| 0 | Enable | Enable MPEG2/4 Streaming |
| 1 | Disable | Disable MPEG2/4 Streaming |

Table 48 below illustrates values for TESLA-SRTP Sub-Packet IDs.

TABLE 48

Sub-Packet ID - Management - M4-Streaming Delivery - TESLA-SRTP - Value

| Value | Field Name | Description |
|---|---|---|
| 0 | Enable | Enable TESLA-SRTP |
| 1 | Disable | Disable TESLA-SRTP |

Secure Real-Time Transport Protocol (SRTP) is a profile of Real-Time Transport Profile (RTP). SRTP supports confidentiality (encryption), message authentication and replay protection for the RTP traffic and the Real-Time Transport Control Protocol (RTCP) communications for both unicast and multicast traffic. Utilization of the full security features is optional. The protocol can be utilized as RTP or RTCP plus the authentication feature in its minimal configuration. For this application SRTP is responsible for the sequencing and time stamping of the streaming media.

RTP is a standardized packet format for delivery of audio and video data over the internet. The RTP functionality allows data to be modified over the transmission path more easily than UDP alone. RTP allows sequence reordering of packets, supports ad insertion/stream splicing, error recovery, fast channel change, QoS monitoring and compatibility with voice and video conferencing applications. The protocol is supported by IETF, DVB and ETSI.

SRTP/RTP protocol does not include any support for multiplexing capability. UDP, the underlying encapsulation provides the multiplexing support. Each SRTP stream must carry timing information to be used to synchronize the stream on the receive device.

Without protection RTP is considered insecure. Content and Service Protection are essential to the stability of the broadcast service and the protection of the Entertainment Industry IP rights. SRTP supports AES in counter mode (AES-CTR) as its default algorithm for encryption. The AES algorithm supports two modes, counter and output feedback mode. Counter mode is optimal for ATSC M/H because it allows access to individual blocks, which is essential on a unreliable medium where packets may be lost. The default encryption key is 128 bits and the default session salt key is 122 bits.

Authentication, integrity and replay protection are supported by use of the HMAC-SHA1 algorithm. The algorithm produces a 160-bit result and the first 80 bits are extracted and appended to the packet. The authentication and encryption coverage are shown in 24.

Figure 23:
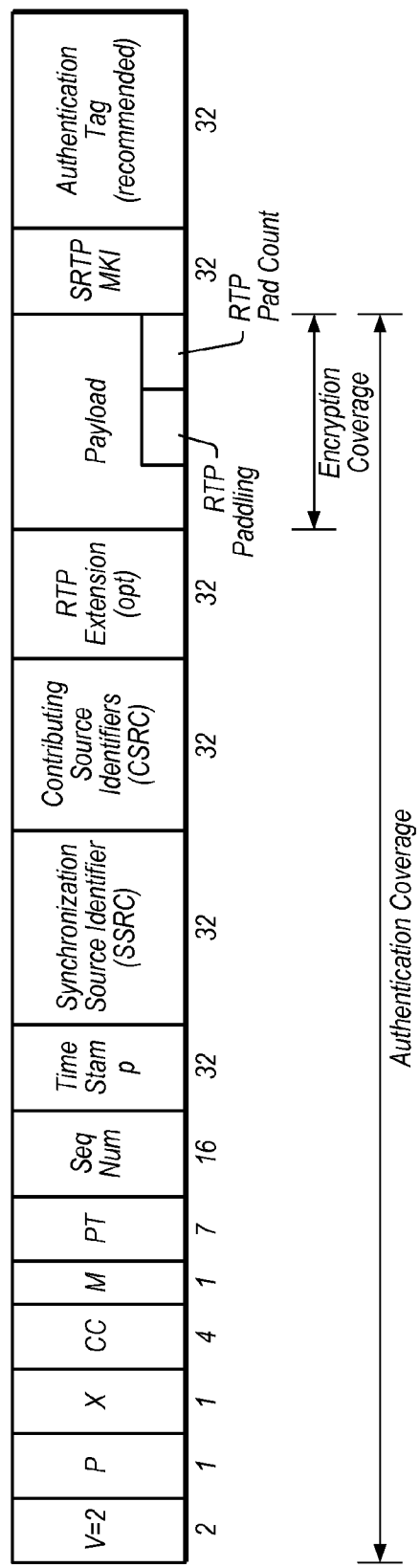
FIG. 23 illustrates an SRTP packet format.

FIG. 23 illustrates the SRTP Packet Format.

Key derivation of all keys needed per session is from one master key in a cryptographically secure way. The master key needs to be distributed to the end user only once, using the MIKEY key management protocol.

RTCP is a control protocol that works with of the RTP Control protocol. It is used to monitor the delivery and packing of the SRTP data. It provides QoS measures by periodically sending statistics to SRTP users. Because the ATSC M/H is a unicast protocol, the SRTCP needs to be adapted to providing the feedback through back channels. The data collected to support QoS statistics would be held on the receiver until a back channel became available, via opportunistic cellular or WAN/WAP capable devices. The size and scope of the data could be scaled per the target platform and the functionality as a whole could be optionally disabled by the user. The anonymous statistical data could be utilized by the Broadcasters to adjust their transmission parameters and set their pricing for various tiers of advertising (mapping of coverage area).

The advantages of SRTP can be summarized as follows:

Confidentiality for RTP as well as for RTCP by encryption of the respective payloads The possibility to refresh the session keys periodically, which limits the amount of cipher text produced by a fixed key, available for an adversary to cryptanalysis An extensible framework that permits upgrading with new cryptographic algorithms A secure session key derivation with a pseudo-random function at both ends The usage of salting keys to protect against pre-computation attacks Security for unicast and multicast RTP applications Low computational cost asserted by pre-defined algorithms Low bandwidth cost and a high throughput by limited packet expansion and by a framework preserving RTP header compression efficiency Small footprint in terms of code size and data memory for keying information and replay lists It is defined as a profile of RTP, so that it can be easily integrated into existing RTP stacks. For example SRTP may use RTP padding because the encrypted portion is the exact size of the plaintext for the pre-defined algorithms It provides independence from the underlying transport, network, and physical layers used by RTP, in particular high tolerance to packet loss and re-ordering, and robustness to transmission bit-errors in the encrypted payload It lightens the burden of the key management due to the fact that a single master key can provide keying material for confidentiality and integrity protection, both for the SRTP stream and the corresponding SRTCP stream. For special requirements a single master key can protect several.

Table 49 below illustrates definitions for SRTP Sub-Packet IDs.

TABLE 49

Sub-Packet ID - Management - M4-Streaming Delivery - SRTP - Definition

| ID | Field Name | Description |
|---|---|---|
| 0.2.4.3.0 | Disable | Disable SRTP |
| 0.2.4.3.1 | Authenticate | Packet Authentication Method |
| 0.2.4.3.2 | Encryption | Data Encryption Method |
| 0.2.4.3.3 | Other | TBD |

Table 50 below illustrates definitions for Authenticate Sub-Packet IDs.

TABLE 50

Sub-Packet ID - Management - M4-Streaming Delivery - SRTP - Authenticate - Definition

| ID | Field Name | Description |
|---|---|---|
| 0.2.4.3.1.0 | Disable | Disable Authenticate |
| 0.2.4.3.1.1 | HMAC-SHAI | Key-Hash Message Authentication Mode with SHA |
| 0.2.4.3.1.2 | Other | TBD |

Table 51 below illustrates values for HMAC-SHAI Sub-Packet IDs.

TABLE 51

Sub-Packet ID - Management - M4-Streaming Delivery - SRTP - Authenticate - HMAC-SHAI - Value

| Value | Field Name | Description |
|---|---|---|
| 0 | Enable | Enable HMAC-SHAI |
| 1 | Disable | Disable HMAC-SHAI |

Table 52 below illustrates definitions for Encryption Sub-Packet IDs.

TABLE 52

Sub-Packet ID - Management - M4-Streaming Delivery - SRTP - Encryption - Definition

| ID | Field Name | Description |
|---|---|---|
| 0.2.4.3.2.0 | Disable | Disable Encryption |
| 0.2.4.3.2.1 | Cipher | Encryption Method |
| 0.2.4.3.2.2 | Key Derivation | Method of key derivation |
| 0.2.4.3.2.3 | Key Exchange | Method of key derivation |
| 0.2.4.3.2.4 | Other | TBD |

Table 53 below illustrates definitions for Cipher Sub-Packet IDs.

TABLE 53

Sub-Packet ID - Management - M4-Streaming Delivery - SRTP - Encryption - Cipher - Definition

| ID | Field Name | Description |
|---|---|---|
| 0.2.4.3.2.1.0 | Disable | Disable Cipher |
| 0.2.4.3.2.1.1 | AES | Advanced Encryption Standard |
| 0.2.4.3.2.1.2 | Other | TBD |

Table 54 below illustrates definitions for AES Sub-Packet IDs.

TABLE 3

Sub-Packet ID - Management - M4-Streaming Delivery - SRTP - Encryption - Cipher - AES - Definition

| ID | Field Name | Description |
|---|---|---|
| 0.2.4.3.2.1.1.0 | Disable | Disable AES |
| 0.2.4.3.2.1.1.1 | Counter Mode | Counter Mode |
| 0.2.4.3.2.1.1.2 | Output Feedback | Output Feedback |
| 0.2.4.3.2.1.1.3 | F8 Mode | F8 Mode |
| 0.2.4.3.2.1.1.4 | Other | TBD |

Table 55 below illustrates values for Counter Mode Sub-Packet IDs.

TABLE 4

Sub-Packet ID - Management - M4-Streaming Delivery - SRTP - Encryption - Cipher - AES - Counter Mode - Value

| Value | Field Name | Description |
|---|---|---|
| 0 | Enable | Enable Counter Mode |
| 1 | Disable | Disable Counter Mode |

Table 56 below illustrates values for Output Feedback Sub-Packet IDs.

TABLE 5

Sub-Packet ID - Management - M4-Streaming Delivery - SRTP - Encryption - Cipher - AES - Output Feedback - Value

| Value | Field Name | Description |
|---|---|---|
| 0 | Enable | Enable Output Feedback |
| 1 | Disable | Disable Output Feedback |

Table 57 below illustrates values for F8 Mode Sub-Packet IDs.

TABLE 6

Sub-Packet ID - Management - M4-Streaming Delivery - SRTP - Encryption - Cipher - AES - F8 Mode - Value

| Value | Field Name | Description |
|---|---|---|
| 0 | Enable | Enable F8 Mode |
| 1 | Disable | Disable F8 Mode |

Table 58 below illustrates definitions for Key Derivation Sub-Packet IDs.

TABLE 7

Sub-Packet ID - Management - M4-Streaming Delivery - SRTP - Encryption - Ke Derivation - Definition

| ID | Field Name | Description |
|---|---|---|
| 0.2.4.3.2.2.0 | Disable | Disable Key Derivation |
| 0.2.4.3.2.2.1 | Encryption Keys | Encryption Key Derivation Method |
| 0.2.4.3.2.2.2 | Authenticate Keys | Authentication Key Derivation Method |
| 0.2.4.3.2.2.3 | Other | TBD |

Table 59 below illustrates definitions for Encryption Key Sub-Packet IDs.

TABLE 8

Sub-Packet ID - Management - M4-Streaming Delivery - SRTP - Encryption - Key Derivation - Encryption Keys - Definition

| ID | Field Name | Description |
|---|---|---|
| 0.2.4.3.2.2.1.0 | Disable | Disable Encryption Keys |
| 0.2.4.3.2.2.1.1 | ZRTP | Zimmerman RTP Extension (Diffie-Hellman) |
| 0.2.4.3.2.2.1.2 | Mikey | Multimedia Internet Keying |
| 0.2.4.3.2.2.1.3 | Other | TBD |

Table 60 below illustrates values for ZRTP Sub-Packet IDs.

TABLE 9

Sub-Packet ID - Management - M4-Streaming Delivery - SRTP - Encryption - Key Derivation - Encryption Keys - ZRTP - Value

| Value | Field Name | Description |
|---|---|---|
| 0 | Enable | Enable ZRTP |
| 1 | Disable | Disable ZRTP |

Table 61 below illustrates values for Mikey Sub-Packet IDs.

TABLE 10

Sub-Packet ID - Management - M4-Streaming Delivery - SRTP - Encryption - Key Derivation - Encryption Keys - Mikey - Value

| Value | Field Name | Description |
|---|---|---|
| 0 | Enable | Enable Mikey |
| 1 | Disable | Disable Mikey |

Table 62 below illustrates definitions for Authenticate Keys Sub-Packet IDs.

TABLE 11

Sub-Packet ID - Management - M4-Streaming Delivery - SRTP -
Encryption - Key Derivation - Authenticate Keys - Definition

| ID | Field Name | Description |
|---|---|---|
| 0.2.4.3.2.2.2.0 | Disable | Disable Authenticate Keys |
| 0.2.4.3.2.2.2.1 | ZRTP | Zimmerman RTP Extension (Diffie-Hellman) |
| 0.2.4.3.2.2.2.2 | Mikey | Multimedia Internet Keying |
| 0.2.4.3.2.2.2.3 | Other | TBD |

Table 63 below illustrates values for ZRTP Sub-Packet IDs.

TABLE 12

Sub-Packet ID - Management - M4-Streaming Delivery - SRTP -
Encryption - Key Derivation - Authenticate Keys - ZRTP - Value

| Value | Field Name | Description |
|---|---|---|
| 0 | Enable | Enable ZRTP |
| 1 | Disable | Disable ZRTP |

Table 64 below illustrates values for Mikey Sub-Packet IDs.

TABLE 13

Sub-Packet ID - Management - M4-Streaming Delivery - SRTP -
Encryption - Key Derivation - Authenticate Keys - Mikey - Value

| Value | Field Name | Description |
|---|---|---|
| 0 | Enable | Enable Mikey |
| 1 | Disable | Disable Mikey |

Table 65 below illustrates definitions for Key Exchange Sub-Packet IDs.

TABLE 14

Sub-Packet ID - Management - M4-Streaming Delivery -
SRTP - Encryption - Key Exchange - Definition

| ID | Field Name | Description |
|---|---|---|
| 0.2.4.3.2.3.0 | Disable | Disable Key Exchange |
| 0.2.4.3.2.3.1 | SDES | Session Description protocol for media streams |
| 0.2.4.3.2.3.2 | Other | TBD |

Table 66 below illustrates values for SDES Sub-Packet IDs.

TABLE 15

Sub-Packet ID - Management - M4-Streaming Delivery -
SRTP - Encryption - Key Exchange - SDES - Value

| Value | Field Name | Description |
|---|---|---|
| 0 | Enable | Enable SDES |
| 1 | Disable | Disable SDES |

XLC Sub-Packet ID—M5-File Delivery

File delivery support is required by several of the planned services including PPV, CA, Datacasting, and Notification (alerts, billing, location, targeted advertisement). The file delivery should be internet compatible so that the broadcasters can efficiently transfer their data throughout the Broadcast Network and take advantage of the wealth of internet IP already developed.

File Delivery Over Unidirectional Transport (FLUTE) is a file transfer protocol built over Asynchronous Layer Coding (ALC). ALC is a protocol designed to support massively scalable multicast distribution. ALC supports FLUTE by taking the objects handled in FLUTE and generating packets of appropriate size and rate to transfer them reliably. ALC specifies the session description for receivers who wish to join, but does not specify how the session information is transferred. ALC also supports massively scalable congestion control.

FLUTE handles data as objects, saving the context. FLUTE is a mechanism for signaling and mapping the properties of a file to concepts in ALC in such a way that the properties and context can be restored and the files delivered appropriately at the receiver. FLUTE may fix the transmission rate for the files transferred, for the duration of the session.

FLUTE supports five types of file delivery sessions:

Static file delivery session

Fixed content delivery session

Dynamic file delivery system

Static file delivery carousel

Dynamic file delivery carousel

Static File Delivery Session (SFDS) is a session where the files to be delivered are predefined. The version of a file may change during the session, but only one version of a file is delivered at any given time. Fixed Content Delivery System (FCDS) is a session where the files to be delivered and their content are statically defined. The files specified and their version numbers remain constant for the duration of the session. Dynamic File Delivery System (DFDS) is a session where the set of files and the file versions may change. Static File Delivery Carousel is a time unbounded file delivery system where the set of files and their version are static. The objects arrive in a set pattern that repeats periodically. Dynamic File Delivery Carousel is a time unbounded file delivery system with a changing set of possible added/deleted/changed files being delivered.

Table 67 below illustrates definitions for M5 File Delivery Sub-Packet IDs.

TABLE 16

Sub-Packet ID - Management - M5 File Delivery - Definition

| ID | Field Name | Description |
|---|---|---|
| 0.2.5.0 | Disable | Disable File Delivery |
| 0.2.5.1 | FLUTE | File transfer Protocol |
| 0.2.7.2 | Other | TBD |

Table 68 below illustrates definitions for FLUTE Sub-Packet IDs.

TABLE 17

Sub-Packet ID - Management - M5 File Delivery - FLUTE - Definition

| ID | Field Name | Description |
|---|---|---|
| 0.2.5.1.0 | Disable | Disable FLUTE |
| 0.2.5.1.1 | ALC | Asynchronous Layered Coding |
| 0.2.5.1.2 | LCT | Layered Coding Transport |
| 0.2.5.1.3 | CC | Congestion Control |
| 0.2.5.1.4 | FEC | Forward Error Correction |
| 0.2.5.1.5 | Carousels | Carousel Data Structure |
| 0.2.5.1.6 | Other | TBD |

Table 69 below illustrates values for ALC Sub-Packet IDs.

TABLE 18

| Sub-Packet ID - Management - M5 File Delivery - FLUTE - ALC - Value | | |
|---|---|---|
| Value | Field Name | Description |
| 0 | Enable | Enable ALC |
| 1 | Disable | Disable ALC |

Layer Coding Transport (LCT) is a protocol that provides in band session management functionality.

Table 70 below illustrates values for LCT Sub-Packet IDs.

TABLE 19

| Sub-Packet ID - Management - M5 File Delivery - FLUTE - LCT - Value | | |
|---|---|---|
| Value | Field Name | Description |
| 0 | Enable | Enable LCT |
| 1 | Disable | Disable LCT |

Table 71 below illustrates values for CC Sub-Packet IDs.

TABLE 20

| Sub-Packet ID - Management - M5 File Delivery - FLUTE - CC - Value | | |
|---|---|---|
| Value | Field Name | Description |
| 0 | Enable | Enable CC |
| 1 | Disable | Disable CC |

Forward Error Correction (FEC) for the FLUTE protocol will be LDPC codes and others.

Table 72 below illustrates values for FEC Sub-Packet IDs.

TABLE 21

| Sub-Packet ID - Management - M5 File Delivery - FLUTE - FEC - Value | | |
|---|---|---|
| Value | Field Name | Description |
| 0 | Enable | Enable FEC |
| 1 | Disable | Disable FEC |

Table 73 below illustrates values for Carousels Sub-Packet IDs.

TABLE 22

| Sub-Packet ID - Management - M5 File Delivery - FLUTE - Carousels - Value | | |
|---|---|---|
| Value | Field Name | Description |
| 0 | Enable | Enable Carousels |
| 1 | Disable | Disable Carousels |

XLC Sub-Packet ID—M6-Application

For the current structure the specifics are defined under parts of M2, M3, M4, M7, and M8 as shown in the system layer diagram (FIG. 16).

Datacasting

All datacasting data can be localized per GPS (GEO location) information or participation in selected user groups. End user devices can monitor streams per subscription and per location information with data tagged to facilitate extraction according to user interests. Examples include:
 Stock/Sports Tickers
 Location MAPS (local)
 Traffic Alerts
 Weather Reports/Warnings
 Programming Promotions
 Retailer Advertising
 Data can be cached opportunistically while the user has their device powered.

Interactive Support
 Mobile handheld devices that incorporate return or back channel capability will be able to take advantage of interactive services support. Services may include
 Location Determination
 Local Area Map Access
 Maps already indexed to location reported by Geo coordinates.
 3D Terra Server like MAPS
 PPV content selection and ordering
 Could order content for delivery to home PC or other account.
 Previews sent to phone would group users to all order from a limited number of choices that could be support by the robust stream.
 QoS Statistics Monitoring
 End User receivers compile set of statistics and opportunistically send data back to Broadcaster.
 Transmitter Initiated BIST
 Test signals built into robust stream, sent out periodically. End user receivers are exercised by tests and report failures to user on user interface. Also results are sent back to Broadcaster.
 Automatic Firmware Upgrades
 Small dedicated robust stream for some portion of day
 BIST results could trigger download.
 Some upgrades would be across all users.
 A/V Messaging (RX/TX)
 Support for users to send audio visual messages to multicast groups.
 Web Browsing
 Could implement popular web pages (Austin's Pizza), as user interface for vendors. Vendors pay to have 'one click ordering' interface for their business.
 Electronic Billing
 Single stroke payment option for customers.
 Advance Movie Scheduling
 Schedule movie through cell or laptop, sent by low bitrate download over time.
 User Participation in Interactive Television and Radio Programming.
 Regional Specific Programming: viewers watch program, vote on which way the plot should go, then optional ending selected per Broadcasting area. Program may end one way in Chicago, another way in Miami.

Service Discovery
 Service discovery is the process of scanning channels, locating transmitters in range and taking a survey of offered services at each transmitter available to the user. The transmitter transmits a table of services with the data for ESG/EPG for their station. The data in this table can be augmented to carry information for all programming available in the area. All the information should be available on each channel, and should include programming for at least the next 48 hours.
 Another informational unit will be needed to package the information for all other services from all other channels, which should include the support parameters needed to receive a stream. Some devices will be low cost, low power and will not be able to receive all streams/services. The support parameters can be used to select streams/services that a given device is capable of processing.

Handoff

Handoff in the Broadcast network should be seamless and invisible to the user whenever possible. Numerous handoff cases should be considered in the design of a handoff algorithm. Three of those cases are presented here.

Figure 24:
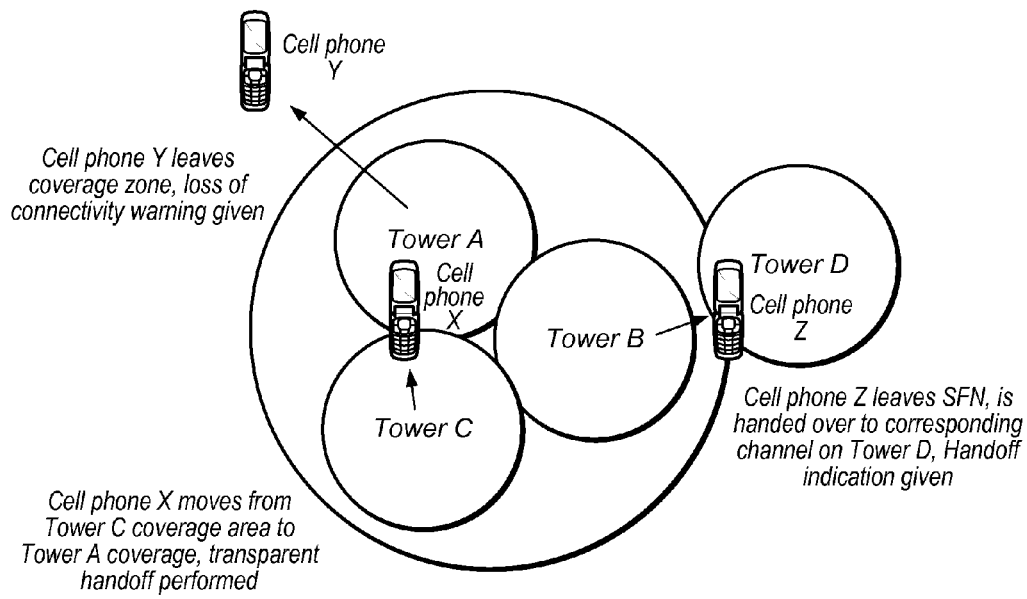
FIG. 24 illustrates handoff cases for Single Frequency Network (SFN) and non SFN broadcasters.

FIG. 24 illustrates handoff cases for SFN and non SFN broadcasters.

The first type of handover will be between two towers in a Single Frequency Network (SFN). This case is shown in FIG. 24 as mobile device X leaving the coverage area of tower C and moving into the coverage area of tower A. For two towers in the same SFN, the transmit signals are synchronized, and the program content is the same for both channels. For this case the signal at the handover point will look like a strong multipath case, but will otherwise be inherently seamless.

The second case is shown as mobile device Y leaving the coverage area of tower A, but proceeding into an area without broadcast coverage. Finding no other tower to complete the handover, the expected behavior is for the radio to preserve the quality of service as long as the current connection is maintained.

The third case is shown as mobile device Z leaving the coverage area of tower B and proceeding toward tower D, which is not in the SFN, and so may have the same content as the viewer was consuming, but on a different channel. The content may not be as well synchronized. A method of preserving the service viewing, while changing to the new channel and re-synchronizing is needed.

A solution for these requirements involves using the geo-location of the towers in the vicinity, which can be known, and the geo-location of the end user radio, which can be obtained if the end user radio has positioning capability. It is reasonable to assume that most mobile devices will have this capability in the near future. Several mobile device manufacturers already include GPS receivers in their devices.

Service Monitoring (QoS)

This section addresses methods for giving the Broadcasters capability for monitoring statistics. The ability to monitor performance is one measures of the system to maximize the effectiveness of the system.

The possibility of an interactive network allows for near real time network optimization. It is possible for the Broadcaster to receive feedback on the quality of end user experience through multiple paths. With a continuous stream of information feedback, the Broadcaster can periodically re-optimize the coding schemes, data rates, content offered in robust streams, etc. For example, the Broadcaster could offer a popular movie to a given multicast group, and once a sufficient number of orders is received, can dedicate a robust stream for download to the receiver. If the Broadcaster wants to evaluate a more efficient coding scheme, it can use XLC to program a subset of receivers and collect statistics to monitor the effectiveness of the new scheme on a sample of the end user equipment. The receiver might additionally determine the need for change in the current configuration of the communication layers and feed control information back accordingly to configure the transmitter.

In order to optimize that Broadcast network in near real time, the Broadcaster can provide a network of representative receiver devices that will be deployed around populated sites in the Broadcast Area. In order to get representative data for the M/H environment, the sensors can be mounted on buses, trains, in static locations and can be given to targeted users. The data sent back can be used to optimize in near real time the Broadcast network with respect to weather, QoS statistics and even location.

1.

These representative receivers can be further used to determine channel utilization in terms of the number of devices tuned to consume particular program content, time watched, frequency of viewing, etc as a method of audience measurement akin to the Nielsen Ratings.

XLC Sub-Packet ID—M7-CAS

Conditional Access (CA) is a means of protection requiring certain criteria be met before granting access to content. The conditional criteria are defined by the service provider. CA focuses on protecting content at the transport level. There is support in the PSI for signaling which content is subjected to CA.

The recommended strategy for supporting conditional access is the solution devised by the DVB group. The component parts are as follows:

DVB-CA (conditional access)

DVB-CSA (the Common Scrambling Algorithm)

DVB-CI (the Common Interface)

The DVB system uses a combination of scrambling and encryption to protect the media content. The transmitter sends a key to use in descrambling the stream using a decryption smartcard. The scrambling keys are passed in an encrypted entitlement control message (ECM), and are changed approximately every 10 seconds. The permission to descramble the stream is passed in a separate message called the entitlement management message (EMM), which is changed every 12 minutes.

There is a software based Downloadable Conditional Access System (DCAS) under development in cooperation with the US Government. The method also requires a specialized operating system, OCAP.

Table 74 below illustrates definitions of M7 CAS Sub-Packet IDs.

TABLE 23

Sub-Packet ID - Management - M7 CAS - Definition

| ID | Field Name | Description |
|---|---|---|
| 0.2.7.0 | Disable | Disable CAS |
| 0.2.7.1 | CA Scrambler | Method of scrambling used for conditional access |
| 0.2.7.2 | SAS | Session Announcement |
| 0.2.7.3 | SMS | Short Message Service |
| 0.2.7.4 | MMS | Multimedia Messaging Service |
| 0.2.7.5 | PPV | Pay-Per-View |
| 0.2.7.6 | Other | TBD |

Table 75 below illustrates values of CA Scrambler Sub-Packet IDs.

TABLE 24

Sub-Packet ID - Management - M7 CAS - CA Scrambler - Value

| Value | Field Name | Description |
|---|---|---|
| 0 | Enable | Enable CA Scrambler |
| 1 | Disable | Disable CA Scrambler |

Table 76 below illustrates values of SAS Sub-Packet IDs.

TABLE 25

| Sub-Packet ID - Management - M7 CAS - SAS - Value | | |
|---|---|---|
| Value | Field Name | Description |
| 0 | Enable | Enable SAS |
| 1 | Disable | Disable SAS |

Short Message Service (SMS) is a method of defining text messages.

Table 77 below illustrates values of SMS Sub-Packet IDs.

TABLE 26

| Sub-Packet ID - Management - M7 CAS - SMS - Value | | |
|---|---|---|
| Value | Field Name | Description |
| 0 | Enable | Enable SMS |
| 1 | Disable | Disable SMS |

Multimedia messaging service, is a telephony standard for sending multimedia objects (pictures, video, text, rich text, etc.).

Table 78 below illustrates values for MMS Sub-Packet IDs.

TABLE 27

| Sub-Packet ID - Management - M7 CAS - MMS - Value | | |
|---|---|---|
| Value | Field Name | Description |
| 0 | Enable | Enable MMS |
| 1 | Disable | Disable MMS |

Typically, a Pay Per View (PPV) model for content delivery makes the offered content available to a viewer on a limited time basis. The model does not currently support permanent content retention. Material sent to end user would be time stamped for viewing during a given interval of time. The replay mechanism will check the timestamp to validate content for replay. The content is usually encrypted using the AES methodology specified for SRTP.

Table 79 below illustrates values for PPV Sub-Packet IDs.

TABLE 28

| Sub-Packet ID - Management - M7 CAS - PPV - Value | | |
|---|---|---|
| Value | Field Name | Description |
| 0 | Enable | Enable PPV |
| 1 | Disable | Disable PPV |

XLC Sub-Packet ID—M8-DRM

Digital Rights Management is the term applied to a set of methods content providers apply to control the viewing and distribution of their IP. Good Digital Rights Management is a combination of DRM techniques that adequately protect content distribution, but do not adversely affect the end user experience when consuming content in line with recommended use cases. The DRM methods are outlined below.

It is suggested that audio content passed to another user should allow a small number of replays before the user of the data is required to obtain the Rights Management Object (RMO). This would allow for the passing of music in situations where it is difficult to obtain the RMO, thus mitigating end user frustration and possible objection to DRM.

It is suggested that for video content, the passing of content should allow for some level of access rights. For example, passed video could allow the playing of a preview, access to the extra features and the playing of some portion of the video.

Table 80 below illustrates definitions for M8 DRM Sub-Packet IDs.

TABLE 29

| Sub-Packet ID - Management - M8 DRM - Definition | | |
|---|---|---|
| ID | Field Name | Description |
| 0.2.8.0 | Disable | Disable DRM |
| 0.2.8.1 | Scrambling | Content scrambling methodology |
| 0.2.7.2 | Encryption | Specification of encryption methods which include cipher, key derivation and key exchange |
| 0.2.8.3 | Content Protection | Combination of content protection methods |
| 0.2.8.4 | Copy Control | Control of content copying |
| 0.2.8.5 | File Format | Control of File Format |
| 0.2.8.6 | Other | TBD |

Table 81 below illustrates definitions for Scrambling Sub-Packet IDs.

TABLE 30

| Sub-Packet ID - Management - M8 DRM - Scrambling - Definition | | |
|---|---|---|
| ID | Field Name | Description |
| 0.2.8.1.0 | Disable | Disable Scrambling |
| 0.2.8.1.1 | CSS | Content Scrambling System |
| 0.2.8.1.2 | Other | TBD |

Table 82 below illustrates values for CSS Sub-Packet IDs.

TABLE 31

| Sub-Packet ID - Management - M8 DRM - Scrambling - CSS - Value | | |
|---|---|---|
| Value | Field Name | Description |
| 0 | Enable | Enable CSS |
| 1 | Disable | Disable CSS |

Table 83 below illustrates definitions for Encryption Sub-Packet IDs.

TABLE 32

| Sub-Packet ID - Management - M8 DRM - Encryption - Definition | | |
|---|---|---|
| ID | Field Name | Description |
| 0.2.8.2.0 | Disable | Disable Encryption |
| 0.2.8.2.1 | Cipher | Encryption Method |
| 0.2.8.2.2 | Key Derivation | Key Derivation Method |
| 0.2.8.2.3 | Key Exchange | Key Exchange Method |
| 0.2.8.2.4 | Other | TBD |

Table 84 below illustrates values for Cipher Sub-Packet IDs.

TABLE 33

Sub-Packet ID - Management - M8 DRM - Encryption - Cipher - Value

| Value | Field Name | Description |
|---|---|---|
| 0 | Enable | Enable Cipher |
| 1 | Disable | Disable Cipher |

Table 85 below illustrates values for Key Derivation Sub-Packet IDs.

TABLE 34

Sub-Packet ID - Management - M8 DRM - Encryption - Key Derivation - Value

| Value | Field Name | Description |
|---|---|---|
| 0 | Enable | Enable Key Derivation |
| 1 | Disable | Disable Key Derivation |

Table 86 below illustrates values for Cipher Sub-Packet IDs.

TABLE 35

Sub-Packet ID - Management - M8 DRM - Encryption - Cipher - Value

| Value | Field Name | Description |
|---|---|---|
| 0 | Enable | Enable Key Exchange |
| 1 | Disable | Disable Key Exchange |

Table 87 below illustrates values for Content Protection VSIW Sub-Packet IDs.

TABLE 36

VSIW Sub-Packet ID - Management - M8 DRM - Content Protection - Value

| Value | Field Name | Description |
|---|---|---|
| 0.2.8.3.0 | Disable | Disable Content Protection |
| 0.2.8.3.1 | PVP | Protect Video Path |
| 0.2.8.3.2 | AACS | Advanced Access Content System |
| 0.2.8.3.3 | Other | TBD |

Table 88 below illustrates values for PVP Sub-Packet IDs.

TABLE 37

Sub-Packet ID - Management - M8 DRM - Content Protection - PVP - Value

| Value | Field Name | Description |
|---|---|---|
| 0 | Enable | Enable PVP |
| 1 | Disable | Disable PVP |

Table 89 below illustrates values for AACS Sub-Packet IDs.

TABLE 38

Sub-Packet ID - Management - M8 DRM - Content Protection - AACS - Value

| Value | Field Name | Description |
|---|---|---|
| 0 | Enable | Enable AACS |
| 1 | Disable | Disable AACS |

Table 90 below illustrates definitions for Copy Control Sub-Packet IDs.

TABLE 39

Sub-Packet ID - Management - M8-DRM - Copy Control - Definition

| ID | Field Name | Description |
|---|---|---|
| 0.2.8.4.0 | Disable | Disable Copy Control |
| 0.2.8.4.1 | Copy Control | Copy Control |
| 0.2.8.4.2 | CDS | Cactus Data Shield |
| 0.2.8.4.3 | Watermarks | Watermark Method |
| 0.2.8.4.4 | Forward Lock | Forward Lock |
| 0.2.8.4.5 | Separate Delivery | Separate Delivery |
| 0.2.8.4.6 | Other | TBD |

Table 91 below illustrates values for Copy Control Sub-Packet IDs.

TABLE 40

Sub-Packet ID - Management - M8-DRM - Copy Control - Copy Control - Value

| Value | Field Name | Description |
|---|---|---|
| 0 | Enable | Enable Copy Control |
| 1 | Disable | Disable Copy Control |

With combined delivery the content is sent to the end user combined with another file that defines the rights of the content.

Table 92 below illustrates values for CDS Sub-Packet IDs.

TABLE 41

Sub-Packet ID - Management - M8-DRM - Copy Control - CDS - Value

| Value | Field Name | Description |
|---|---|---|
| 0 | Enable | Enable CDS |
| 1 | Disable | Disable CDS |

Watermarking has been suggested to supplant the use of DRM. In some markets, the use of DRM has seen significant resistance and a less restrictive form of rights protection is desirable. Watermarking entails inserting special data into the media content in a way that is not noticeable to the end user. The idea is that when an end user purchases media, a code tying the media to that user will be inserted. If the user attempts to distribute the media in an unauthorized way, the content providers have a way to track where the original came from.

In a broadcast system, broadcast data could be watermarked with identifying information from the receiver. If data is passed from device to device, the receiver could check the watermark against the playing receiver's information and take a specified action. The action to take could be specified through the XLC stream, and changed if end user reaction was excessively adverse. The receiver action could also be to forward back information about the event through an opportunistic return channel.

It is also possible to incorporate reversible watermarks in the data. The watermark could be inserted and then reversed upon validation of content rights.

Table 93 below illustrates definitions for Watermarks Sub-Packet IDs.

TABLE 42

Sub-Packet ID - Management - M8-DRM - Copy Control - Watermarks - Definition

| ID | Field Name | Description |
| --- | --- | --- |
| 0.2.8.4.3.0 | Disable | Disable Watermarks |
| 0.2.8.4.3.1 | Method 1 | Method |
| 0.2.8.4.3.2 | Method 2 | Method |
| 0.2.8.4.3.3 | Other | TBD |

Table 94 below illustrates values for Method 1 Sub-Packet IDs.

TABLE 43

Sub-Packet ID - Management - M8-DRM - Copy Control - Watermarks - Method 1 - Value

| Value | Field Name | Description |
| --- | --- | --- |
| 0 | Enable | Enable Method 1 |
| 1 | Disable | Disable Method 1 |

Table 95 below illustrates values for Method 2 Sub-Packet IDs.

TABLE 44

Sub-Packet ID - Management - M8-DRM - Copy Control - Watermarks - Method 2 - Value

| Value | Field Name | Description |
| --- | --- | --- |
| 0 | Enable | Enable Method 2 |
| 1 | Disable | Disable Method 2 |

This is a method of copy control where the content is sent to the end user wrapped in a DRM header. The receiving device does not support forwarding content to another user (exclude the option in the user interface).

Table 96 below illustrates values for Forward Lock Sub-Packet IDs.

TABLE 45

Sub-Packet ID - Management - M8-DRM - Copy Control - Forward Lock - Value

| Value | Field Name | Description |
| --- | --- | --- |
| 0 | Enable | Enable Forward Lock |
| 1 | Disable | Disable Forward Lock |

Separate Delivery is a more powerful form of DRM. This method specifies that the content is downloaded to the user encrypted. The SMS file that contains the Rights Object is downloaded sometime later (seconds, minutes). The end user does not have the ability to view or forward the content without the Rights Object.

Table 97 below illustrates values for Separate Delivery Sub-Packet IDs.

TABLE 46

Sub-Packet ID - Management - M8-DRM - Copy Control - Separate Delivery - Value

| Value | Field Name | Description |
| --- | --- | --- |
| 0 | Enable | Enable Separate Delivery |
| 1 | Disable | Disable Separate Delivery |

Content protection can be achieved by coding the content in a data format not supported by publically available audio and video players. Examples would be binary or base64.

Table 98 below illustrates definitions for File Format Sub-Packet IDs.

TABLE 47

Sub-Packet ID - Management - M8-DRM - File Format - Definition

| ID | Field Name | Description |
| --- | --- | --- |
| 0.2.8.5.0 | Disable | Disable File Format |
| 0.2.8.5.1 | Base64 | Control base64 |
| 0.2.8.5.2 | Binary | Control binary |
| 0.2.8.5.3 | Other | TBD |

Table 99 below illustrates values for Base64 Sub-Packet IDs.

TABLE 48

Sub-Packet ID - Management - M8-DRM - File Format - Base64 - Value

| Value | Field Name | Description |
| --- | --- | --- |
| 0 | Enable | Enable Base64 |
| 1 | Disable | Disable Base64 |

Table 100 below illustrates values for Binary Sub-Packet IDs.

TABLE 49

Sub-Packet ID - Management - M8-DRM - File Format - Binary - Value

| Value | Field Name | Description |
| --- | --- | --- |
| 0 | Enable | Enable Binary |
| 1 | Disable | Disable Binary |

XLC Presentation Sub-Packet ID

The XLC Presentation Layer is defined in the following Tables.

Table 101 below illustrates definitions of the XLC presentation layer.

TABLE 50

Sub-Packet ID - Presentation Definition

| ID | Field Name | Description |
| --- | --- | --- |
| 0.3.0 | Disable | Disable Presentation |
| 0.3.1 | P1 Video Codecs | Video Codecs |
| 0.3.2 | P2 Audio Codecs | Audio Codecs |
| 0.3.3 | P3 Captioning | Closed Captioning Format |
| 0.3.4 | P4 Graphic Elements | Graphical User Interface (GUI) |
| 0.3.5 | P5 Service Guide | PSIP, EPG, ESG |
| 0.3.6 | Other | TBD |

Table 102 below illustrates definitions for P1 Video Codec Sub-Packet IDs.

TABLE 51

| Sub-Packet ID - Presentation - P1 Video Codecs - Definition | | |
|---|---|---|
| ID | Field Name | Description |
| 0.3.1.0 | Disable | Disable Video Codecs |
| 0.3.1.1 | MPEG-2 | MPEG-2 |
| 0.3.1.2 | MPEG-4 | MPEG-4 AVC |
| 0.3.1.3 | H.264 | H.264 |
| 0.3.1.4 | VC-1 | VC-1 |
| 0.3.1.5 | Other | TBD |

Table 103 below illustrates values for MPEG-2 Sub-Packet IDs.

TABLE 52

| Sub-Packet ID - Management - P1 Video Codecs - MPEG-2 - Value | | |
|---|---|---|
| Value | Field Name | Description |
| 0 | Enable | Enable MPEG-2 |
| 1 | Disable | Disable MPEG-2 |

Table 104 below illustrates values for MPEG-4 Sub-Packet IDs.

TABLE 53

| Sub-Packet ID - Management - P1 Video Codecs - MPEG-4 - Value | | |
|---|---|---|
| Value | Field Name | Description |
| 0 | Enable | Enable MPEG-4 |
| 1 | Disable | Disable MPEG-4 |

Table 105 below illustrates definitions for P2 Audio Codec Sub-Packet IDs.

TABLE 54

| Sub-Packet ID - Presentation - P2 Audio Codecs - Definition | | |
|---|---|---|
| ID | Field Name | Description |
| 0.3.2.0 | Disable | Disable Audio Codecs |
| 0.3.2.1 | AC-3 | AC-3 |
| 0.3.2.2 | AAC | Advanced Audio Coding |
| 0.3.2.3 | MP3 | MP3 |
| 0.3.2.4 | Other | TBD |

Table 106 below illustrates values for AC-3 Sub-Packet IDs.

TABLE 55

| Sub-Packet ID - Management - P1 Audio Codecs - AC-3 - Value | | |
|---|---|---|
| Value | Field Name | Description |
| 0 | Enable | Enable AC-3 |
| 1 | Disable | Disable AC-3 |

Table 107 below illustrates definitions for P3 Captioning Sub-Packet IDs.

TABLE 56

| Sub-Packet ID - Presentation - P3 Captioning - Definition | | |
|---|---|---|
| ID | Field Name | Description |
| 0.3.3.0 | Disable | Disable Captioning |
| 0.3.3.1 | Line 21 | Line 21 |
| 0.3.3.2 | EIA-708 | EIA-708 (Electronic Industry Alliance) |
| 0.3.3.3 | Other | TBD |

Table 108 below illustrates definitions for P4 Graphic Element Sub-Packet IDs.

TABLE 57

| Sub-Packet ID - Presentation - P4 Graphic Elements - Definition | | |
|---|---|---|
| ID | Field Name | Description |
| 0.3.4.0 | Disable | Disable Graphic Elements |
| 0.3.4.1 | Menu Bar | Menu Bar |
| 0.3.4.2 | Dialog Box | Dialog Box |
| 0.3.4.3 | Browser Window | Browser Window |
| 0.3.4.4 | Terminal Window | Terminal Window |
| 0.3.4.5 | Context Window | Context Window |
| 0.3.4.6 | Widgets | Widgets |
| 0.3.4.7 | Other | TBD |

Table 109 below illustrates definitions for P5 Service Guide Sub-Packet IDs.

TABLE 58

| Sub-Packet ID - Presentation - P5 Service Guide - Definition | | |
|---|---|---|
| ID | Field Name | Description |
| 0.3.5.0 | Disable | Disable Service Guide |
| 0.3.5.1 | Other | TBD |

XLC Packet Control Sub-Packet ID

The check sum sub-packet provides a check calculated over all the data bits in the XLC preceding the previous check sum sub-packet or start-of packet sub-packet. The length of the data field determines what type of data is included. If the length is 8 or 16 then the data is predefined as a particular CRC, otherwise the data is defined as having a 4-bit Check Type field plus check data.

Table 110 below illustrates descriptions of PC1 Check Sum Sub-Packet IDs.

TABLE 59

| XLC Sub-Packet ID - Packet Control - PC1 Check Sum | | | | |
|---|---|---|---|---|
| ID | Field Name | Sub-Field Name | # of bits | Description |
| 0.4.0 | CRC-8 | Value | 8 | Contains a CRC-8 $x^8 + x^2 + x^1 + 1$ of the data preceding this sub-packet. |
|  | CRC-16 CCITT | Value | 16 | Contains a CRC-16 CCITT $x^{16} + x^{12} + x^5 + 1$ of the data preceding this sub-packet. |
|  | Check Type | CSID Value | 4 $p_c$-4 | The type of check field This is the check data for the type of method selected where the field length is not 8 or 16 bits in length. |

Table 111 below illustrates descriptions of Check Type Sub-Packet IDs.

TABLE 60

XLC Sub-Packet ID - Packet Control - Check Sum - Check Type

| ID | Encoding Type | Description |
|---|---|---|
| 0.4.0.0 | Other | TBD |

VSIW Packet Structure

The VSIW packet structure provides a management organization framework for transmitting the XLC protocol that enables real-time and dynamic configurability, flexibility, and extensibility of the system. The VSIW packet is designed to be configurable and extensible to support dynamic and future service capabilities.

A VSIW packet is made up of a series of single VSIW Sub-Packets. Each VSIW Sub-Packet contains at least one XLC command, and in one embodiment contains only one XLC command. The VSIW converts the XLC non-systematic tree mapping known as the logical view to a systematic tree mapping known as the physical view.

Figure 25:
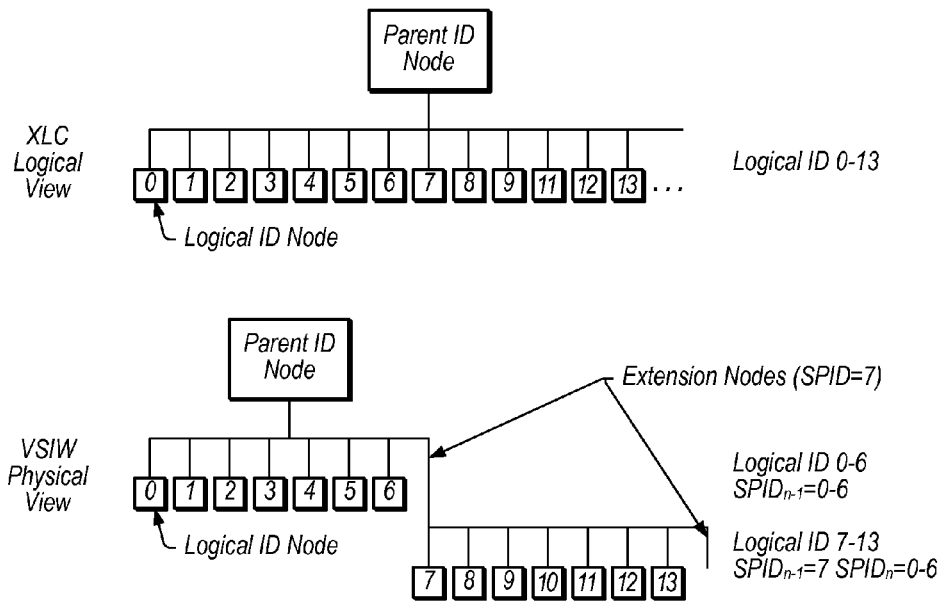
FIG. 25 illustrates an XLC logical tree vs. a VSIW physical tree.

As shown in FIG. 25, extension of a VSIW packet structure uses a special SPID value. Since the SPID is only 3-bits, it supports values from 0 to 7. The VSIW uses node 7 to identify a node extension of 7 more values.

VSIW Sub-Packet Structure

A VSIW packet can have 8 to m bits, where m is theoretically unbounded. This is further broken down into sub-packets as defined in Table 112 below illustrates descriptions of the VSIW packet structures for a single sub-packet.

Table 112 below illustrates descriptions of the VSIW packet structures for a single sub-packet.

TABLE 61

VSIW Packet Structure for a Single Sub-Packet

| # | Field Name | # bits | Description |
|---|---|---|---|
| 1 | Sub-Packet ID | 3 | The ID of the sub-packet being sent ($111_b$ is a special value) |
| 2 | Sub-Packet ID Parity | 1 | Even parity |
| 3 | Data Length | 3 | Defines the number of nibbles of data in the sub-packet (0 is a special value) |
| 4 | Data Length Parity | 1 | Even parity |
| 5a | Payload Data | p | Data payload length is variable in nibble (4-bit) increments, where p = "Data Length" * 4-bits |
| 5b | Sub-Packet Branch ID | p | Sub-Packet Branch ID length is variable in (3-bit) increments, where p = "Data Length" * 3-bits. This field sets the current location in the command tree |

Figure 26:
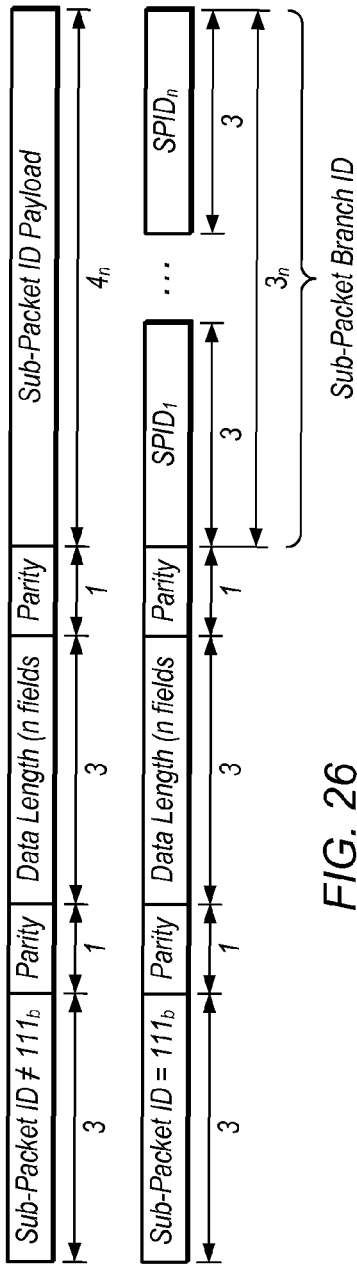
FIG. 26 illustrates a VSIW packet structure.

FIG. 26 illustrates the VSIW Packet Structure according to one embodiment.

If a sub-packet ID repeats on the subsequent sub-packet and the previous length field was $111_b$, the maximum data length, then the payload data is concatenated to create a larger payload data field. For example, if Data Length is $111_b$ and the sub-packet ID is not $111_b$ which equals 7, then p=28-bits. If the sub-packet repeats three times in a row, the payload data is now 3*p(=28)=84 bits. This concatenated value will be referred to as $p_c$ and $p_c=pp_c=p$ when the sub-packet ID does not subsequently repeat.

Figure 27:
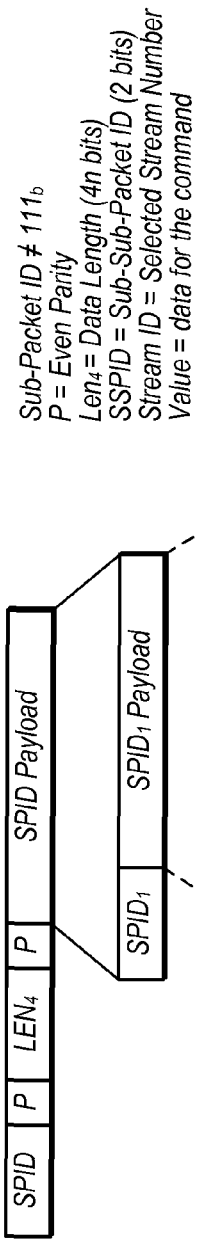
FIG. 27 illustrates a sub-packet ID (SPID) leaf node structure.

FIG. 27 illustrates the SPID Leaf Node Structure.

Each Command IDs payload may have a structure or just a value. The structure is defined as a 2-bit SSPID field plus payload. On the leaf SSPID node the payload is a stream plus a value/setting or just a value/setting.

Figure 28:
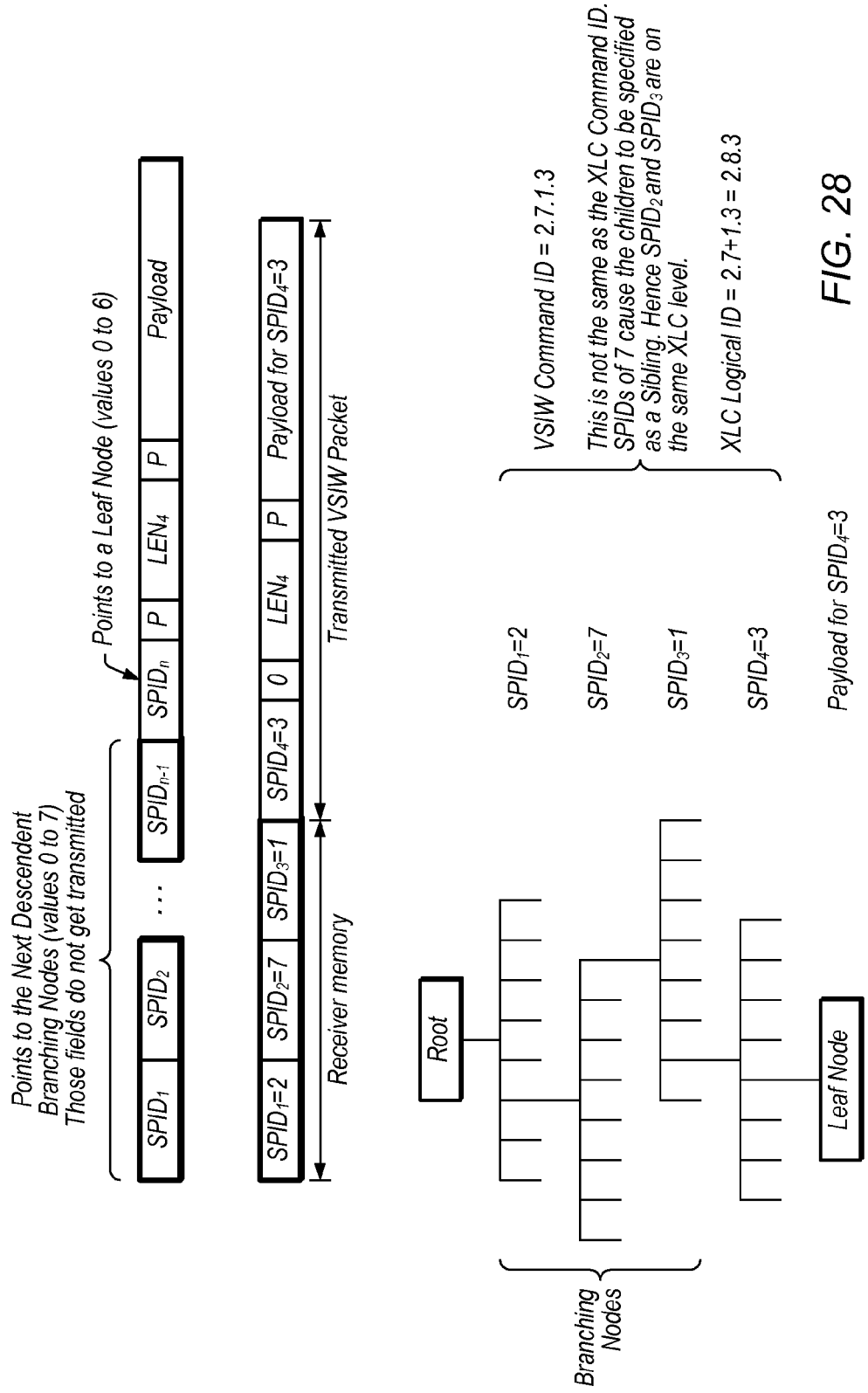
FIG. 28 illustrates a VSIW packet structure example.

FIG. 28 illustrates an example of the VSIW Packet Structure. The packet content describes how the receiving logic should navigate the tree structure and ultimately how to set parameter values at a leaf node within the tree structure.

VSIW Command Tree Traversal

A Sub-Packet ID is generally specified from a parent Sub-Packet ID, e.g., the parent may be the root of the command tree or some other point in the tree. To specify a new parent node in the XLC command tree, the tree traversal structure or branch points should be specified.

There are two methods to descend the tree structure. To descend one node at a time requires setting the data length field to 0 and specifying a Sub-Packet ID not equal to $7_d$ ($111_b$)

The Sub-Packet Branch ID describes a list of descendent branch points in the XLC command tree. To descend multiple nodes at a time requires setting the Sub-Packet ID field to $111_b$ which specifies the Sub-Packet Branch ID. This also changes the data length field to 3-bit increments. The concatenation of multiple packets works the same. For example, a Branch point is made of 1 or more 3-bit fields. The most basic branch is a value from $0_d$ to $6_d$. A value of $7_d$ ($111_b$) assumes the branch extends into a second 3-bit field, making the branch point range from $7_d$ to $13_d$. A branch point is complete when the last field is not $7_d$ ($111_b$). The remaining 3-bit fields then start a new branch point. Using this method, a branch value can extend indefinitely.

Table 113 below illustrates descriptions of the VSIW packet structure for a sub-packet branch ID.

TABLE 62

VSIW Packet Structure for Sub-Packet Branch ID

| # | Field Name | # bits | Description |
|---|---|---|---|
| 1 | Branch$_1$ | 3n | The branch point for level 1 the command tree |
| n | Branch$_n$ | 3n | The branch point for level n the command tree |

To ascend the tree structure requires setting the Sub-Packet ID to $7_d$ ($111_b$) and Data Length to 0 which allows traversal up the tree by the same number of nodes previously descended.

Figure 29:
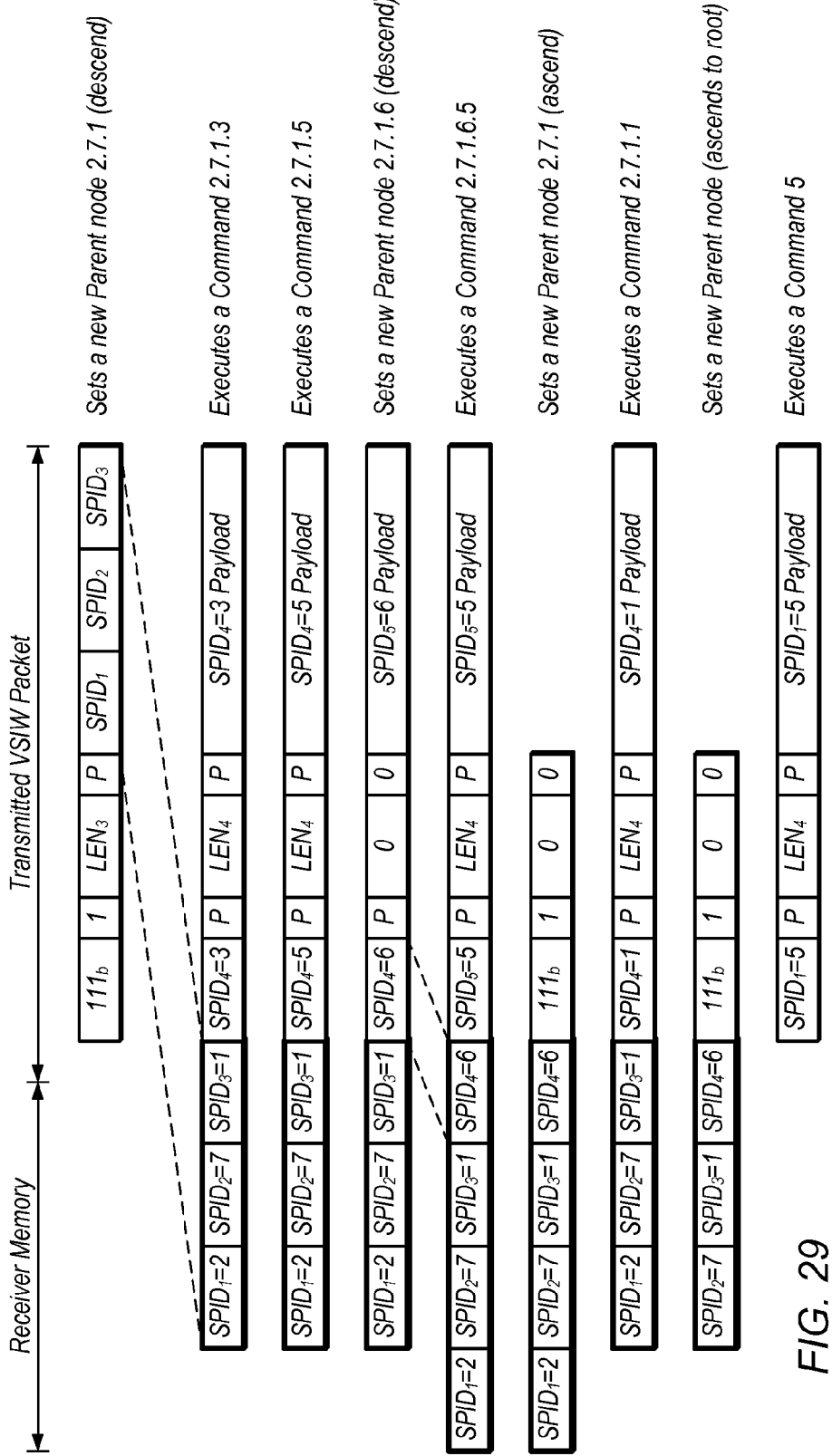
FIG. 29 illustrates an example of VSIW command tree traversal.

FIG. 29 illustrates a pictorial example of descending and ascending the tree structure. The commands contained in the VSIW packet may comprise: setting a root node in the tree structure (navigating to a root node in the tree structure), instructions to navigate within the tree structure (up or down in the tree structure, i.e., toward a root node or toward a leaf node), and setting a parameter value in a leaf node of the tree structure.

The VSIW packet may also comprise one or more commands for adding one or more nodes to the tree structure, thus extending functionality to include additional parameters in the tree structure. For instance, a new coding method may be introduced in a later revision of the M/H protocol. In order for the receivers in the mobile devices to be made aware of this new coding method, the transmit system 102 may transmit control information containing a command to add one or more nodes to the current tree structure to add the corresponding parameters for this new coding method to the tree structure. After the receiver receives and executes these command(s), this new coding method is represented by a new branch in the tree thereby extending the node associated with FEC. Likewise, a new codec type might be added under the Audio or Video Codec nodes or a new method of file delivery and associated parameter set may be added to extend functionality associated with the management layer.

The XLC Transmitted Via VSIW Packet

With the XLC organized for transmission using the Variable Stream Instruction Word (VSIW) packet and coding scheme, there are several appropriate methods to physically place and encode the VSIW packet. Methods described below include (1) over the field sync segment of the ATSC 1.0 frame structure, (2) over the physical layer [legacy] MPEG-2 transport stream, and (3) over a stream defined in (1) and/or (2), or any combination thereof.

The VSIW Packet is encapsulated inside a VSIW transport packet. The packet consists of a length field (LEN) (extensible as needed to accommodate long data fields) followed by a variable length data field (DATA). A CRC (length-16) is computed over the combined $LEN_1 | \ldots | LEN_k | DATA$ field enabling the receiver to check the integrity of the stream transport. The stream framing parameters are summarized in Table 114, below.

Table 114 below illustrates descriptions and contents of VSIW transport packet encoding.

TABLE 63

VSIW Transport packet encoding

| Field | Description | Size | Contents |
| --- | --- | --- | --- |
| LEN | Number of octets contained in the DATA field (after code-spread demodulation) | 8-bits w/ext. | [0:254]⇒[1:255 Octets] [255]⇒extends LEN field an additional 8-bits |
| VSIW | VSIW Packet data (zero padded to nearest octet boundary) | N-bits | VSIW Packet |
| CRC | Cyclic Redundancy Check calculated over the $LEN_{1 \ldots k} | DATA$ fields | 16-bits | CRC-16 CCITT $x^{16} + x^{12} + x^5 + 1$ |

Encoding the VSIW

Orthogonal Gold sequences with length $2^m$ where m equals the number of bits transmitted is used to encode the VSIW packet to be transmitted. A choice to use two 32 length sequences or one 64 length sequence is provided. To signal the beginning of a VSIW packet, a Sync code is employed that uses one 16 length sequence where only 4 of the 16 codes are used. This corresponds to 80 symbols. Tables 115 and 116 define the encoding for two 32-length sequences and one 64 length sequence, respectively.

Table 115 below defines the encoding of Packet Encoding Structure A.

TABLE 64

VSIW Sequence Structure - Packet Encoding Structure A

| Sequence | Code Type | Sequence Length | # of Bits | # of Codes |
| --- | --- | --- | --- | --- |
| Sync | Orthogonal Gold | 16 | — | 4 |
| Reserved | Stuffing | 2 | — | — |
| Data1 | Orthogonal Gold | 32 | 5 | 32 |
| Data2 | Orthogonal Gold | 32 | 5 | 32 |

Table 116 below defines the encoding of Packet Encoding Structure B.

TABLE 65

VSIW Sequence Structure - Packet Encoding Structure B

| Sequence | Code Type | Sequence Length | # of Bits | # of Codes |
| --- | --- | --- | --- | --- |
| Sync | Orthogonal Gold | 16 | — | 4 |
| Reserved | Stuffing | 2 | — | — |
| Data1 | Orthogonal Gold | 64 | 6 | 64 |

A variable stream instruction word (VSIW) packet is formed by first choosing a packet encoding structure, A or B, as described above. Once the packet encoding structure is chosen, the corresponding instruction word pair (IWP) sync code is used as described in Table 117 below. This is identified as SIPA and SIPB each defined by an orthogonal Gold sequence for packet structures A and B, respectively. This sync method is also used to create variable length VSIW instruction word by using the instruction continuation sync codes.

Table 117 below illustrates various IWP sync codes.

TABLE 66

IWP Sync Codes

| # | Sync Code | ID | Sequence Length | Orthogonal Gold Sequence |
| --- | --- | --- | --- | --- |
| 1 | Start of Instruction - Packet Structure A | SIPA | 16 | T.B.D. |
| 2 | Start of Instruction - Packet Structure B | SIPB | 16 | T.B.D. |
| 3 | Instruction Continuation 0 | MCN0 | 16 | T.B.D. |
| 4 | Instruction Continuation 1 | MCN1 | 16 | T.B.D. |

Each transmitted VSIW instruction word must be sent as a pair to conform to the ATSC DTV field sync requirements since the codes are not zero mean. The first VSIW instruction word is sent normally and the second is sent inverted. The normal and inverted state of these bits is determined by the second PN63 in the sync field, which is inverted every other field sync. This has the effect of constructing a zero mean signal. This is also to our advantage since the method of receiving is based on repetitive summation of the VSIW instruction words.

A VSIW is sent 2n times in a row, where n is an integer and which determines the repetition rate of the VSIW. The repetition rate and packet encoding structure must not change once a VSIW packet is formed, but can be changed at the start of a new VSIW packet. The VSIW repetition rate can be determined empirically at the receiver through the summation and correlation of the IWP sync code in each VSIW.

Figure 30:
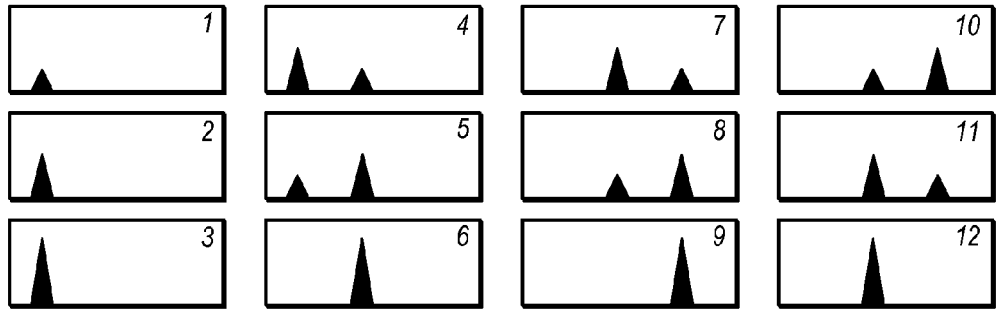
FIG. 30 illustrates cross-correlation peaks of IWP sync for a repetition rate of 3.

FIG. 30 illustrates cross-correlation peaks of IWP sync, for a repetition rate of three. With VSIW Over Field Sync, the repeat pattern may be used to improve the likelihood of reliable reception.

To enable empirical repetition rate detection, all VSIW are made equal in weight by normalizing signal strength to +/−1. We keep summing the VSIW until a peak is found between two adjacent VSIW averages. The number of VSIW to get a peak is two times the repetition rate of the IWP. Averaging over many VSIW after equalization reduces vulnerability to noise. A constant repetition rate within a packet can be detected. There are other methods not discussed here that may yield better noise immunity.

Figure 31:
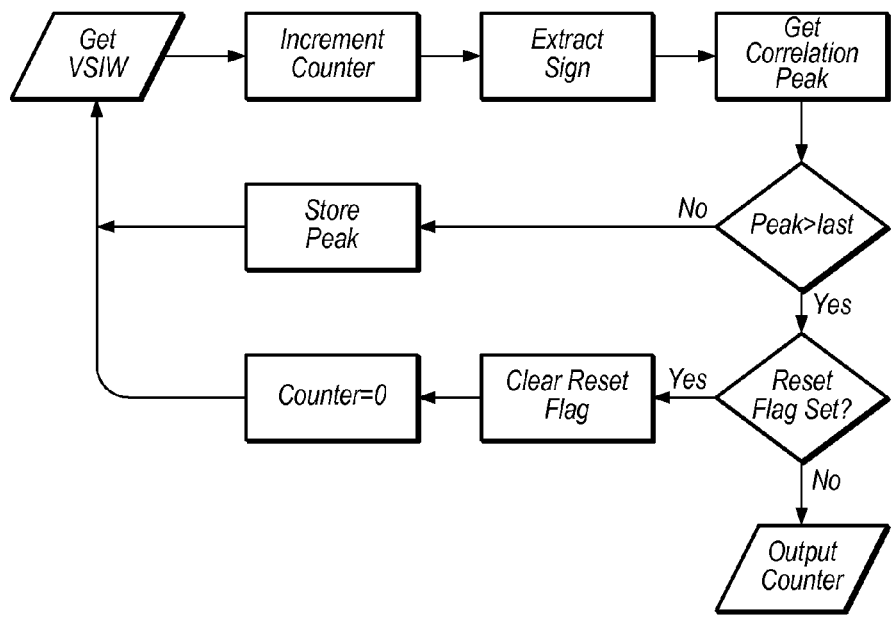
FIG. 31 is a flowchart illustrating detection of a VSIW repetition rate.

FIG. 31 is a flowchart for detecting VSIW repetition rate. FIG. 31 illustrates how to use the repeat pattern (shown in FIG. 31) to improve the reliability of the reception.

A VSIW packet should also be a minimum of a VSIW instruction word pair, with the second VSIW containing an IWP instruction sync code. To continue the message beyond two VSIWs requires alternating between the two instruction continuation codes (MC0, MC1).

Figure 32:
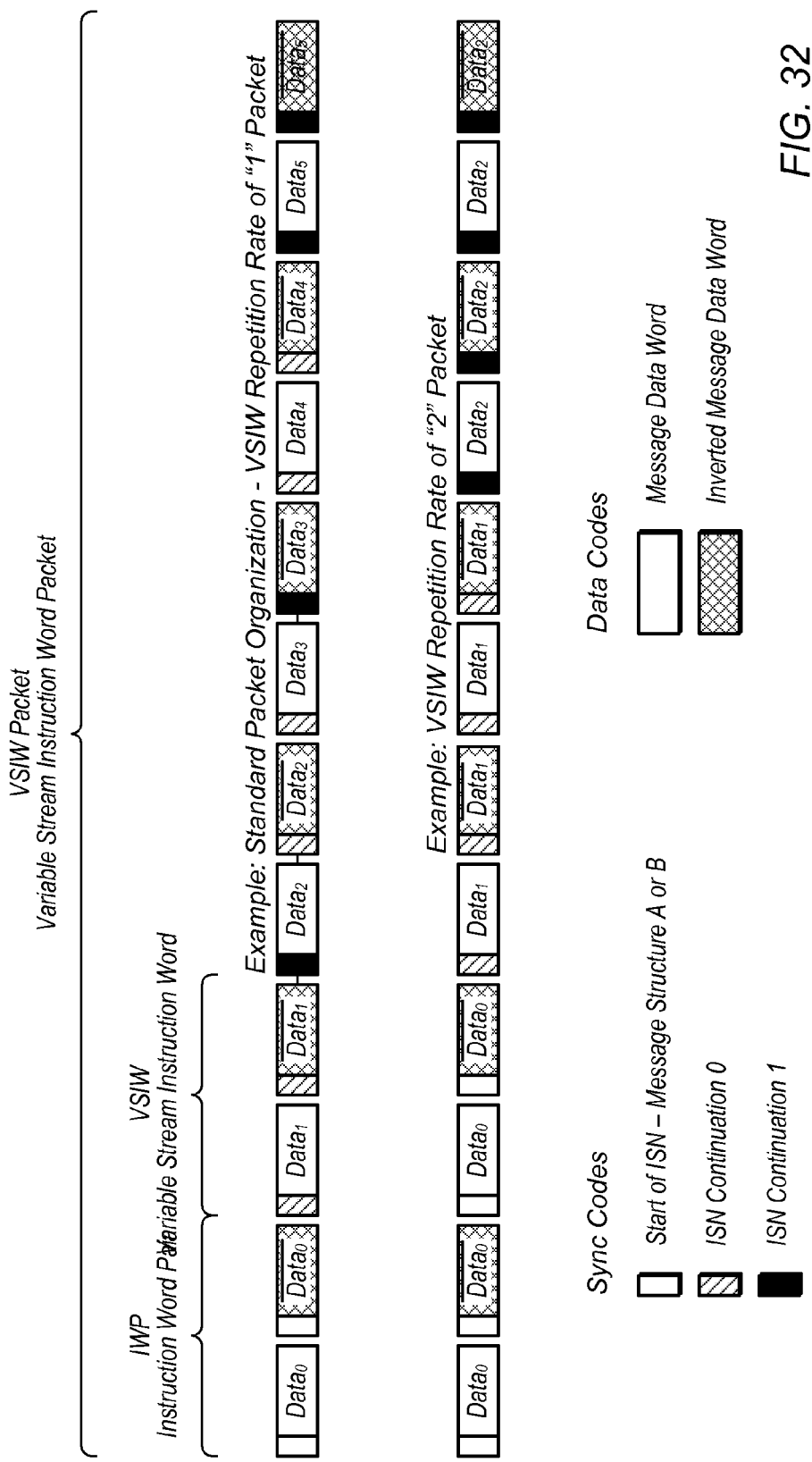
FIG. 32 illustrates a VSIW packet.

FIG. 32 illustrates a VSIW packet. The VSIW packet has various sync codes and data codes, as shown.

VSIW Sub-Packet Throughput

Using two 32 length sequences yields 10 bits every frame, 48.4 milliseconds, or 206 bps. However, averaging of up to 2 frames over 96.8 ms will lower the data rate to 103 bps. For one 64 length sequence, you get 6-bits every frame, 48.4 milliseconds, which is 124 bps at the same SNR required to receive the two 32-length sequence method. This results in 64-length sequence providing a 21 bps higher data rate. Based on an average sub-packet length of 20-bits, Table 118 below illustrates sub-packet throughput based on two packet structures A and B.

Table 118 below illustrates sub-packet throughput based on two packet structures A and B.

TABLE 118

VSIW Sub-Packet throughput versus Packet Structure

| Packet Structure | bits per VSIW | Repetition Rate | bps | Sub-Packet/Second | Overhead (bits/Sub-Packet) | Effective bps |
|---|---|---|---|---|---|---|
| A | 10 | 2 | 103.3 | 5.17 | 5 | 77.5 |
| B | 6 | 1 | 124.0 | 6.2 | 5 | 93.0 |

VSIW Performance

This section provides simulation results for the SNR required to receive the VSIW without any equalization. Since the VSIW is not susceptible to Doppler effects, it is simulated against various static ensembles. Table 119 shows VSIW performance versus repetition rate versus a selection of ensembles. A failure was measured if there was a different code detected of equal or higher amplitude. Passing means an error could not be detected over 1000 8-VSB data frames.

Table 119 below illustrates VSIW performance versus repetition rate versus a selection of ensembles.

TABLE 67

VSIW Orthogonal Gold Sequence Performance vs. Repetition Rate vs. Ensemble

| Sequence | Repetition Rate | AWGN | Brazil E |
|---|---|---|---|
| 16 Sync | 1 | −3 | 4 |
| 16 Sync | 2 | −7 | 0 |
| 16 Sync | 3 | −9 | −2 |

TABLE 67-continued

VSIW Orthogonal Gold Sequence Performance vs. Repetition Rate vs. Ensemble

| Sequence | Repetition Rate | AWGN | Brazil E |
|---|---|---|---|
| 32 | 1 | 0 | 6 |
| 32 | 2 | −4 | 3 |
| 32 | 3 | −5 | 2 |
| 64 | 1 | −3 | 4 |
| 64 | 2 | −7 | 0 |
| 64 | 3 | −9 | −2 |

XLC with ATSC 1.0

This section describes using XLC to extend the current ATSC 1.0 (A/53) DTV Standard to support M/H services without any change to the legacy physical layers. Two modes of transmission are described, continuous and burst.

XLC commands are sent over the 8-VSB Physical structure via the Variable Stream Instruction Word (VSIW) packet structure. The VSIW is then encoded into a transport stream that is either contained in the 8-VSB Field Sync Segment or the MPEG-2 TS.

A complete VSIW packet detailing any deviations from the system configuration defaults is preferably sent at regular intervals. The interval length only effects the acquisition time of a receiver to the channel since it cannot start decoding robust streams until it receives a VSIW defining all the streams.

VSIW Over MPEG-2 TS

A packet can occur anywhere in the data stream and can be fragmented but starts with a sync header.

Packets occur inside stream 0 or the main stream.

A packet is assumed to consume whole segments

A complete packet with all relevant information about the stream must be sent at regular intervals for acquisition purposes.

Any time a rate change occurs an incremental or complete XLC packet must be sent.

Encoding cannot be changed for the current stream the stream must be deleted and recreated.

Continuous Mode

For continuous mode all streams are multiplexed on a packet by packet basis and transmitted over the MPEG2-TS. This means that adjacent packets for a particular stream are not guaranteed to be transported next to one another. This also means that VSIW packets can be fragmented.

Example of VSIW Packet

For 1 additional stream where you have a Main stream plus a Robust stream using ATSC 1.0 mode, ½ rate, 1 sec interleaving. Where the robust stream consumes one quarter of the bandwidth and the data is continuously sent. The complete VSIW packet would be sent once per 5 frames.

Complete Packet

Physical—Number of Streams=2
Physical—PH1-RF—Continuous Mode
Physical—PH3-MPEG-2 TS—Multiplexer Base=624
Physical—PH3-MPEG-2 TS—Stream Multiplex Rate—Stream1=156
Physical—PH2-FEC—Type—Stream1=ATSC 1.0
Physical—PH2-FEC—Rate—Stream1=½
Physical—PH2-FEC—Interleaver Length—Stream1=1 second
Physical—PHY-STATES—Interleaver State—Stream1=current interleaver location for stream1
Physical—PHY-STATES—XLC Packet Offset—Stream0=3120
Physical—PHY-STATES—Multiplexer Offset=1

Table 120 below illustrates examples of VSIW complete packets for ATSC 1.0.

TABLE 120

Continuous Mode: Example of VSIW Complete Packet for ATSC 1.0

| Sub-Packet ID | P | Data Length | P | SPID Payload | Description |
|---|---|---|---|---|---|
| 001 | 1 | 000 | 0 | | Descend to 0.1 |
| 100 (Num of Streams) | 1 | 001 | 1 | 0001 | Set Streams to 2-1 |
| 001 (PHY RF) | 1 | 001 | 1 | 01 00 | Set to Continuous Mode |
| 011 (PHY MPEG-2 TS) | 0 | 011 | 0 | 00 10 0111 0000 | Set Multiplexor Base to 624 |
| 011 (PHY MPEG-2 TS) | 1 | 011 | 1 | 01 01 1001 1100 | Set Stream1 Multiplexor Rate to 156 |
| 010 (PHY FEC) | 0 | 001 | 1 | 00 1 0 | Set Stream1 Type = 0 |
| 010 (PHY FEC) | 1 | 001 | 1 | 01 1 1 | Set Rate = ½ |
| 010 (PHY FEC) | 1 | 010 | 1 | 10 1 00010 | Set Interleaver = 1 sec |
| 110 (PHY STATES) | 0 | 001 | 1 | 01 1 0 | Set Interleaver State = 0 |
| 110 (PHY STATES) | 0 | 100 | 1 | 11 00 1100 0011 0000 | XLC Packet Offset = 3120 |
| 110 (PHY STATES) | 0 | 001 | 1 | 11 01 | Current Multiplexer Offset = 1 |

If the data rate changed to one eighth for stream 1 then Stream Update Packet—Stream 0 (Main)
a. Physical—PHY-STATES—XLC Packet Offset—Stream0=3110
b. Physical—PHY-STATES—Interleveaver State—Stream1=current interleaver location for stream1=0
c. Physical—PHY-STATES—Multiplexer Offset=2
d. Physical—PH3-MPEG-2 TS—Stream Multiplex Rate—Stream1=78

Table 121 below illustrates examples of VSIW update packets for ATSC 1.0.

TABLE 121

Continuous Mode: Example of VSIW Update Packet for ATSC 1.0

| Sub-Packet ID | P | Data Length | P | SPID Payload | Description |
|---|---|---|---|---|---|
| 001 | 1 | 000 | 0 | | Descend to 0.1 |
| 110 (PHY STATES) | 0 | 100 | 1 | 11 0 01100 0010 0110 | XLC Packet Offset = 3110 segments |
| 110 (PHY STATES) | 0 | 001 | 1 | 01 1 0 | Set Interleaver State = 0 |
| 110 (PHY STATES) | 0 | 001 | 1 | 11 10 | Current Multiplexer Offset = 2 |
| 111 (PHY MPEG-2 TS) | 1 | 011 | 0 | 01 1 00100 1110 | Set Stream1 Rate to 78 |

Table 122 below illustrates examples of VSIW for ATSC 1.0 required bits.

TABLE 122

Continuous Mode: VSIW for ATSC 1.0 Required Bits

| VSIW Transport Field | Bits Complete | Bits Update |
|---|---|---|
| Length | 8 | 8 |
| VSIW | 160 | 76 |
| Padding | 0 | 4 |
| CRC 16 | 16 | 16 |
| TOTAL | 184 | 96 |

$$rate_0 = 19.39 * \left(1 - \frac{1}{MB}\sum_{i=1}^{n} SMR_i - \frac{1}{3120}\left[\frac{(VSIW_{bits} + 12) * 16}{184 * 8}\right]\right)$$

$$rate_{i>1} = 19.39 * \frac{184}{188} * \frac{SMR_i * encrate_i}{MB} - \frac{VSIW_{bits} * 16}{184 * 8 * 3120}$$

$$Overhead = 19.39 - \sum_{i=0} rate_i$$

Table 123 below illustrates examples of VSIW for ATSC 1.0 bandwidth usage.

TABLE 123

Continuous Mode: VSIW for ATSC 1.0 Bandwidth Usage

| VSIW Over | Type | Time Required to Transfer (sec) | Rate | Total Overhead for 2 streams |
|---|---|---|---|---|
| VSIW Over | A | 1.78 | 103.3 bps | 25.23 kbps |
| Field Sync | B | 1.48 | 124.0 bps | |
| VSIW Over | Sync | 0.242 | 13 KB/sec | |
| MPEG-2 TS | No Sync | NA | 12 KB/sec | |
| Robust Stream | | NA | NA | |

Burst Mode

For burst mode the multiplexer sends N packets for each stream. The number of packets sent per stream is specified by the stream multiplexer rate. This enables a receiver to shut off during transmission of other streams, if it only wants to receive a particular stream. On channel acquisition the receiver must find the VSIW in the main stream telling it the locations and encoding of all the streams.

Example of VSIW Packet

For 1 additional stream where you have a Main stream plus a Robust stream using ATSC 1.0 mode, ½ rate, 1 sec interleaving. Where the robust stream consumes one quarter of the bandwidth and the data burst is once per frame. The complete VSIW packet would be sent once per 5 frames on stream 0.

Example of Complete Packet

Physical—Number of Streams=1
Physical—PH1-RF—Burst Mode
Physical—PH3-MPEG-2 TS—Multiplexer Base=624

Physical—PH3-MPEG-2 TS—Stream Multiplex Rate—Stream1=156
Physical—PHY-STATES—XLC Packet Offset—Stream0=3120 (in segments)
Physical—PHY-STATES—XLC Packet Offset—Stream1=10 (in bursts)
Physical—PHY-STATES—Multiplexer Offset=1
Physical—PHY-STATES—Interleaver State—Stream1=current interleaver location for stream1=0
Physical—PH2-FEC—Type—Stream1=ATSC 1.0
Physical—PH2-FEC—Rate—Stream1=/2
Physical—PH2-FEC—Interleaver Length—Stream1=1 second Table 124 below illustrates examples of VSIW complete packets for ATSC 1.0.

TABLE 124

Burst Mode: Example of VSIW Complete Packet for ATSC 1.0

| Sub-Packet ID | P | Data Length | P | SPID Payload | Description |
|---|---|---|---|---|---|
| 001 | 1 | 000 | 0 | | Descend to 0.1 |
| 001 (PHY RF) | 1 | 001 | 1 | 01 01 | Set to Burst Mode |
| 011 (PHY MPEG-2 TS) | 0 | 011 | 0 | 00 10 0111 0000 | Set Multiplexor Base to 624 |
| 011 (PHY MPEG-2 TS) | 1 | 100 | 1 | 01 1 00001 1001 1100 | Set Stream1 Multiplexor Rate to 156 |
| 010 (PHY FEC) | 0 | 001 | 1 | 00 1 0 | Set Stream1 Type = 0 |
| 010 (PHY FEC) | 1 | 001 | 1 | 01 1 1 | Set Rate = ½ |
| 010 (PHY FEC) | 1 | 010 | 1 | 10 1 00010 | Set Interleaver = 1 sec |
| 110 (PHY STATES) | 0 | 001 | 1 | 01 1 0 | Set Interleaver State = 0 |
| 110 (PHY STATES) | 0 | 100 | 1 | 11 0 01100 0011 0000 | Stream0 XLC Packet Offset = 3120 segments |
| 110 (PHY STATES) | 0 | 010 | 1 | 11 1 01010 | Stream1 XLC Packet Offset = 10 bursts |

If the data rate changed to one eighth for stream 1 then
Stream Update Packet—Stream 0 (Main)
a. Physical—PHY-STATES—XLC Packet Offset—Stream0=3110
b. Physical—PH3-MPEG-2 TS—Stream Multiplex Rate—Stream1=78
c. Physical—PHY-STATES—Multiplexer Offset=2
Stream Update Packet—Stream 1 (Main) (start of Stream1 stream data)
a. Physical—PHY-STATES—XLC Packet Offset—Stream1=4
b. Physical—PH3-MPEG-2 TS—Stream Multiplex Rate—Stream1=78
c. Physical—PHY-STATES—Multiplexer Offset=2

Table 125 below illustrates examples of VSIW update stream 0 packets for ATSC 1.0.

TABLE 125

Burst Mode: Example of VSIW Update Stream 0 Packet for ATSC 1.0

| Sub-Packet ID | P | Data Length | P | SPID Payload | Description |
|---|---|---|---|---|---|
| 001 | 1 | 000 | 0 | | Descend to 0.1 |
| 110 (PHY STATES) | 0 | 100 | 1 | 11 0 01100 0010 0110 | XLC Packet Offset = 3110 segments |
| 111 (PHY MPEG-2 TS) | 1 | 011 | 0 | 01 1 00100 1110 | Set Stream1 Rate to 78 |
| 110 (PHY STATES) | 0 | 001 | 1 | 11 10 | Current Multiplexer Offset = 2 |

Table 126 below illustrates examples of VSIW update stream 1 packets for ATSC 1.0.

TABLE 126

Burst Mode: Example of VSIW Update Stream 1 Packet for ATSC 1.0

| Sub-Packet ID | P | Data Length | P | SPID Payload | Description |
|---|---|---|---|---|---|
| 001 | 1 | 000 | 0 | | Descend to 0.1 |
| 110 (PHY STATES) | 0 | 010 | 1 | 11 1 00100 | XLC Packet Offset = 4 Bursts |
| 111 (PHY MPEG-2 TS) | 1 | 011 | 0 | 01 1 00100 1110 | Set Stream1 Rate to 78 |
| 110 (PHY STATES) | 0 | 001 | 1 | 11 10 | Current Multiplexer Offset = 2 |

Table 127 below illustrates examples of VSIW for ATSC 1.0 required bits.

TABLE 127

Burst Mode: VSIW for ATSC 1.0 Required Bits

| VSIW Transport Field | Bits | | |
|---|---|---|---|
| | Complete | Update0 | Update1 |
| Length | 8 | 8 | 8 |
| VSIW | 156 | 64 | 56 |
| Padding | 4 | 0 | 0 |
| CRC 16 | 16 | 16 | 16 |
| TOTAL | 184 | 80 | 72 |

Table 128 below illustrates examples of VSIW for ATSC 1.0 robust stream update bandwidth usage.

TABLE 128

Burst Mode: VSIW for ATSC 1.0 Robust Stream Update Bandwidth Usage

| VSIW Over | Type | Time Required to Transfer (sec) | Rate | Total Overhead for 2 streams |
|---|---|---|---|---|
| Field Sync | A | 0.70 | 103.3 bps | 38.13 kbps |
| | B | 0.58 | 124.0 bps | |
| MPEG-2 TS | Sync | NA | 18.6 KB/sec | |
| | No Sync | 0.242 | 9.6 KB/sec | |
| Robust Stream | | 0.242 | 9.7 KB/sec | |

Cross Layer Control Extension Language

The cross layer control (XLC) extension language is a binary structured language developed to facilitate the communication of structured data across information systems of various structures and protocols. The data structure may be tree based. The language is composed of a combination of commands for navigating the tree, modifiers for describing sections of the tree, and data for specifying selections or values corresponding to the nodes and/or sections of the tree. In one embodiment, the method is not text based, i.e., is not human readable, but rather is more suited to communication in systems where bandwidth is at a premium and efficiency is very important. The method described herein includes a set of commands that allows the language to refer to groups of nodes (selections of the tree) in a very efficient manner akin to run length coding. In one embodiment, communication of system versioning must be executed outside of the system being versioned.

Transmission Diversity

Figure 33:
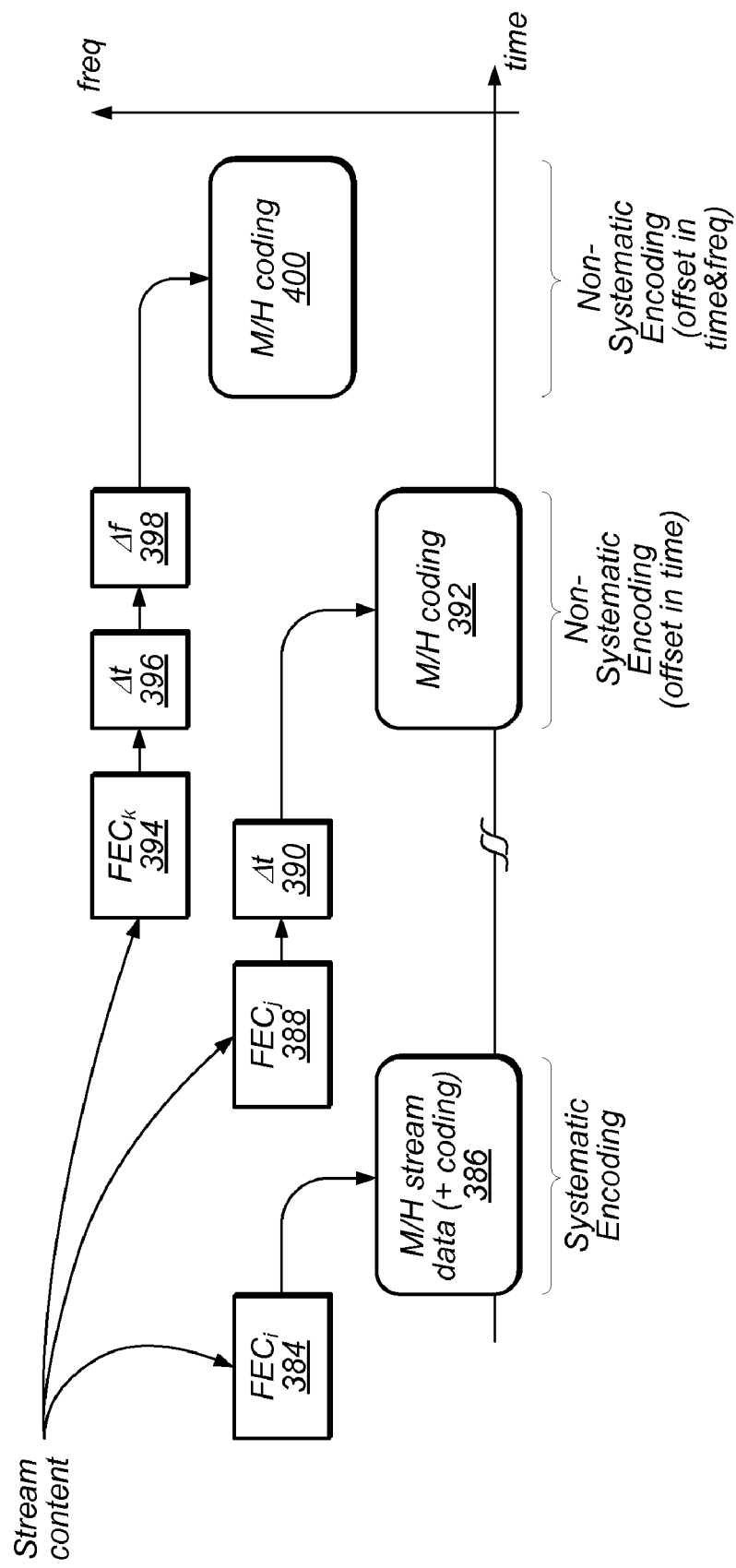
FIG. 33 depicts various methods of transmission diversity.

FIG. 33 depicts various methods of transmission diversity, e.g. time and/or frequency from a single transmitter or time/frequency/spatial involving multiple transmitters, by which service reliability can be improved, in the presence of burst noise or deep channel fading for example. Coupled with the method described above for augmented stream encoding, transmission diversity enables nested stream encoding where similarly to main stream augmentation, multiple complementary streams are transmitted, separated in time/frequency, containing additional code bits (non-systematic encoding) to be associated at the receiver with the primary data stream which may contain a mix of code and data bits (systematic encoding). Nested encoding can be further extended to include multiple encodings in which each resultant stream retains sufficient information to permit decoding when received alone or when received in tandem to achieve a lower receive threshold. In other words, both the primary and secondary streams employ systematic encoding.

Uncoded Transport Tunneling

Figure 34:
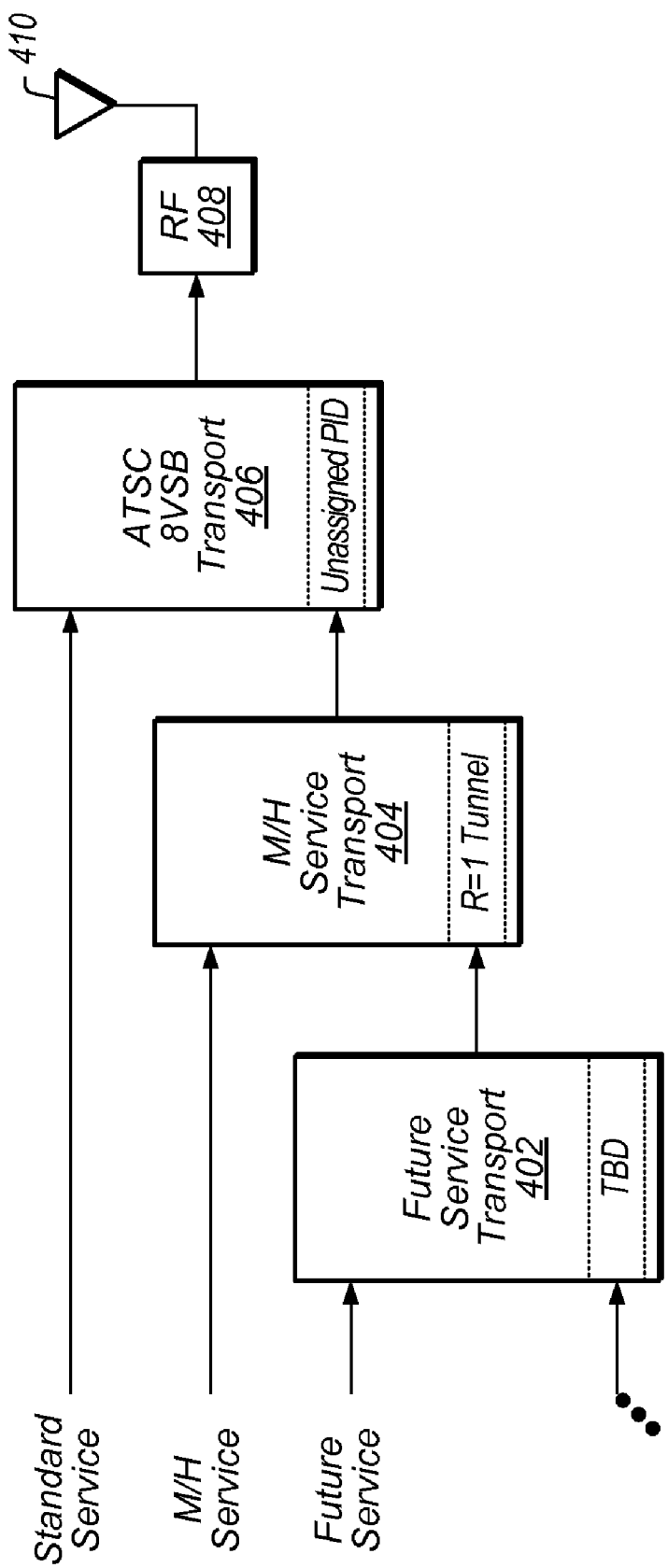
FIG. 34 illustrates the method of transport tunneling to enable future extensibility.

FIG. 34 illustrates the method of transport tunneling to enable future extensibility. In the same way unassigned PID encapsulation permits service enhancement on top of the base 8VSB transport, transport tunneling can be employed to ensure longevity of the M/H standard. Bypass the robust encoding (i.e. R=1), uncoded transport provides a tunneling mechanism by which data services deployed after the initial M/H service launch can be carried allowing the introduction of future service capability. From that perspective, transport tunneling is comparable to enhanced service encapsulation based on unassigned PIDs to accommodate legacy 8VSB receivers.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for receiving and presenting an audiovisual stream at a mobile device, the method comprising:
   receiving a plurality of packets at the mobile device, wherein the plurality of packets are received in a wireless manner, the plurality of packets comprising a first plurality of packets comprising audiovisual information and a second plurality of packets comprising control information, wherein the mobile device comprises a receiver implementing a plurality of communication layers, wherein the control information comprises commands for providing additional functionality to at least one of the communication layers;
   configuring the receiver in the mobile device based on the control information in the second plurality of packets, wherein said configuring the receiver comprises modifying operation of at least one communication layer in the receiver to provide the additional functionality to the at least one communication layer of the receiver, wherein the additional functionality did not exist in the at least one communication layer prior to said receiving the plurality of packets;
   processing the first plurality of packets comprising audiovisual information after said configuring, wherein said processing comprises the at least one communication layer performing the additional functionality; and
   presenting the audiovisual information on the mobile device after said processing.

2. The method of claim 1, wherein the control information is generated based on parameter values of a plurality of the communication layers.

3. The method of claim 1, wherein the control information is generated to improve operation across the plurality of communication layers.

4. The method of claim 1, wherein the control information comprises commands for providing additional functionality to a plurality of the communication layers.

5. The method of claim 1, wherein the control information comprises commands for modifying one or more parameters in at least one communication layer selected from presentation layer, management layer, and physical layer.

6. The method of claim 1, wherein the control information comprises commands for modifying one or more parameters in at least two communication layers selected from presentation layer, management layer, and physical layer.

7. The method of claim 1, wherein the control information comprises commands for modifying one or more parameters in each of a presentation layer, a management layer, and a physical layer.

8. The method of claim 1, wherein the control information comprises at least one command for changing one or more of:
   a codec type used by the mobile device;
   a transport configuration of packets received by the mobile device;
   signaling used in packets received by the mobile device;
   an announcement used in packets received by the mobile device;
   an amount of forward error correction applied to received packets;
   an encoding scheme used by the mobile device; or
   a modulation scheme used by the mobile device.

9. The method of claim 1,
   wherein said receiving, said configuring, said processing and said presenting are performed a plurality of times.

10. The method of claim 1, further comprising:
    receiving a third plurality of packets after said configuring, wherein the third plurality of packets comprise additional control information that modifies a current configuration of the receiver as determined from the control information received in a preceding plurality of packets.

11. The method of claim 1,
    wherein the commands comprised in the control information are configured to modify parameters represented by a hierarchical tree structure, wherein each of at least a subset of nodes in the hierarchical tree structure represents a parameter in a communication layer, wherein the hierarchical tree structure represents the receiver configuration;
    wherein said configuring the receiver comprises modifying parameters in the hierarchical tree structure using the commands, thereby modifying the receiver configuration.

12. The method of claim 11,
    wherein the commands comprised in the control information comprise at least one command for:

navigating to a root node in the tree structure; and
navigating up or down within the tree structure; and
setting a parameter value in a leaf node of the tree structure.

13. The method of claim 11, further comprising:
receiving control information to modify the hierarchical tree structure in the receiver;
the receiver modifying the hierarchical tree structure in the receiver based on the control information, wherein said modifying the hierarchical tree structure provides extended functionality in the receiver.

14. The method of claim 11,
wherein the commands comprised in the control information comprise at least one command for adding one or more nodes to the tree structure, thus extending functionality to include additional parameters in the tree structure.

15. The method of claim 11,
wherein the commands comprised in the control information comprise at least one command for adding one or more nodes to the tree structure to perform one of:
add a new coding method to the tree structure, wherein the added one or more nodes correspond to one or more parameters of the new coding method;
add a new codec type to the tree structure, wherein the added one or more nodes correspond to one or more parameters of the new coded type; or
add a new file delivery type to the tree structure, wherein the added one or more nodes correspond to one or more parameters of the new file delivery type.

16. The method of claim 1,
wherein said receiving the plurality of packets comprises:
receiving the first plurality of packets comprising audiovisual information intended for the mobile device;
receiving the second plurality of packets comprising control information; and
receiving a third plurality of packets comprising audiovisual information intended for stationary televisions;
wherein the receiver does not use the third plurality of packets comprising audiovisual information intended for stationary televisions.

17. The method of claim 1,
wherein said receiving the plurality of packets comprises:
receiving the first plurality of packets comprising audiovisual information intended for the mobile device;
receiving the second plurality of packets comprising control information; and
receiving a third plurality of packets comprising audiovisual information intended for stationary televisions;
wherein the third plurality of packets comprise additional error correction intended to improve mobile reception of the audiovisual information intended for stationary televisions.

18. The method of claim 1,
wherein said receiving the plurality of packets comprises:
receiving the first plurality of packets comprising the audiovisual information; and
receiving the second plurality of packets comprising the control information;
wherein the first plurality of packets comprises audiovisual information meant for stationary devices, wherein the first plurality of packets comprise additional error correction intended to improve mobile reception of the audiovisual information meant for stationary devices.

19. The method of claim 1,
wherein the plurality of layers comprise a physical layer, a management layer, and a presentation layer.

20. The method of claim 1,
wherein the plurality of packets comprise an ATSC digital television signal.

21. The method of claim 1,
wherein receiving the plurality of packets at the mobile device comprises receiving a wireless broadcast transmission, wherein the wireless broadcast transmission is transmitted to a plurality of mobile devices.

22. A mobile device for receiving and presenting an audiovisual stream, the mobile device comprising:
an antenna for receiving a plurality of packets at the mobile device in a wireless manner, the plurality of packets comprising a first plurality of packets comprising audiovisual information and a second plurality of packets comprising control information;
a receiver coupled to the antenna for implementing a plurality of communication layers;
wherein the control information comprises commands for providing additional functionality to at least one of the communication layers in the receiver;
wherein the receiver in the mobile device is operable to be configured based on the control information in the second plurality of packets, wherein configuration of the receiver modifies operation of at least one communication layer in the receiver to provide the additional functionality to the at least one communication layer of the receiver, wherein the additional functionality did not exist in the at least one communication layer prior to receiving the plurality of packets;
wherein the receiver is operable to process the first plurality of packets based on its configuration, including the at least one communication layer performing the additional functionality in the receiver; and
a display and one or more speakers for presenting the audiovisual information.

23. The mobile device of claim 22, wherein the receiver comprises a multi-processor system comprising a plurality of interconnected processors, memories, and communication resources.

24. The mobile device of claim 23,
wherein one or more of the memories store program instructions for implementing the plurality of communication layers;
wherein configuration of the receiver comprises modifying at least a portion of the program instructions for implementing the plurality of communication layers.

25. The mobile device of claim 22, wherein the control information is generated based on parameter values of a plurality of the communication layers.

26. The mobile device of claim 22, wherein the control information is generated to optimize operation across the plurality of communication layers.

27. The mobile device of claim 22, wherein the control information comprises commands for providing additional functionality to a plurality of the communication layers.

28. The mobile device of claim 22,
wherein the commands comprised in the control information are configured to modify parameters represented by a hierarchical tree structure, wherein each of at least a subset of nodes in the hierarchical tree structure represents a parameter in a communication layer, wherein the hierarchical tree structure represents the receiver configuration;
wherein the mobile device is configured to modify parameters in the hierarchical tree structure using the commands, thereby modifying the receiver configuration.

29. The mobile device of claim 28,
wherein the commands comprised in the control information comprise at least one command for adding one or more nodes to the tree structure, thus extending functionality to include additional parameters in the tree structure.

30. A memory medium storing program instructions for receiving and presenting an audiovisual stream at a mobile device, wherein the program instructions are executable to:
receive a plurality of packets at the mobile device, wherein the plurality of packets are received in a wireless manner, the plurality of packets comprising a first plurality of packets comprising audiovisual information and a second plurality of packets comprising control information, wherein the mobile device comprises a receiver implementing a plurality of communication layers, wherein the control information comprises commands for providing additional functionality to at least one of the communication layers;
configure the receiver in the mobile device based on the control information in the second plurality of packets, wherein said configuring the receiver comprises modifying operation of at least one communication layer in the receiver to provide the additional functionality to the at least one communication layer of the receiver, wherein the additional functionality did not exist in the at least one communication layer prior to receiving the plurality of packets;
process the first plurality of packets comprising audiovisual information after said configuring, wherein said processing comprises the at least one communication layer performing the additional functionality; and
wherein the audiovisual information is operable to be presented on the mobile device after being processed.

31. The memory medium of claim 30,
wherein the control information is generated based on parameter values of a plurality of the communication layers; and
wherein the control information is generated to improve operation across the plurality of communication layers.

32. A method for transmitting audiovisual information to a mobile device in a wireless manner, wherein the mobile device comprises a receiver implementing a plurality of communication layers, the method comprising:
generating a first plurality of packets, wherein the first plurality of packets comprise audiovisual information;
generating control information, wherein the control information comprises commands for providing additional functionality to at least one of the communication layers in the receiver;
generating a second plurality of packets, wherein the second plurality of packets comprise the control information;
transmitting the plurality of packets to the mobile device in a wireless manner, wherein the plurality of packets comprise the first plurality of packets and the second plurality of packets;
wherein the control information in the second plurality of packets is useable to configure the receiver in the mobile device by modifying operation of the at least one of the communication layers in the receiver to provide the additional functionality to the at least one of the communication layers in the receiver, wherein the additional functionality did not exist in the at least one of the communication layers prior to said transmitting the plurality of packets.

33. The method of claim 32,
wherein said generating the control information comprises:
examining current parameters of a plurality of the communication layers; and
generating the control information based on the current parameters of the plurality of the communication layers.

34. The method of claim 32,
wherein said generating the control information comprises:
examining current parameters of a plurality of the communication layers; and
generating the control information, wherein the control information is configured to modify operation of a first communication layer in the receiver, wherein the control information is generated based on current parameters of the first communication layer and the other ones of the communication layers.

35. The method of claim 32, wherein the control information is generated to improve operation across a plurality of communication layers.

36. The method of claim 32, wherein the control information comprises commands for providing additional functionality to a plurality of the communication layers.

37. The method of claim 32,
wherein said generating the control information comprises:
examining current parameters of a plurality of the communication layers; and
generating the control information, wherein the control information is configured to modify operation of a plurality of the communication layers in the receiver, wherein the control information is generated based on current parameters of at least two of the communication layers in the receiver.

38. The method of claim 32, wherein said transmitting is performed by a transmit system, the method further comprising:
receiving an instruction to modify operation of the transmit system;
modifying operation of the transmit system based on the instruction;
wherein said generating the control information comprises:
determining at least one first modification to at least one first communication layer in the receiver based on the instruction;
generating one or more commands configured to make the at least one first modification to the at least one first communication layer in the receiver.

39. The method of claim 38,
wherein said generating the control information further comprises:
examining current parameters of a plurality of the communication layers;
determining at least one modification to at least one second communication layer in the receiver based on said examining; and
generating one or more commands configured to make the at least one modification to the at least one second communication layer in the receiver.

40. The method of claim 38,
wherein said generating the control information further comprises:
examining current parameters of a plurality of the communication layers;

determining at least one second modification to the at least one first communication layer in the receiver based on said examining; and
  generating one or more commands configured to make the at least one second modification to the at least one first communication layer in the receiver.
41. The method of claim 32,
wherein said transmitting comprises transmitting the plurality of packets to the mobile device over a wireless communication medium;
the method further comprising:
  determining channel conditions of the wireless communication medium;
  determining at least one first modification to at least one first communication layer based on the channel conditions of the wireless communication medium;
wherein said generating control information comprises generating one or more commands configured to make the at least one first modification to the at least one first communication layer in the receiver.
42. The method of claim 41,
wherein said generating the control information further comprises:
  examining current parameters of a plurality of the communication layers;
  determining at least one modification to at least one second communication layer in the receiver based on said examining; and
  generating one or more commands configured to make the at least one modification to the at least one second communication layer in the receiver.
43. The method of claim 41,
wherein said generating the control information further comprises:
  examining current parameters of a plurality of the communication layers;
  determining at least one second modification to the at least one first communication layer in the receiver based on said examining; and
  generating one or more commands configured to make the at least one second modification to the at least one first communication layer in the receiver.
44. The method of claim 32, wherein the control information comprises at least one command for modifying a presentation layer in the mobile device.
45. The method of claim 32, wherein the control information comprises at least one command for modifying a management layer in the mobile device.
46. The method of claim 32, wherein the control information comprises at least one command for modifying a physical layer in the mobile device.
47. The method of claim 32, wherein the control information comprises commands for modifying one or more parameters in two or more of:
  a presentation layer in the mobile device;
  a management layer in the mobile device; or
  a physical layer in the mobile device.
48. The method of claim 32, wherein the control information comprises at least one command for changing one or more of:
  a codec type used by the mobile device;
  a transport configuration of packets received by the mobile device;
  signaling used in packets received by the mobile device;
  an announcement used in packets received by the mobile device;
  an amount of forward error correction applied to received packets;
  an encoding scheme used by the mobile device; or
  a modulation scheme used by the mobile device.
49. The method of claim 32,
wherein said transmitting is performed by a transmit system;
wherein the commands comprised in the control information are configured to modify parameters represented by a hierarchical tree structure, wherein each of at least a subset of nodes in the hierarchical tree structure represents a parameter in a communication layer, wherein the hierarchical tree structure represents a system configuration of the transmit system and the receiver;
wherein said configuring the receiver comprises modifying parameters in the hierarchical tree structure using the commands, thereby modifying the system configuration.
50. The method of claim 49,
wherein the commands comprised in the control information comprise at least one command for setting a parameter value in a leaf node of the tree structure.
51. The method of claim 49,
wherein the commands comprised in the control information comprise at least one command for:
  navigating to a root node in the tree structure; and
  navigating up or down within the tree structure.
52. The method of claim 49, further comprising:
generating control information to modify the hierarchical tree structure in the receiver,
wherein modification of the hierarchical tree structure in the receiver provides extended functionality in the receiver.
53. The method of claim 49,
wherein the commands comprised in the control information comprise at least one command for adding one or more nodes to the tree structure, thus extending functionality to include additional parameters in the tree structure.
54. The method of claim 49,
wherein the commands comprised in the control information comprise at least one command for adding one or more nodes to the tree structure to:
  add a new coding method to the tree structure, wherein the added one or more nodes correspond to one or more parameters of the new coding method;
  add a new codec type to the tree structure, wherein the added one or more nodes correspond to one or more parameters of the new coded type; or
  add a new file delivery type to the tree structure, wherein the added one or more nodes correspond to one or more parameters of the new file delivery type.
55. The method of claim 32,
wherein said transmitting the plurality of packets comprises:
  transmitting the first plurality of packets comprising audiovisual information intended for the mobile device;
  transmitting the second plurality of packets comprise the control information; and
  transmitting a third plurality of packets comprising standard digital television signals intended for stationary televisions.
56. The method of claim 55,
wherein said transmitting the plurality of packets comprises multiplexing the first, second, and third plurality of packets;

wherein said multiplexing the packets is performed based on a ratio of the relative bandwidth allocations of the respective pluralities of packets.

57. The method of claim 56,
wherein said multiplexing comprises ordering the packets to distribute them evenly according to their relative bandwidth;
wherein said multiplexing operates to reduce transmission overhead.

58. The method of claim 57,
transmitting size information regarding the bandwidth allocations of the various packet streams, wherein the size information is useable at the receiver to demultiplex the received packet streams.

59. The method of claim 32,
wherein said receiving the plurality of packets comprises:
    transmitting the first plurality of packets comprising audiovisual information intended for the mobile device;
    transmitting the second plurality of packets comprising control information; and
    transmitting a third plurality of packets comprising audiovisual information intended for stationary televisions;
    wherein the third plurality of packets comprise additional error correction intended to improve mobile reception of the audiovisual information intended for stationary televisions.

60. The method of claim 32,
wherein said transmitting the plurality of packets comprises:
    transmitting the first plurality of packets comprising the audiovisual information; and
    transmitting the second plurality of packets comprising the control information;
    wherein the audiovisual information comprises audiovisual information meant for stationary devices, wherein the first plurality of packets comprise additional error correction intended to improve mobile reception of the audiovisual information meant for stationary devices.

61. The method of claim 32,
wherein the plurality of layers comprise a physical layer, a management layer, and a presentation layer.

62. The method of claim 32,
wherein the plurality of packets comprise an ATSC digital television signal.

63. The method of claim 32, further comprising:
broadcasting the plurality of packets to a plurality of mobile devices in a wireless manner;
wherein the control information in the second plurality of packets is useable to configure receivers in at least a subset of the plurality of mobile device by modifying operation of the at least one of the communication layers in the receivers.

64. A transmission system for transmitting audiovisual information to a mobile device, wherein the mobile device comprises a receiver implementing a plurality of communication layers, the transmission system comprising:
    transmit logic configured to:
        generate a first plurality of packets, wherein the first plurality of packets comprise audiovisual information;
        generate control information, wherein the control information comprises commands for providing additional functionality to at least one of the communication layers in the mobile device;
        generate a second plurality of packets, wherein the second plurality of packets comprise the control information;
    a transmitter coupled to the transmit logic for transmitting the plurality of packets to the mobile device in a wireless manner, wherein the plurality of packets comprise the first plurality of packets and the second plurality of packets;
    wherein the control information in the second plurality of packets is useable to configure the receiver in the mobile device by modifying operation of at least one of the communication layers in the receiver to provide the additional functionality to the at least one of the communication layers in the mobile device, wherein the additional functionality did not exist in the at least one communication layer prior to transmitting the plurality of packets.

65. The transmission system of claim 64,
wherein in generating the control information, the transmit logic is configured to:
    examine current parameters of a plurality of the communication layers; and
    generate the control information based on the current parameters of the plurality of the communication layers.

66. The transmission system of claim 64, wherein the control information is generated to improve operation across the plurality of communication layers.

67. The transmission system of claim 64, wherein the control information comprises commands for providing additional functionality a plurality of the communication layers.

68. The transmission system of claim 64,
wherein the transmission system is configured to receive an instruction to modify operation of the transmit system and modify operation of the transmit system based on the instruction;
wherein, in generating the control information, the transmit logic is configured to:
    determine at least one first modification to at least one first communication layer in the receiver based on the instruction;
    generate one or more commands configured to make the at least one first modification to the at least one first communication layer in the receiver.

69. The transmission system of claim 68,
wherein, in generating the control information, the transmit logic is configured to:
    examine current parameters of a plurality of the communication layers;
    determine at least one modification to at least one second communication layer in the receiver based on said examining; and
    generate one or more commands configured to make the at least one modification to the at least one second communication layer in the receiver.

70. The transmission system of claim 64,
wherein the transmitter is configured to transmit the plurality of packets to the mobile device over a wireless communication medium;
wherein the transmit logic is further configured to:
    determine channel conditions of the wireless communication medium;
    determine at least one first modification to at least one first communication layer based on the channel conditions of the wireless communication medium;
    wherein, in generating the control information, the transmit logic is configured to generate one or more commands configured to make the at least one first modification to the at least one first communication layer in the receiver.

71. The transmission system of claim 64,
wherein the commands comprised in the control information are configured to modify parameters represented by a hierarchical tree structure, wherein each of at least a subset of nodes in the hierarchical tree structure represents a parameter in a communication layer, wherein the hierarchical tree structure represents a system configuration of the transmission system and the receiver.

72. A memory medium storing program instructions for generating packets for transmission of audiovisual information to a mobile device in a wireless manner, wherein the mobile device comprises a receiver implementing a plurality of communication layers, wherein the program instructions are executable to:
generate a first plurality of packets, wherein the first plurality of packets comprise audiovisual information;
generate control information, wherein the control information comprises commands for providing additional functionality to at least one of the communication layers in the receiver;
generate a second plurality of packets, wherein the second plurality of packets comprise the control information;
wherein the plurality of packets are configured to be transmitted to the mobile device in a wireless manner, wherein the plurality of packets comprise the first plurality of packets and the second plurality of packets;
wherein the control information in the second plurality of packets is useable to configure the receiver in the mobile device by modifying operation of the at least one of the communication layers in the receiver to provide the additional functionality to the at least one of the communication layers in the receiver, wherein the additional functionality did not exist in the at least one of the communication layers prior to transmitting the plurality of packets.

73. The memory medium of claim 72,
wherein the control information is generated based on parameter values of a plurality of the communication layers; and
wherein the control information is generated to improve operation across the plurality of communication layers.

74. A method for receiving data at a device, the method comprising:
receiving a plurality of packets at the device, the plurality of packets comprising a first plurality of packets comprising data and a second plurality of packets comprising control information, wherein the mobile device comprises a receiver implementing a plurality of communication layers, wherein the control information comprises commands for providing additional functionality to at least one of the communication layers;
configuring the receiver in the device based on the control information in the second plurality of packets, wherein said configuring the receiver comprises modifying operation of at least one communication layer in the receiver to provide the additional functionality to the at least one of the communication layers, wherein the additional functionality did not exist in the at least one of the communication layers prior to said receiving the plurality of packets; and
processing the first plurality of packets comprising the data after said configuring, wherein said processing comprises the at least one communication layer performing the additional functionality.

75. The method of claim 74, wherein the device is a stationary device.

76. The method of claim 74, wherein the device is a mobile device and the plurality of packets are received in a wireless manner.

77. The method of claim 74, wherein the data comprises audiovisual information.

78. The method of claim 74,
wherein the control information is generated based on parameter values of a plurality of the communication layers; and
wherein the control information is generated to improve operation across the plurality of communication layers.

79. A method for transmitting data to a device, wherein the device comprises a receiver implementing a plurality of communication layers, the method comprising:
generating a first plurality of packets, wherein the first plurality of packets comprise the data;
generating control information, wherein the control information comprises commands for providing additional functionality to at least one of the communication layers in the receiver;
generating a second plurality of packets, wherein the second plurality of packets comprise the control information;
transmitting the plurality of packets to the device, wherein the plurality of packets comprise the first plurality of packets and the second plurality of packets;
wherein the control information in the second plurality of packets is useable to configure the receiver in the device by modifying operation of the at least one of the communication layers in the receiver to provide the additional functionality to the at least one of the communication layers of the receiver, wherein the additional functionality did not exist in the at least one of the communication layers prior to said transmitting the plurality of packets.

80. The method of claim 79, wherein the device is a stationary device.

81. The method of claim 79, wherein the device is a mobile device and the plurality of packets are received in a wireless manner.

82. The method of claim 79, wherein the data comprises audiovisual information.

83. The method of claim 79,
wherein the control information is generated based on parameter values of a plurality of the communication layers; and
wherein the control information is generated to improve operation across the plurality of communication layers.

* * * * *